US010693017B2

(12) United States Patent
Lee et al.

(10) Patent No.: US 10,693,017 B2
(45) Date of Patent: Jun. 23, 2020

(54) SEMICONDUCTOR DEVICE HAVING A MULTI-THICKNESS NANOWIRE

(71) Applicant: SAMSUNG ELECTRONICS CO., LTD., Suwon-si, Gyeonggi-do (KR)

(72) Inventors: Seung Hun Lee, Hwaseong-si (KR); Dong Woo Kim, Incheon (KR); Dong Chan Suh, Suwon-si (KR); Sun Jung Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/435,263

(22) Filed: Jun. 7, 2019

(65) Prior Publication Data

US 2019/0288121 A1    Sep. 19, 2019

Related U.S. Application Data

(63) Continuation of application No. 15/373,065, filed on Dec. 8, 2016, now Pat. No. 10,319,863.

(30) Foreign Application Priority Data

May 30, 2016    (KR) ......................... 10-2016-0066521

(51) Int. Cl.
*H01L 29/78* (2006.01)
*H01L 29/06* (2006.01)
*H01L 29/08* (2006.01)
*H01L 29/423* (2006.01)
*H01L 29/66* (2006.01)
(Continued)

(52) U.S. Cl.
CPC ........ *H01L 29/78696* (2013.01); *B82Y 10/00* (2013.01); *H01L 21/02532* (2013.01); *H01L 21/02603* (2013.01); *H01L 21/823807* (2013.01); *H01L 27/092* (2013.01); *H01L 29/0653* (2013.01); *H01L 29/0673* (2013.01); *H01L 29/0847* (2013.01); *H01L 29/42364* (2013.01); *H01L 29/42392* (2013.01); *H01L 29/66439* (2013.01); *H01L 29/66545* (2013.01); *H01L 29/775* (2013.01); *H01L 29/068* (2013.01); *H01L 29/66742* (2013.01); *H01L 29/78651* (2013.01); *H01L 29/78684* (2013.01);
(Continued)

(58) Field of Classification Search
CPC .......... H01L 29/78696; H01L 29/0653; H01L 29/0673; H01L 29/0847; H01L 29/42364; H01L 29/42392; H01L 29/66439; H01L 29/66545; H01L 29/775; H01L 27/092; B82Y 10/00
See application file for complete search history.

(56) References Cited

U.S. PATENT DOCUMENTS 7,112,832 B2 *  9/2006  Orlowski .......... H01L 29/42384
                                                    257/241
7,709,277 B2    5/2010  Lee et al.
(Continued)

*Primary Examiner* — Ida M Soward
(74) *Attorney, Agent, or Firm* — Lee IP Law, P.C.

(57) ABSTRACT

A semiconductor device includes a drain, a source, a gate electrode, and a nanowire between the source and drain. The nanowire has a first section with a first thickness and a second section with a second thickness greater than the first thickness. The second section is between the first section and at least one of the source or drain. The first nanowire includes a channel when a voltage is applied to the gate electrode.

17 Claims, 56 Drawing Sheets

(51) Int. Cl.
- *H01L 29/775* (2006.01)
- *H01L 27/092* (2006.01)
- *B82Y 10/00* (2011.01)
- *H01L 29/786* (2006.01)
- *H01L 21/02* (2006.01)
- *H01L 21/8238* (2006.01)

(52) U.S. Cl.
CPC ........ *Y10S 977/762* (2013.01); *Y10S 977/765* (2013.01); *Y10S 977/938* (2013.01)

(56) References Cited

U.S. PATENT DOCUMENTS

| | | | |
|---|---|---|---|
| 7,902,575 B2 * | 3/2011 | Ernst | H01L 29/42384 257/287 |
| 8,022,439 B2 * | 9/2011 | Kajiyama | B82Y 10/00 257/192 |
| 8,110,471 B2 | 2/2012 | Lee et al. | |
| 8,293,608 B2 | 10/2012 | Orlowski et al. | |
| 8,314,464 B2 | 11/2012 | Iwayama et al. | |
| 8,384,069 B2 * | 2/2013 | Pernel | B82Y 10/00 257/24 |
| 8,395,218 B2 | 3/2013 | Suk et al. | |
| 8,580,634 B1 * | 11/2013 | Xie | H01L 27/1211 257/E21.635 |
| 8,637,849 B2 * | 1/2014 | Deligianni | B82Y 10/00 257/24 |
| 8,796,742 B1 * | 8/2014 | Chang | H01L 29/42392 257/213 |
| 8,853,788 B2 | 10/2014 | Guo et al. | |
| 8,900,951 B1 | 12/2014 | Cheng et al. | |
| 9,093,516 B2 | 7/2015 | Pourghaderi et al. | |
| 9,437,738 B2 | 9/2016 | Lin | |
| 9,530,891 B2 | 12/2016 | Ota et al. | |
| 9,570,614 B2 | 2/2017 | Pillarisetty et al. | |
| 9,590,038 B1 * | 3/2017 | Kim | H01L 29/42392 |
| 9,608,063 B2 * | 3/2017 | Hashemi | H01L 29/42392 |
| 9,679,965 B1 | 6/2017 | Suk et al. | |
| 9,755,034 B2 * | 9/2017 | Kim | H01L 29/0673 |
| 9,853,110 B2 | 12/2017 | Zhang et al. | |
| 9,853,132 B2 | 12/2017 | Cheng et al. | |
| 9,881,993 B2 * | 1/2018 | Ching | H01L 21/823431 |
| 9,893,161 B2 | 2/2018 | Nakamura et al. | |
| 10,038,054 B2 * | 7/2018 | Rachmady | H01L 29/66545 |
| 10,211,208 B2 * | 2/2019 | Dewey | H01L 21/823814 |
| 2008/0135949 A1 | 6/2008 | Lo et al. | |
| 2009/0057762 A1 | 3/2009 | Bangsaruntip et al. | |
| 2010/0295020 A1 | 11/2010 | Barwicz et al. | |
| 2011/0062421 A1 | 3/2011 | Iwayama et al. | |
| 2012/0126197 A1 | 5/2012 | Chung et al. | |
| 2012/0305886 A1 | 12/2012 | Sleight et al. | |
| 2013/0112937 A1 | 5/2013 | Bangsaruntip et al. | |
| 2013/0145857 A1 | 6/2013 | Bryant et al. | |
| 2013/0175597 A1 | 7/2013 | Bangsaruntip et al. | |
| 2014/0353591 A1 | 12/2014 | Kim et al. | |
| 2015/0194487 A1 * | 7/2015 | Bangsaruntip | B82Y 10/00 257/24 |
| 2015/0295084 A1 | 10/2015 | Obradovic et al. | |
| 2015/0303258 A1 | 10/2015 | Kuhn et al. | |
| 2015/0325664 A1 | 11/2015 | Cheng et al. | |
| 2015/0372104 A1 | 12/2015 | Liu et al. | |
| 2015/0372111 A1 | 12/2015 | Koh et al. | |
| 2016/0054315 A1 | 2/2016 | Fahmy et al. | |
| 2016/0079422 A1 | 3/2016 | Rachmady et al. | |
| 2016/0086861 A1 | 3/2016 | Kim | |
| 2016/0315167 A1 | 10/2016 | Nakamura et al. | |
| 2017/0053998 A1 | 2/2017 | Kim et al. | |
| 2017/0141239 A1 * | 5/2017 | Cea | H01L 29/42392 |
| 2017/0170268 A1 | 6/2017 | Song et al. | |
| 2017/0207313 A1 * | 7/2017 | Song | H01L 29/42392 |
| 2017/0271477 A1 * | 9/2017 | Palle | H01L 29/66553 |
| 2017/0365663 A1 * | 12/2017 | Zhao | H01L 29/66356 |
| 2018/0366544 A1 * | 12/2018 | Chang | H01L 29/0649 |

* cited by examiner

SEMICONDUCTOR DEVICE HAVING A MULTI-THICKNESS NANOWIRE

CROSS-REFERENCE TO RELATED APPLICATIONS

This is a continuation application based on pending application Ser. No. 15/373,065, filed Dec. 8, 2016, the entire contents of which is hereby incorporated by reference.

Korean Patent Application No. 10-2016-0066521, filed on May 30, 2016, and entitled, "Semiconductor Device and Method for Fabricating the Same," is incorporated by reference herein in its entirety.

BACKGROUND

1. Field

One or more embodiments described herein relate to a semiconductor device and a method for fabricating a semiconductor device.

2. Description of the Related Art

A variety of technologies have been developed to increase the density and integration of semiconductor devices. One technology involves the formation of a multi-gate transistor, in which silicon bodies in a fin or nanowire shape are disposed on a substrate. Gates of the transistor are then formed on surfaces of the silicon bodies.

Multi-gate transistor technology has found favor with may circuit designers. For example, such a transistor may include a three-dimensional channel. Also, current control capability may be enhanced without increasing gate length. Furthermore, with such a transistor, it is possible to effectively suppress short channel effect (SCE), in which the electric potential of the channel region is influenced by the drain voltage.

SUMMARY

In accordance with one or more embodiments, a transistor includes a drain; a source; a gate electrode; and a first nanowire between the source and drain, wherein the first nanowire has a first section with a first thickness and a second section with a second thickness different from the first thickness, and wherein the second section is between the first section and at least one of the source or drain, the first nanowire to include a channel when a voltage is applied to the gate electrode.

In accordance with one or more other embodiments, a transistor a drain; a source; a gate electrode; and a nanowire between the source and drain and including a first section including a channel film and a second section including the channel film and at least one diffusion film, wherein the first section does not overlap the gate electrode and the second section overlaps the gate electrode.

In accordance with one or more other embodiments, a semiconductor device includes a first region including a first transistor, the first transistor including a first gate electrode, a first source, a first drain, and a first nanowire between the first source and the first drain, the first nanowire having a first shape; and a second region including a second transistor, the second transistor including a second gate electrode, a second source, a second drain, and a second nanowire between the second source and the second drain, the second nanowire having a second shape different from the first shape.

In accordance with one or more other embodiments, a method for manufacturing a transistor includes forming a nanowire, forming source and drain areas on respective sides of the nanowire, and forming a gate electrode adjacent the nanowire, wherein the nanowire includes a first section with a first thickness and a second section with a second thickness greater than the first thickness, and wherein the second section is between the first section and at least one of the source or drain areas, the nanowire to include a channel when a voltage is applied to the gate electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
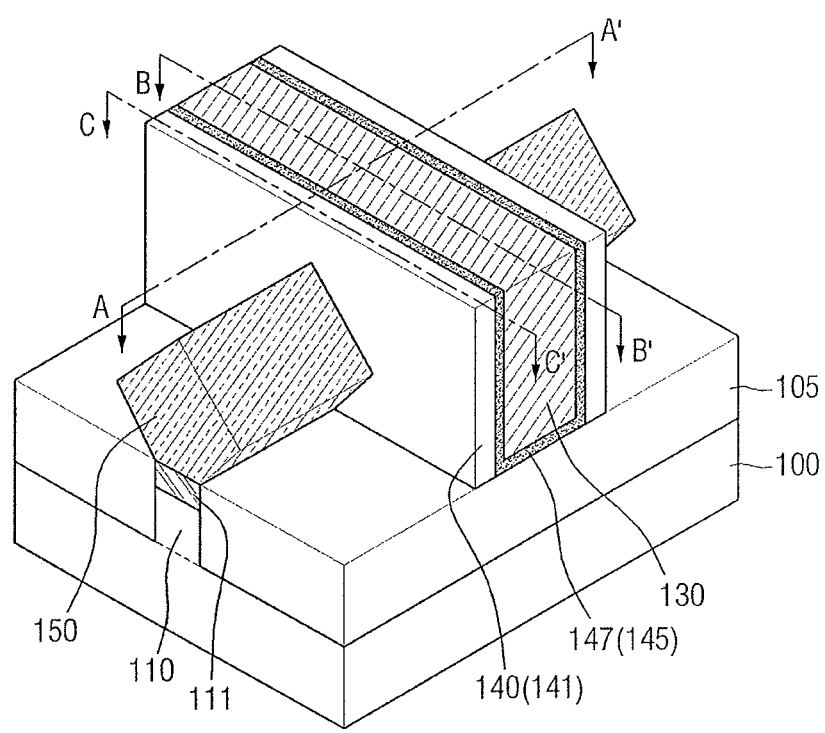
FIG. 1 illustrates an embodiment of a semiconductor device.
Figure 2:
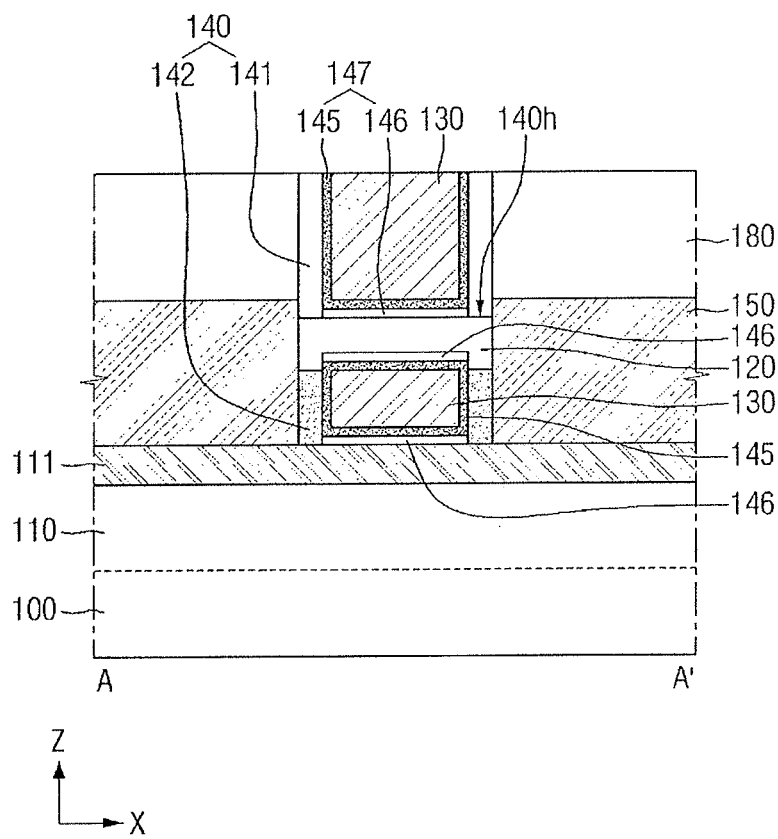
FIG. 2 illustrates an embodiment taken along section line A-A' in FIG. 1.
Figure 3:
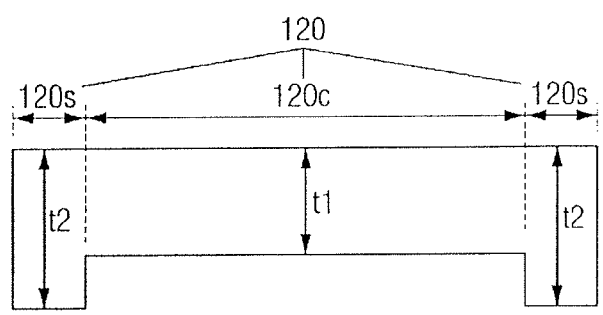
FIG. 3 illustrates an embodiment of first nanowire in FIG. 2.
Figure 4:
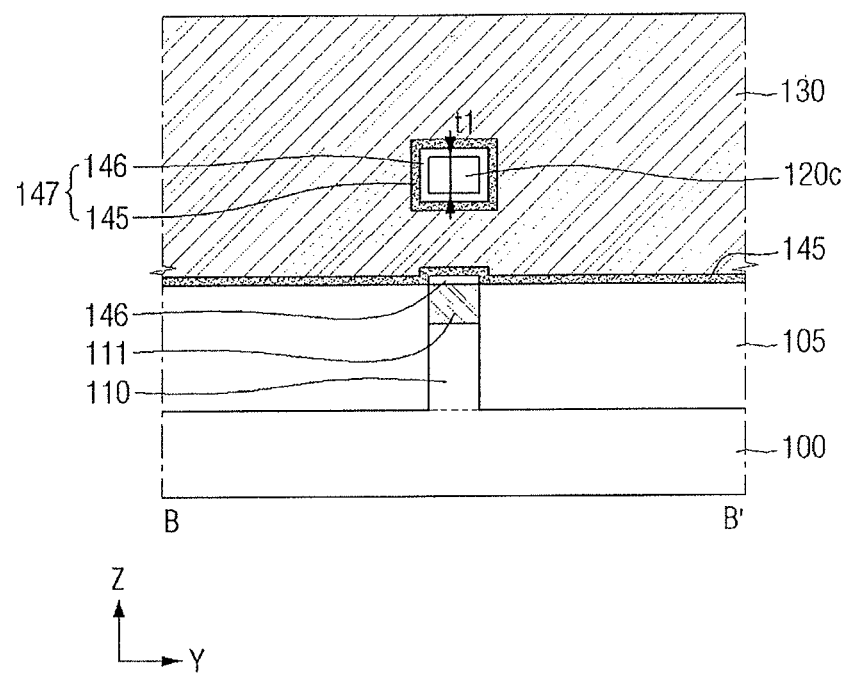
FIG. 4 illustrates an embodiment taken along section line B-B' in FIG. 1.
Figure 5:
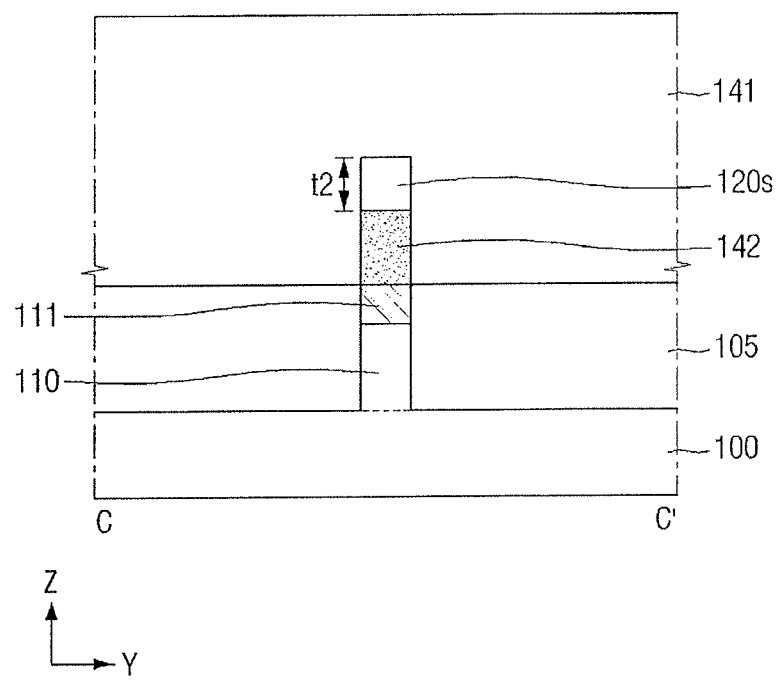
FIG. 5 illustrates an embodiment taken along section line C-C' in FIG. 1.
Figure 6:
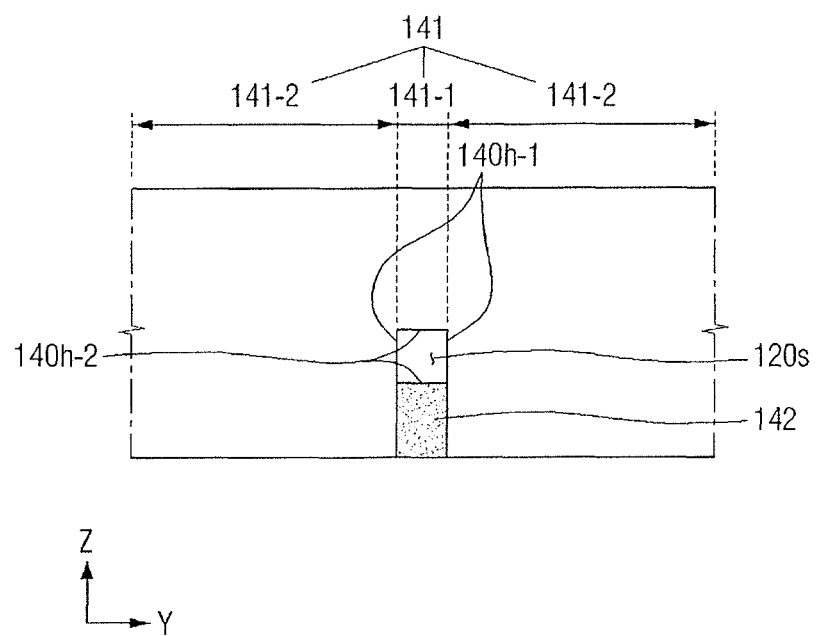
FIG. 6 illustrates an embodiment of an outer spacer and inner spacer in FIG. 5.

FIG. 1 illustrates an embodiment of a semiconductor device. FIG. 2 is a cross sectional view taken along line A-A' in FIG. 1. FIG. 3 is a cross sectional view of an embodiment of a first nanowire in FIG. 2. FIG. 4 is a cross sectional view along line B-B' in FIG. 1. FIG. 5 is a cross sectional view along line C-C' in FIG. 1. FIG. 6 is a cross sectional view of an embodiment of an outer spacer and inner spacer in FIG. 5.

Referring to FIG. 1, the semiconductor device may include a fin-type pattern 110, a passivation film 111, a first nanowire 120, a gate electrode 130, a gate spacer 140, a source/drain 150, and so on.

The substrate 100 may be, for example, a bulk silicon or a silicon-on-insulator (SOI). Alternatively, the substrate 100 may be a silicon substrate or may include other material such as but not limited to silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The fin-type pattern 110 may protrude from the substrate 100. The passivation film 111 may be formed on an upper surface of the fin-type pattern 110. The passivation film 111 may be stacked in the same shape as the fin-type pattern 110 to form a protruding structure. A field insulating film 105 may surround at least a portion of the sidewalls of the fin-type pattern 110 and the passivation film 111. The fin-type pattern 110 may be defined by the field insulating film 105. The field insulating film 105 may include, for example, one of oxide film, nitride film, oxynitride film, or a combination thereof.

In FIG. 1, the sidewalls of the fin-type pattern 110 and the passivation film 111 may be completely surrounded by the field insulating film 105. In another embodiment, the field insulating film 105 may only partially surround the fin-type pattern 110 and passivation film or may be formed to have another configuration or shape.

The fin-type pattern 110 may be elongated in a first direction X. For example, the fin-type pattern 110 may include a long side extending in the first direction X and a short side extending in a second direction Y.

The fin-type pattern 110 may be formed by partially etching the substrate 100, and may include an epitaxial layer grown from the substrate 100. The fin-type pattern 110 may include, for example, an element semiconductor material such as silicon or germanium. Further, the fin-type pattern 110 may include a compound semiconductor such as, for example, a Group IV-IV compound semiconductor or Group III-V compound semiconductor.

In the case of Group IV-IV compound semiconductor, the fin-type pattern 110 may be, for example, a binary compound or a ternary compound including at least two or more of carbon (C), silicon (Si), germanium (Ge) or tin (Sn), or these compounds doped with a Group IV element.

In the case of a Group III-V compound semiconductor, the fin-type pattern 110 may be, for example, a binary, ternary or quaternary compound which is formed by combination of at least one Group III element selected from aluminum (Al), gallium (Ga), and indium (In), with one V group element selected from phosphorus (P), arsenic (As) and antimony (Sb). In the following description, it is assumed that the fin-type pattern 110 includes silicon.

The passivation film 111 may include a different material from the fin-type pattern 110. For example, when the fin-type pattern 110 includes silicon, the passivation film 111 may include SiGe. As a result, the passivation film 111 may serve as an etch stop film in the fabrication process of the semiconductor device according to some exemplary embodiments.

The first nanowire 120 may be formed on and spaced from the substrate 100 and may extend in the first direction X. For example, the first nanowire 120 may be formed on, overlap, and be spaced from the fin-type pattern 110. In one embodiment, the first nanowire 120 may be formed on the fin-type pattern 110, rather than being formed on the field insulating film 105.

The first nanowire 120 has a square or rectangular cross section in FIG. 4. In another embodiment, the first nanowire 120 may have a different cross-sectional shape, e.g., the corner of the first nanowire 120 may be rounded by trimming process.

The first nanowire 120 may be used as a channel region for the transistor. The materials for the first nanowire 120 may vary, for example, depending on whether the semiconductor device is a PMOS or an NMOS. Further, the first nanowire 120 may include the same material as the fin-type pattern 110 or may include a material different from the fin-type pattern 110. For convenience of explanation, it will be assumed that the first nanowire 120 includes silicon.

The gate electrode 130 may be formed on the field insulating film 105 and the fin-type pattern 110. The gate electrode 130 may extend in the second direction Y. In one embodiment, the gate electrode 130 may surround the periphery of the first nanowire 120, that is spaced apart from an upper surface of the fin-type pattern 110. The gate electrode 130 may also be formed in a space between the first nanowire 120 and the fin-type pattern 110.

The gate electrode 130 may include a conductive material. As illustrated, the gate electrode 130 may be a single layer. In another embodiment, the gate electrode 130 may include multiple layers. For example, the gate electrode 130 may include a work function conductive layer to adjust work function and a filling conductive layer to fill a space formed by the work function conductive layer for work function adjustment.

The gate electrode 130 may include, for example, at least one of TiN, WN, TaN, Ru, TiC, TaC, Ti, Ag, Al, TiAl, TiAlN, TiAlC, TaCN, TaSiN, Mn, Zr, W, or Al. In one embodiment, the gate electrode 130 may include a non-metal element, e.g., Si, SiGe, or another element. The gate electrode 130 may be formed by replacement process or another process.

The gate spacers 140 may be formed on opposite sidewalls of the gate electrode 130 extending in the second direction Y. In one embodiment, the gate spacers 140 may be formed on opposite sides of the first nanowire 120, while facing each other. The gate spacer 140 may each include a through hole 140h.

The first nanowire 120 may pass through the gate spacer 140 through the through hole 140h. The gate spacer 140 may be entirely in contact with a periphery of a portion of the side surface of the first nanowire 120. When the corner of the first nanowire 120 surrounded by the gate electrode 130 is rounded by a process such as trimming, the portion of the side surface of the first nanowire 120 in contact with the gate spacer 140 may have a cross section different from a cross section of the first nanowire 120 surrounded by the gate electrode 130.

The gate spacer 140 may include a first outer spacer 141 and a first inner spacer 142. The first outer spacer 141 may be in direct contact with the first inner spacer 142. The first inner spacer 142 may be between the upper surface of the fin-type pattern 110 and the first nanowire 120, and in at least one embodiment may be in surface contact with the upper surface of the fin-type pattern 110. In a cross section along the Y-Z plane, the first inner spacer 142 may be surrounded by the first nanowire 120, the first outer spacer 141, and the fin-type pattern 110.

The through hole 140h of the gate spacer 140 may be defined by the first outer spacer 141 and the first inner spacer 142. One or more ends of the first nanowire 120 may be in contact with the first outer spacer 141 and the first inner spacer 142.

Referring to FIG. 6, the through hole 140h may include first sides 140h-1 facing each other in the second direction Y and second sides 140h-2 facing each other in a third direction Z. The second sides 140h-2 of the through hole 140h may connect the first sides 140h-1 of the through hole 140h that face each other.

In the semiconductor device according to exemplary embodiments, at least one of the second sides 140h-2 of the through hole 140h may be defined by the first inner spacer 142. However, the first sides 140h-1 of the through hole 140h may be defined by the first outer spacer 141. For example, the through hole 140h may include three sides 140h-1 and 140h-2 defined by the first outer spacer 141 and one side 140h-2 defined by the first inner spacer 142.

The first side 140h-1 of the through hole 140h may be defined by the first outer spacer 141. Further, one of the second sides 140h-2 of the through hole 140h may be defined by the first outer spacer 141. The other of the second sides 140h-2 of the through hole 140h may be defined by the first inner spacer 142.

The first outer spacer 141 and the first inner spacer 142 may include different materials. When the dielectric constant of the material in the first outer spacer 141 is a first dielectric constant and the dielectric constant of the material in the first inner spacer 142 is a second dielectric constant, the first dielectric constant and the second dielectric constant may be different.

In the semiconductor device according to some exemplary embodiments, the material in the first outer spacer 141 may have a first dielectric constant greater than a second dielectric constant of the material in the first inner spacer 142. It is possible to reduce the fringing capacitance between the gate electrode 130 and the source/drain 150 by having the second dielectric constant lower than the first dielectric constant.

For example, the first outer spacer 141 may include at least one of silicon nitride (SiN), silicon oxynitride (SiON), silicon oxide (SiO$_2$), silicon oxycarbidenitride (SiOCN), or a combination thereof. For example, the first inner spacer 142 may include at least one of a low-k dielectric material, silicon nitride (SiN), silicon oxynitride (SiON), silicon oxide (SiO2), silicon oxycarbidenitride (SiOCN), or a combination thereof. The low-k dielectric material may be the material that has a lower dielectric constant than the silicon oxide.

In another aspect, the first outer spacer 141 of the gate spacer 140 may include a first region 141-1 and a second region 141-2. The second region 141-2 may be on opposite sides in the second direction Y with reference to the first region 141-1. The first region 141-1 may be a region through which the first nanowire 120 passes. The second region 141-2 may be a region where the first nanowire 120 does not pass. Thus, the through hole 140h of the gate spacer 140 may be in the first region 141-1, e.g., the through hole 140h may be surrounded by the first region 141-1 and the first inner spacer 142.

The second region 141-2 may be composed of the first outer spacer 141 only. In one embodiment, the first region 141-1 may include the first outer spacer 141 and the first inner spacer 142, e.g., the first region 141-1 may include a portion of the first outer spacer 141. The height from the upper surface of the substrate 100 to the first 141-1 of the gate spacer 140 is greater than the height from the upper surface of the substrate 100 to the first inner spacer 142.

In the semiconductor device according to exemplary embodiments, at least one of the second sides 140h-2 of the through hole 140h may be defined by the first inner spacer 142. However, the first sides 140h-1 of the through hole 140h may be defined by the first region 140-1, e.g., by the first outer spacer 141.

The first inner spacer 142 may be in direct contact with the second region 141-2. Further, the second region 141-2 and the first region 140-1 are in the first outer spacer 141. Accordingly, the second region 141-2 and the first region 140-1 of the gate spacer may be an integral structure.

Referring to FIGS. 2 and 3, the first nanowire 120 may include a first center region 120c and a first side region 120s. The first center region 120c may have a first thickness t1. The first side region 120s may have a second thickness t2 different from (e.g., greater than) the first thickness t1.

The first side region 120s may be on opposite sides of the first center region 120c. In this case, the first side region 120s may be on opposite sides in the first direction x of the first center region 120c. The first side region 120s and the first center region 120c may be connected with each other, to thereby form a structure in which both the first side region 120s and the first center region 120c are integrated.

The upper surfaces of the first center region 120c and the first side region 120s may be in the same plane. In contrast, the lower surfaces of the first center region 120c and the first side region 120s may form different planes from each other. For example, the lower surface of the first center region 120c may be higher than the lower surface of the first side region 120s.

The first center region 120c may overlap the gate electrode 130. For example, the first center region 120c may be in contact with the gate insulating film 147 and surrounded by the gate electrode 130.

The first side region 120s may be surrounded by the gate spacer 140. The upper surface of the first side region 120s may be in contact with the first outer spacer 141. The lower surface of the first side region 120s may be in contact with the first inner spacer 142.

In a semiconductor device according to some exemplary embodiments, the first nanowire 120 may be alternately stacked with sacrificial material in order to be formed as a channel region. After that, the first nanowire 120 may be formed with the removal of the sacrificial material. At this time, diffusion occurs at the interface with the sacrificial material. As diffusion occurs, a portion overlapping the gate electrode 130 may be removed concurrently with the removal of the sacrificial material. As a result, the first nanowire 120 may be formed. The first nanowire 120 may have a portion overlapping the gate spacer 140 and a portion overlapping the gate electrode 130. These portions may have different thicknesses from each other.

In a semiconductor device according to an exemplary embodiment, an interposed film may not be between the uppermost portion of the first nanowire 120 and the first outer spacer 141, at a portion overlapping the gate spacer 140. For example, the uppermost portion of the first nanowire 120 may be in contact with the first portion 140-1 of the gate spacer.

Accordingly, the lowermost portion of the first nanowire 120 may contact the first inner spacer 142 of the gate spacer, and the uppermost portion of the first nanowire 120 may contact the first region 140-1. For example, the lowermost portion of the first nanowire 120 may contact the first inner spacer 142, and the uppermost portion of the first nanowire 120 may contact the first outer spacer 141.

The gate insulating film 147 may be formed between the first nanowire 120 and the gate electrode 130. Further, the gate insulating film 147 may also be formed between the field insulating film 105 and the gate electrode 130 and between the inner spacer 142 and the gate electrode 130. For example, the gate insulating film 147 may include an interfacial film 146 and a high-k insulating film 145. In one embodiment, the interfacial film 146 of the gate insulating film 147 may be omitted depending, for example, on the material of the first nanowire 120.

Because the interfacial film 146 may be formed on a periphery of the first nanowire 120, the interfacial film 146 may be formed between the first nanowire 120 and the gate electrode 130 and between the fin-type pattern 110 and the gate electrode 130. At this time, the interfacial film 146 between the fin-type pattern 110 and the gate electrode 130 may be formed between the passivation film 111 and gate electrode 130.

The high-k insulating film 145 may be formed between the first nanowire 120 and the gate electrode 130, between the inner spacer 142 and the gate electrode 130, between the field insulating film 105 and the gate electrode 130, and between the first outer spacer 141 and the gate electrode 130.

The gate insulating film 147 may be formed along the periphery of the first nanowire 120. The gate insulating film 147 may be formed along the upper surface of the field insulating film 105 and the upper surface of the spacing 142*b* of the inner spacer 142. Additionally, the gate insulating film 147 may be formed along the sidewalls of the first inner spacer 142 and the first outer spacer 141.

When the first nanowire 120 includes silicon, the interface film 146 may include silicon oxide film. At this time, the interface film 146 may be formed on the periphery of the first nanowire 120 and the upper surface of the inner spacer 142, but not along the sidewalls of the first inner spacer 142 and the first outer spacer 141.

When the interfacial film 146 is a native oxide film that is formed naturally on the surface of silicon, the interfacial film 146 may not be formed between the passivation film 111 and the gate electrode 130. This is because the passivation film 111 may prevent formation of the native oxide film by preventing exposure of the fin-type pattern 110. When the interfacial film 146 is a deposited oxide film rather than native oxide film, then the interfacial film 146 may be formed between the passivation film 111 and the gate electrode 130.

The high-k insulating film 145 may include a high-k dielectric material having a higher dielectric constant than silicon oxide film. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

As described above, when the interfacial film 146 is omitted, the high-k insulating film 145 may include not only the high-k dielectric material, but also silicon oxide film, silicon oxynitride film, silicon nitride film, and so on.

The source/drain 150 may be formed on opposite sides of the gate electrode 130 and on the fin-type pattern 110. The source/drain 150 may include an epitaxial layer formed on an upper surface of the fin-type pattern 110. An outer circumference of the source/drain 150 may take on a variety of shapes, e.g., at least one of a diamond, circle, rectangle, or octagon shape. FIG. 1 illustrates a diamond, pentagon, or hexagon shape as an example.

The source/drain 150 may be directly connected with the first nanowire 120, in which the channel region is formed. For example, the source/drain 150 may be directly connected with the first nanowire 120 passing through the through hole 140*h* of the gate spacer 140.

The source/drain 150 may not be in direct contact with the gate insulating film 147. The gate spacer 140 may be between the source/drain 150 and the gate insulating film 147. For example, one sidewall of the inner spacer 142 may be in contact with the gate insulating film 147, while the other sidewall of the inner spacer 142 may be in contact with the source/drain 150. In this case, the source/drain 150 and the gate insulating film 147 may not be in contact with each other between the first nanowire 120 and the substrate 100. Further, since the outer spacer 141 is in contact with the uppermost portion of the first nanowire 120, the source/drain 150 and the gate insulating film 147 may not be in contact with each other over the first nanowire 120.

The interlayer insulating film 180 may be formed on the source/drain 150, the gate spacer 140, the dummy gate pattern 135, and the field insulating film 105. The interlayer insulating film 180 may include at least one of low-k material, oxide film, nitride film, or oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD) oxide, or a combination thereof.

According to some exemplary embodiments, the operating characteristic of the semiconductor device may be enhanced by the shape of the first nanowire 120. For example, the first nanowire 120 includes the channel region. Because a portion of the first nanowire 120 connected to the source/drain 150 is an area where carriers (e.g., electrons or holes) are relatively densely focused, this portion may have bottle neck phenomenon that may adversely affect operation speed of the semiconductor device.

In some exemplary embodiments, such bottle neck phenomenon may be improved by forming the first nanowire 120 so that the second thickness t2 of the first side region 120$s$ is greater than the first thickness t1 of the first center region 120$c$. This may lead to faster operating speed and enhanced operation of the semiconductor device according to some exemplary embodiments.

Figure 7:
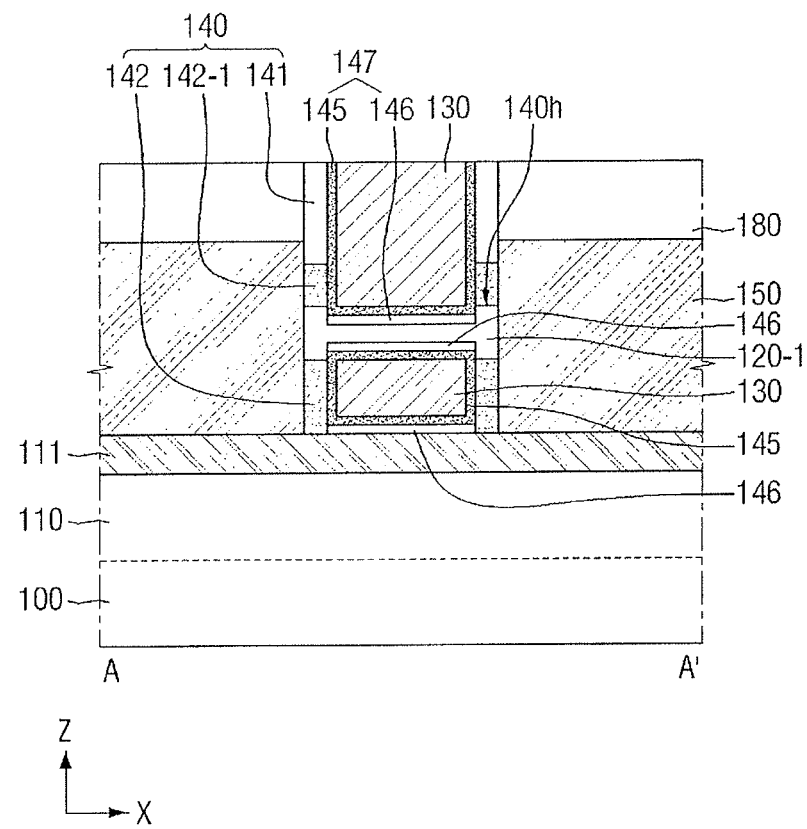
FIG. 7 illustrates another embodiment of a semiconductor device.
Figure 8:
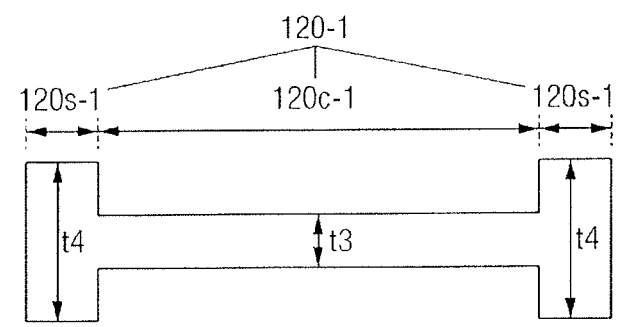
FIG. 8 illustrates an embodiment of a first nanowire in FIG. 7.
Figure 9:
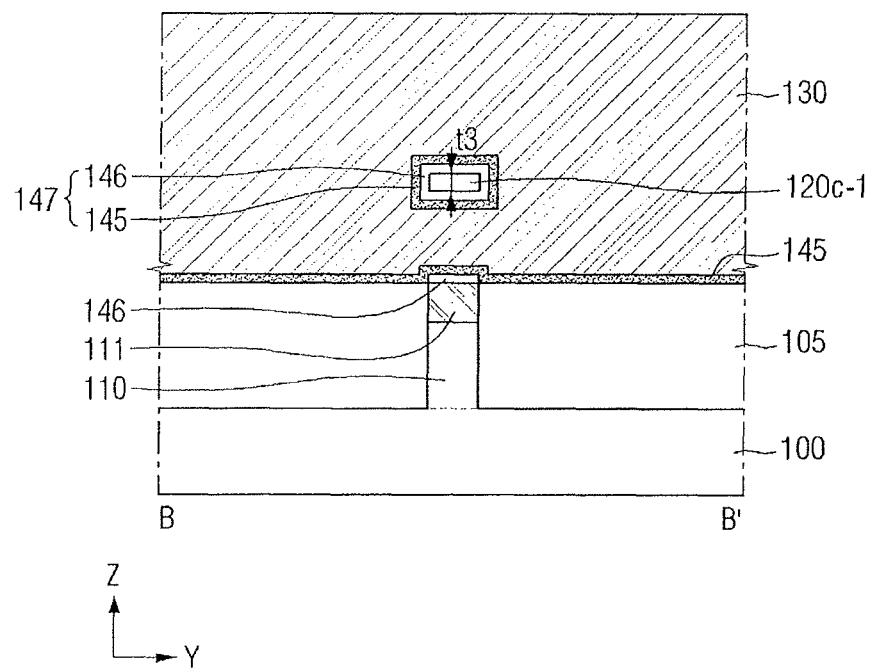
FIG. 9 illustrates another view of the semiconductor device in FIG. 8.
Figure 10:
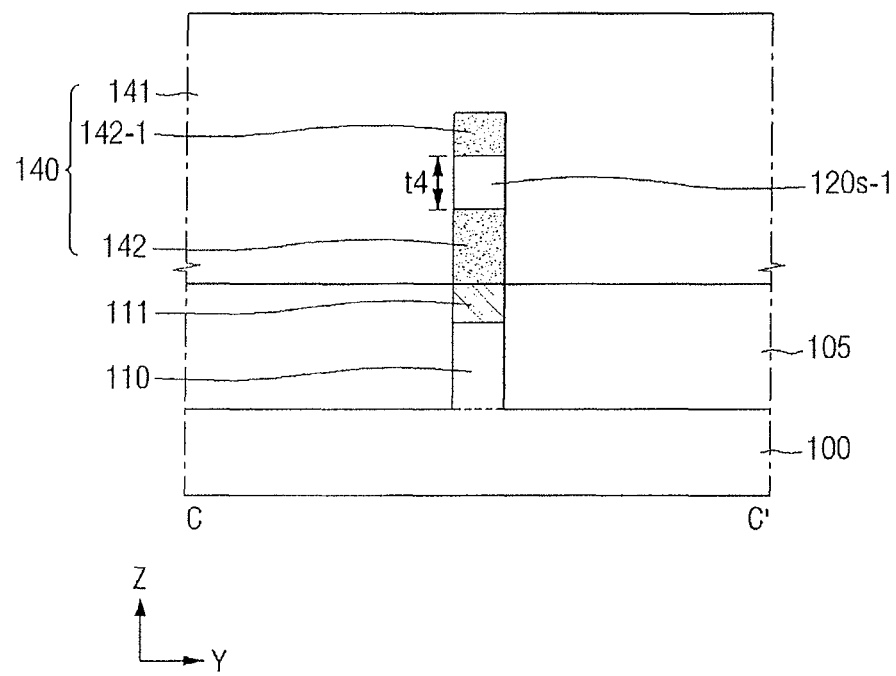
FIG. 10 illustrates another view of the semiconductor device in FIG. 8.

FIGS. 1 and 7 to 10 illustrate another embodiment of a semiconductor device, and FIG. 8 illustrates a cross sectional view of an embodiment of the first nanowire in FIG. 7. FIG. 9 is a cross sectional view of the semiconductor device of FIG. 8, and FIG. 10 is another cross sectional view of the semiconductor device in FIG. 8. For reference, FIG. 7 is a cross sectional view taken along line A-A' in FIG. 1. FIG. 9 is a cross sectional view taken along line B-B' of FIG. 1. FIG. 10 is a cross sectional view taken along line C-C' in FIG. 1.

Referring to FIGS. 1 and 7 to 10, the semiconductor device includes a second inner spacer 142-1 which is spaced from the first inner spacer 142 in the third direction Z. Accordingly, the uppermost portion of the first nanowire 120 may contact the second inner spacer 142-1 and the lowermost portion of the first nanowire 120 may contact the first inner spacer 142.

Each of the first inner spacer 142 and the second inner spacer 142-1 may be included in the first region 141-1 and may include a material with a lower dielectric constant than the first outer spacer 141. The first inner spacer 142 and the second inner spacer 142-1 are under and over the first nanowire 120, respectively.

The first nanowire 120-1 may include a first center region 120$c$-1 and a first side region 120$s$-1. The first center region 120$c$-1 may have a third thickness t3. The first side region 120$s$-1 may have a fourth thickness t4 which is greater than the third thickness t3.

The first side region 120$s$-1 may be formed on opposite sides of the first center region 120$c$-1. In this case, the first side region 120$s$-1 may be formed on opposite sides in the first direction x of the first center region 120$c$-1. The first side region 120$s$-1 and the first center region 120$c$-1 may be connected with each other, to thereby form a structure in which both the first side region 120$s$-1 and the first center region 120$c$-1 are integrated.

The upper surfaces of the first center region 120$c$-1 and the first side region 120$s$-1 may be in different planes from each other. For example, the lower surface of the first center region 120$c$-1 may be lower than the upper surface of the first side region 120$s$-1. Also, the lower surfaces of the first center region 120$c$-1 and the first side region 120$s$-1 may be in different planes from each other. For example, the lower surface of the first center region 120$c$-1 may be higher than the lower surface of the first side region 120$s$-1.

The first center region 120$c$-1 may overlap the gate electrode 130. For example, the first center region 120$c$-1 may contact the gate insulating film 147 and may be surrounded by the gate electrode 130. The first side region 120$s$-1 may be surrounded by the gate spacer 140. The upper surface of the first side region 120$s$-1 may contact the first outer spacer 141, and the lower surface of the first side region 120$s$-1 may contact the first inner spacer 142.

Figure 11:
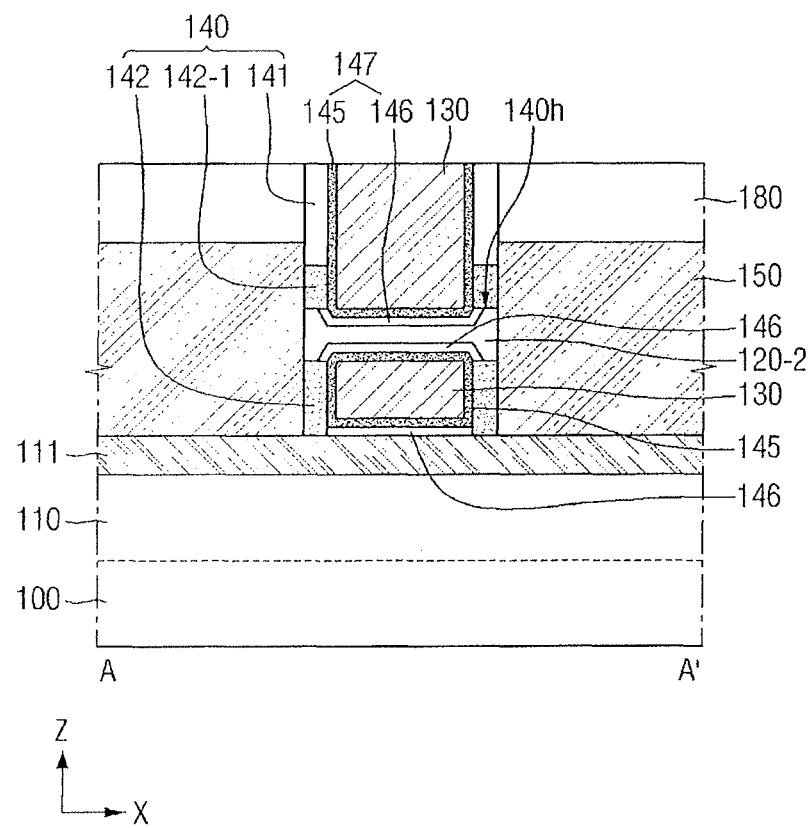
FIG. 11 illustrates another embodiment of a semiconductor device.
Figure 12:
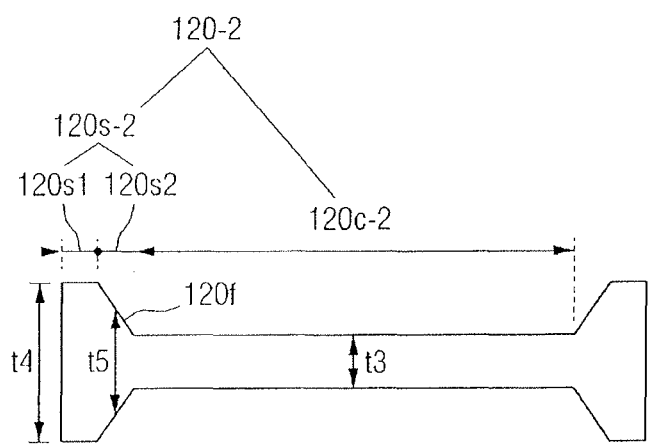
FIG. 12 illustrates an embodiment of a first nanowire in FIG. 11.

FIGS. 1, 11, and 12 illustrate another embodiment of a semiconductor device. In particular, FIG. 11 illustrates a cross sectional view of the semiconductor device and FIG. 12 illustrates a cross sectional view of an embodiment of a first nanowire in FIG. 11 taken along line A-A' in FIG. 1.

Referring to FIGS. 1, 11, and 12, the semiconductor device includes a first nanowire 120-2 having a first center region 120$c$-2 and a first side region 120$s$-2. The first center region 120$c$-2 may have a third thickness t3. The first side region 120$s$-2 may include a contact region 120$s$1 and a spacing region 120$s$2. The contact region 120$s$1 may be in contact with the first inner spacer 142 and the second inner spacer 142-1. The lower surface of the contact region 120$s$1 may be in contact with the first inner spacer 142 and the upper surface of the contact region 120$s$1 may be in contact with the second inner spacer 142-1. The contact region 120$s$1 may have a fourth thickness t4 greater than the third thickness t3.

The spacing region 120$s$2 may overlap the first inner spacer 142 and the second inner spacer 142-1, but may not contact the first inner spacer 142 and the second inner spacer 142-1. The spacing region 120$s$2 may be between the first center region 120$c$-2 and the contact region 120$s$1. The spacing region 120$s$2 may have a fifth thickness t5 greater than the third thickness t3 and less than the fourth thickness t4.

The spacing region 120$s$2 may connect the first center region 120$c$-2 with the contact region 120$s$1, and may include an inclined surface 120$f$ connected to the upper surface and the lower surface of the first center region 120$c$-2 and the upper surface and the lower surface of the contact region 120$s$1. The inclined surface 120$f$ may be inclined in a direction from the contact region 120$s$1 to the first center region 120$c$-2. The fifth thickness t5 of the spacing region 120$s$2 may gradually decrease from the fourth thickness t4 to the third thickness t3, as the distance from the first center region 120$c$-2 decreases.

Such a shape of the first nanowire 120-2 may be attributable, for example, to an etch process. Since the surface of the first nanowire 120-2 includes an inclined surface and a stepped portion, the gate insulating film 147 may also be formed along the surface of the first nanowire 120-2.

Figure 13:
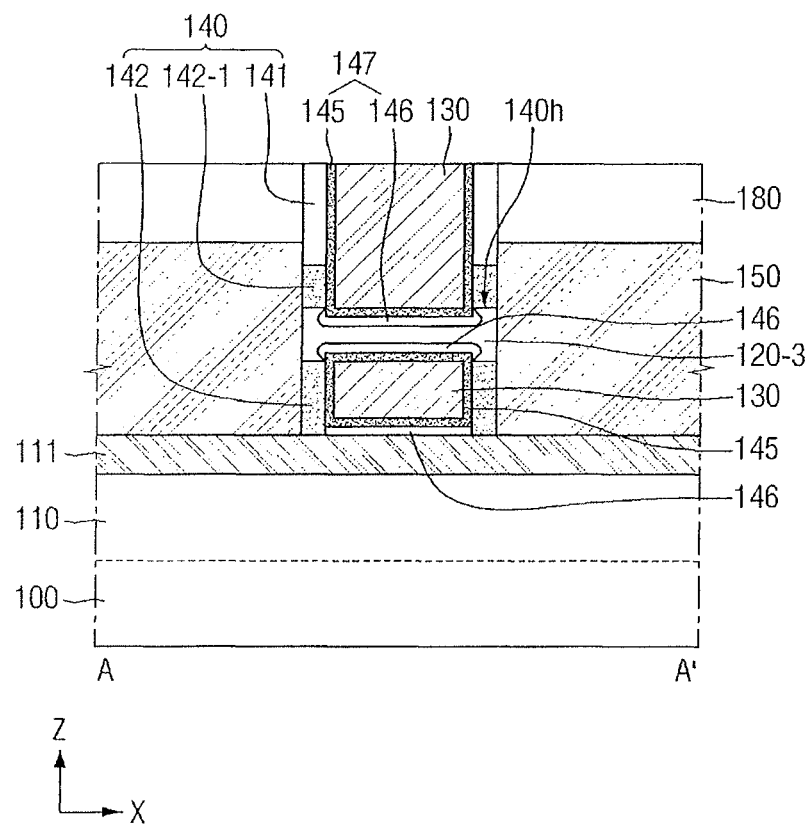
FIG. 13 illustrates another embodiment of a semiconductor device.
Figure 14:
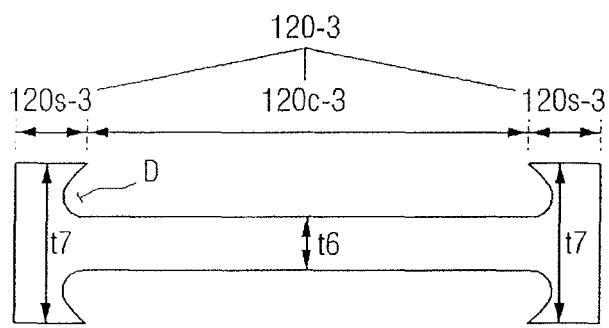
FIG. 14 illustrates an embodiment of a first nanowire in FIG. 13.

FIGS. 1, 13, and 14 illustrates another embodiment of a semiconductor device. In particular, FIG. 13 illustrates a cross sectional view of the semiconductor device and FIG. 14 is a cross sectional view of an embodiment of a first nanowire in FIG. 13.

Referring to FIGS. 1, 13 and 14, the semiconductor device includes a first nanowire 120-3 having a first center region 120$c$-2 and a first side region 120$s$-2. The first center region 120$c$-3 may have a sixth thickness t6. The first side region 120$s$-3 may have a seventh thickness t7 greater than the sixth thickness t6. The first side region 120$s$-3 may include a dimple D. For example, the first side region 120$s$-3 may include the dimple D on a side surface at the direction of the first center region 120$c$-3. The dimple D may be formed anywhere except, for example, the portion where the first side region 120$s$-3 and the first center region 120$c$-3 are connected. In one embodiment, the dimple D may have a concave shape in a direction opposite the first center region 120$c$-3. The dimple D may be formed, for example, by diffusion and etch processes.

Figure 15:
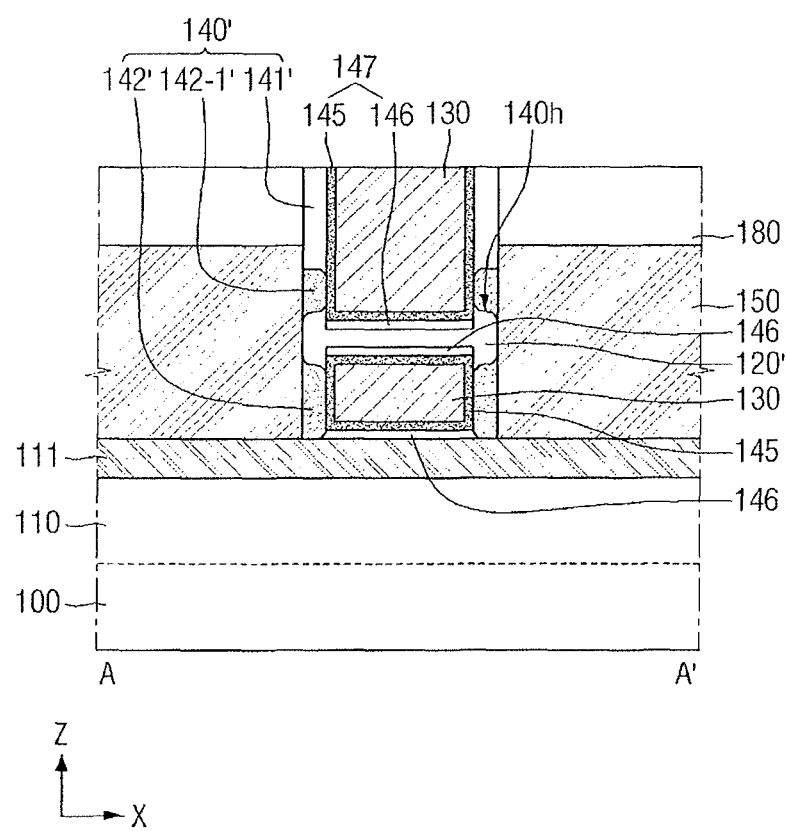
FIG. 15 illustrates another embodiment of a semiconductor device.

FIGS. 1 and 15 illustrate another embodiment of a semiconductor device taken along section line A-A' in FIG. 1. Referring to FIGS. 1 and 15, the semiconductor device has a gate spacer 140 which includes a first inner spacer 142' and a second inner spacer 142-1'. The first inner spacer 142' and the second inner spacer 142-1' may be formed to have curved surfaces on the side surface facing the gate electrode 130. The width of the first inner spacer 142' and the second inner spacer 142-1' may decrease, or taper, as the distance from the gate electrode 130 decreases.

The semiconductor device also has a first nanowire 120'. An end of the first nanowire 120' at a farther distance from the gate electrode 130 may have a curved profile. The portion of the first nanowire 120' that overlaps the first inner spacer 142' and the second inner spacer 142-1' may have a decreasing width as the distance from the gate electrode 130 increases. This result from the sacrificial material not being completely etched during the process of forming the first inner spacer 142' and the second inner spacer 142-1'. This may also result from an etch process for the sacrificial material that etches a portion of the end of the first nanowire 120'.

Figure 16:
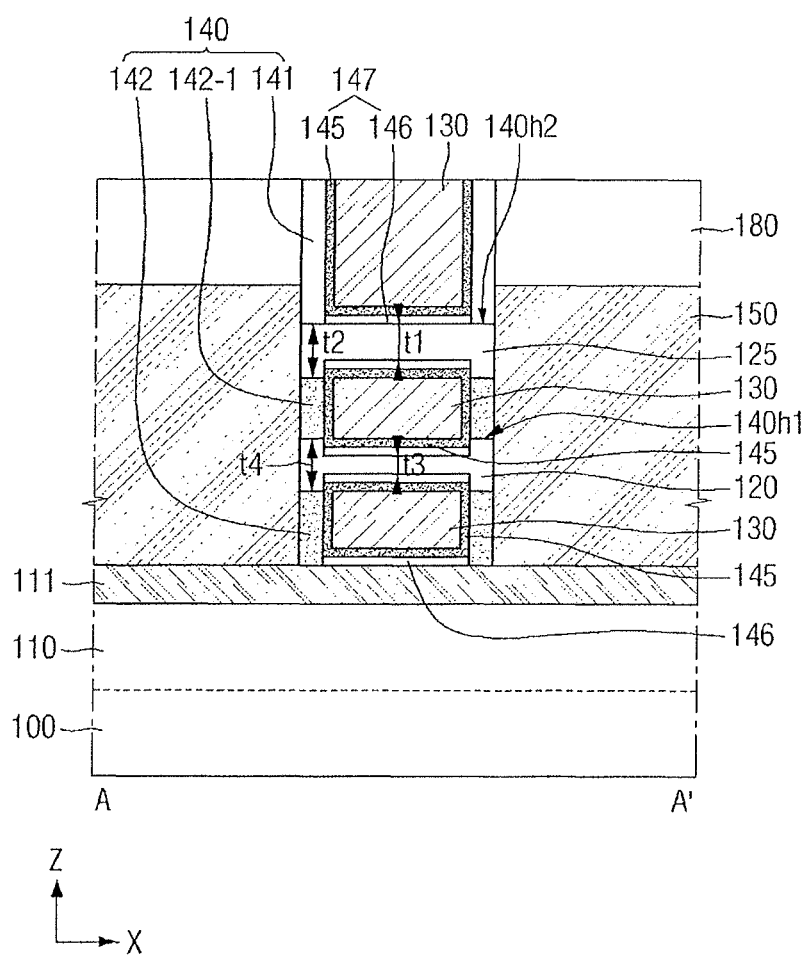
FIG. 16 illustrates another embodiment of a semiconductor device.
Figure 17:
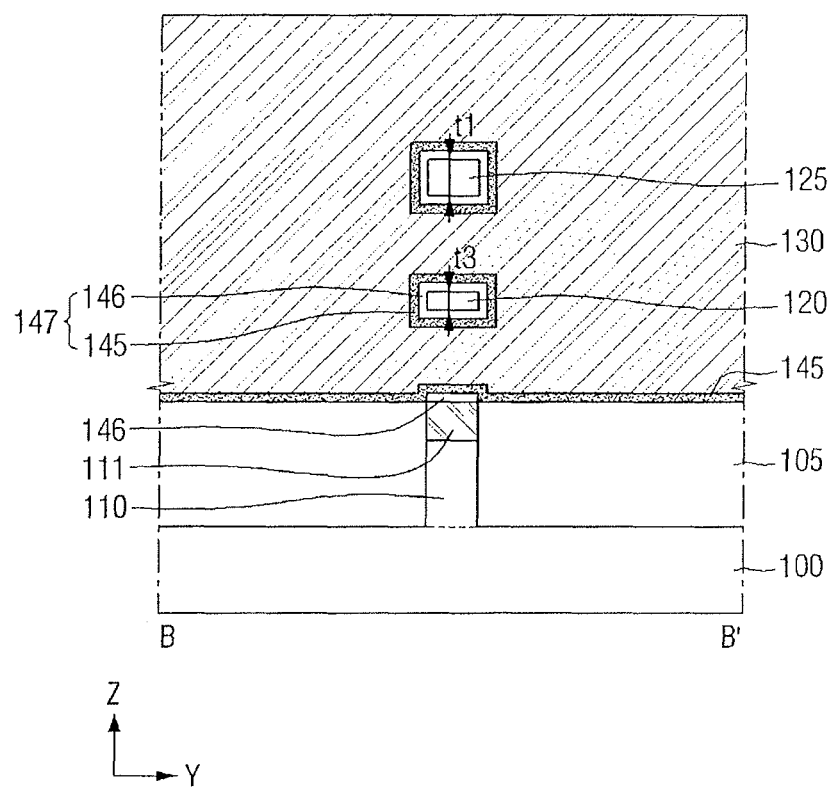
FIG. 17 illustrates another view of the semiconductor device in FIG. 16.
Figure 18:
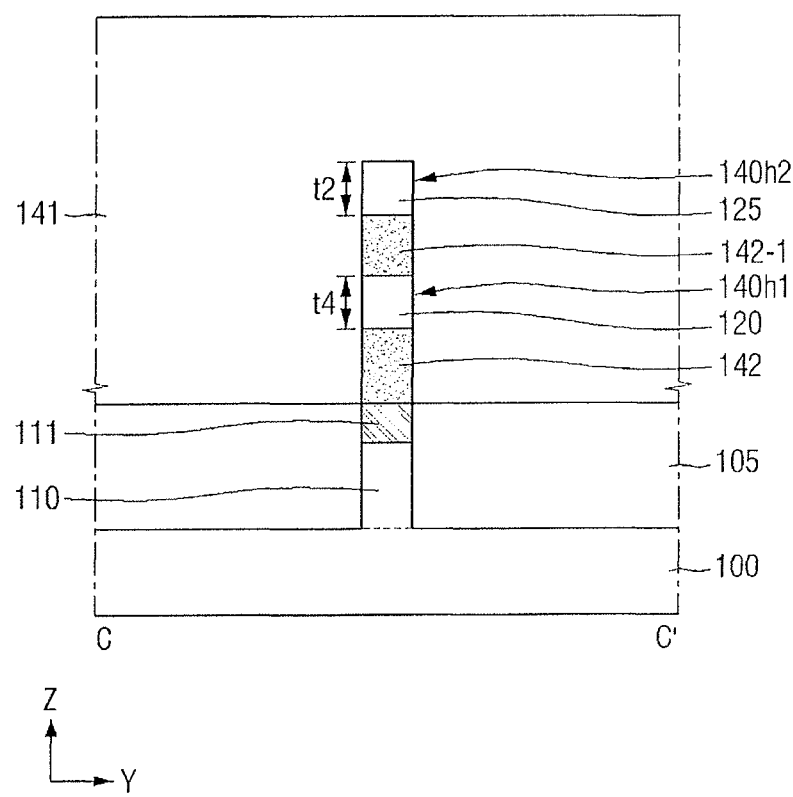
FIG. 18 illustrates another view of the semiconductor device in FIG. 16.

FIGS. 1 and 16 to 18 illustrates another embodiment of a semiconductor device. FIG. 16 is a cross sectional view taken along line A-A' in FIG. 1. FIG. 17 is a cross sectional view taken along line B-B' in FIG. 1. FIG. 18 is a cross sectional view taken along line C-C' in FIG. 1.

Referring to FIGS. 1 and 16 to 18, the semiconductor device includes a first nanowire 120 and a second nanowire 125. The first nanowire 120 may be, for example, the same as nanowire 120-1 in FIGS. 7-9. The second nanowire 125 may be, for example, the same as nanowire 120 in FIGS. 2-4. In other embodiments, the first and/or second nanowires 120 and 125 may be different from those in FIGS. 7-9 and 2-4.

The second nanowire 125 may be formed on and spaced apart from the substrate 100. The second nanowire 125 may extend in the first direction X. In one embodiment, the second nanowire 125 may be spaced farther away from the substrate 100 than the first nanowire 120, e.g., the distance between the upper surface of the fin-type pattern 110 and the second nanowire 125 may be greater than the distance between the upper surface of the fin-type pattern 110 and the first nanowire 120.

In one embodiment, the second nanowire 125 may overlap and be formed on the fin-type pattern 110, rather than being formed on the field insulating film 105. The second nanowire 125 may include a channel region for the transistor. Accordingly, the second nanowire 125 may include the same material as the first nanowire 120.

The gate electrode 130 may surround the periphery of the second nanowire 125, and may be formed in a space between the first nanowire 120 and the second nanowire 125.

The gate spacer 140 may be on or adjacent to ends of the first nanowire 120 and/or on or adjacent to respective ends of the second nanowire 125. The gate spacer 140 may include a plurality of through holes 140$h$1 and 140$h$2. The nanowire 120 may pass through hole 120$h$1. The second nanowire 125 may pass through hole 140$h$2. The periphery of the end of the second nanowire 125 may be entirely or partially in contact with the gate spacers 140.

When the corner of the second nanowire 125 surrounded by the gate electrode 130 is formed to be rounded (e.g., by a trimming process), an end of the second nanowire 125 in contact with the gate spacer 140 may have a cross section different from a cross section of the second nanowire 125 surrounded by the gate electrode 130.

The second nanowire 125 may be aligned with the first nanowire 120. The second nanowire 125 may overlap the first nanowire 120 in the third direction Z. The first nanowire 120 and the second nanowire 125 may have the same length or different lengths in the first direction X.

The gate spacer 140 may include a first inner spacer 142, a second inner spacer 142-1, and an outer spacer 141. The first inner spacer 142 may be between the upper surface of the fin-type pattern 110 and the first nanowire 120. The second inner spacer 142-1 may be between the first nanowire 120 and the second nanowire 125. The shape of the second nanowire 125 may be, for example, the same as the first nanowire 120 in FIG. 2, e.g., the second nanowire 125 may include a second center region and a second side region. The second center region may have a first thickness t1. The second side region may have a second thickness t2 greater than the first thickness t1.

The first nanowire 120-1 may include a first center region and a first side region. The first center region may have a third thickness t3. The first side region may have a fourth thickness t4 greater than the third thickness t3.

As illustrated in FIG. 16, the uppermost surface of the second nanowire 125 may be in contact with the outer spacer 141 and the lowermost surface of the second nanowire 125 may be in contact with the second inner spacer 142-1, but this is not necessary in all embodiments. For example, as illustrated in FIG. 7, the uppermost surface of the second nanowire 125 and the lowermost surface of the second nanowire 125 may be in contact with the inner spacers, respectively.

The gate insulating film 147 may be between the second nanowire 125 and the gate electrode 130. The gate insulating film 147 may be formed along the periphery of the second nanowire 125.

The source/drain 150 may be directly connected with the second nanowire 125, which includes the channel region. For example, the source/drain 150 may be directly connected with the first nanowire 120 and the second nanowire 125 that pass through the through hole 140$h$2 of the gate spacer 140.

Figure 19:
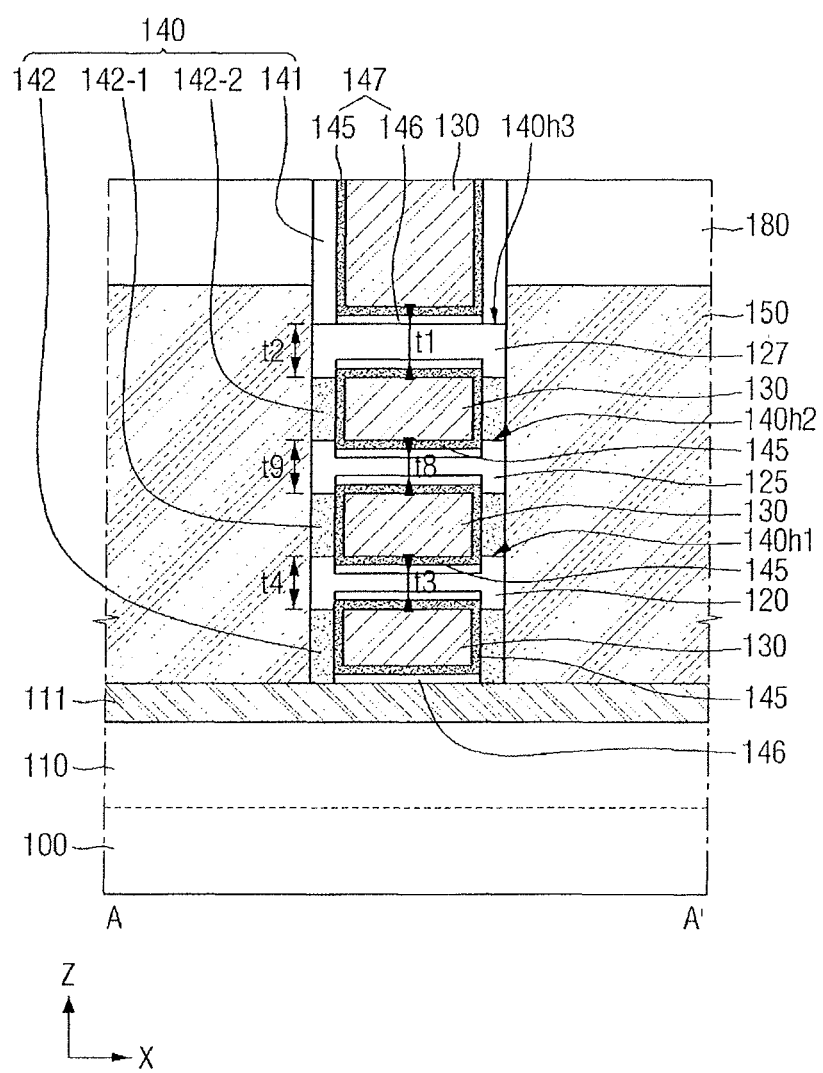
FIG. 19 illustrates another embodiment of a semiconductor device.
Figure 20:
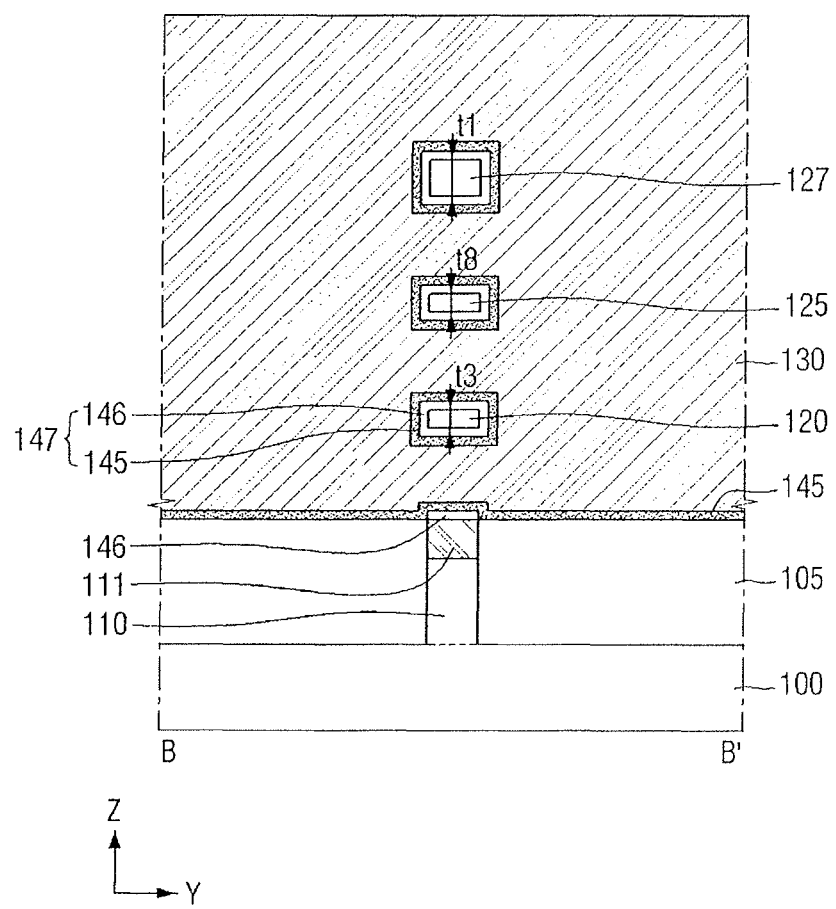
FIG. 20 illustrates another view of the semiconductor device in FIG. 19.
Figure 21:
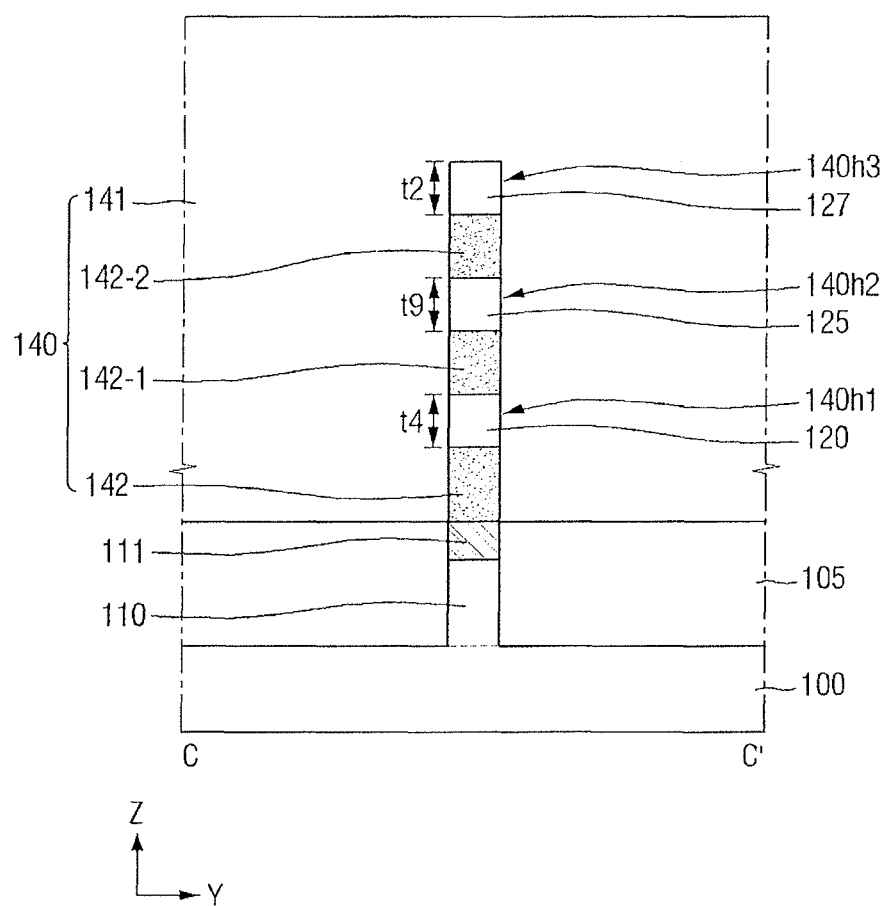
FIG. 21 illustrates another view of the semiconductor device in FIG. 19.

FIGS. 1 and 19 to 21 illustrates an embodiment of a semiconductor device. In particular, FIG. 19 is a cross sectional view taken along line A-A' in FIG. 1. FIG. 20 is a cross sectional view taken along line B-B' in FIG. 1. FIG. 21 is a cross sectional view taken along line C-C' in FIG. 1.

Referring to FIGS. 1 and 19 to 21, the semiconductor device includes a first nanowire 120 and a third nanowire 127 that are same as the first nanowire 120 and the second nanowire 125 of FIG. 16. Further, the semiconductor device may include a second nanowire 125 and a third inner spacer 142-2.

The third nanowire 127 may be formed on and spaced from the substrate 100. The third nanowire 127 may extend in the first direction X. The third nanowire 127 may be spaced farther away from the substrate 100 than the first nanowire 120 and the second nanowire 125. For example, a distance between the upper surface of the fin-type pattern 110 and the third nanowire 127 may be greater than a distance between the upper surface of the fin-type pattern 110 and the first nanowire 120 and a distance between the upper surface of the fin-type pattern 110 and the second nanowire 125.

In one embodiment, the third nanowire 127 may overlap the fin-type pattern 110, rather than overlapping the field insulating film 105. The third nanowire 127 may include a channel region for the transistor. Accordingly, the third nanowire 127 may include the same material as the first nanowire 120 and the second nanowire 125.

The gate electrode 130 may be formed to surround the periphery of the third nanowire 127 and may also be formed in a space between the second nanowire 125 and the third nanowire 127.

The gate spacers 140 may be on or adjacent to ends of the first nanowire 120, on or adjacent to ends of the second nanowire 125, and/or on or adjacent to ends of the third nanowire 127. The gate spacer 140 may include a plurality of through holes 140$h$1, 140$h$2, and 140$h$3.

The third nanowire 127 may be passed through the gate spacer 140. For example, the third nanowire 127 may pass through hole 140h3. The periphery of the end of the third nanowire 127 may be entirely or partially in contact with the gate spacer 140.

Like the first nanowire 120 and the second nanowire 125, when the corner of the third nanowire 127 surrounded by the gate electrode 130 is rounded (e.g., by a trimming process), the end of the third nanowire 127 in contact with the gate spacer 140 may have a cross section different from a cross section of the third nanowire 127 surrounded by the gate electrode 130.

The third nanowire 127 may be aligned with the first nanowire 120 and the second nanowire 125. The third nanowire 127 may overlap the first nanowire 120 and the second nanowire 125 in the third direction Z. The first to third nanowires 120 to 127 may have the same or different lengths.

The first inner spacer 142 may be between the upper surface of the fin-type pattern 110 and the first nanowire 120. The second inner spacer 142-1 may be between the first nanowire 120 and the second nanowire 125. The third inner spacer 142-2 may be between the second nanowire 125 and the third nanowire 127.

As illustrated in FIG. 19, the uppermost surface of the third nanowire 127 may be in contact with the first outer spacer 141, and the lowermost surface of the third nanowire 127 may be in contact with the third inner spacer 142-2, although this is not necessary. For example, in FIG. 7, the uppermost surface of the third nanowire 127 and the lowermost surface of the third nanowire 127 may be in contact with the inner spacers, respectively.

The gate insulating film 147 may be between the third nanowire 127 and the gate electrode 130. The gate insulating film 147 may be formed along the periphery of the third nanowire 127.

The source/drain 150 may be directly connected to the third nanowire 127, which includes the channel region. For example, the source/drain 150 may be directly connected to the first to third nanowires 120 to 127 that pass through the hole 140h1, 140h2, and 140h3 of the gate spacer 140.

The second nanowire 125 may have a similar shape to the first nanowire 120. For example, the second nanowire 125 may include a second center region and a second side region. The second center region may have an eighth thickness t8. The second side region may have a ninth thickness t9 greater than the eighth thickness t8.

In this embodiment, three nanowires are illustrated. In another embodiment, a different number (e.g., more than three) nanowires may be included. Moreover, FIGS. 1 to 21 illustrate a semiconductor device that uses Si for the first nanowire (e.g., channel region) and SiGe for the sacrificial material. In other embodiments, a semiconductor device may be provided which uses Group 3-5 materials, e.g., which uses InGaAs for the first nanowire (e.g., channel region) and InP for the sacrificial material.

Figure 22:
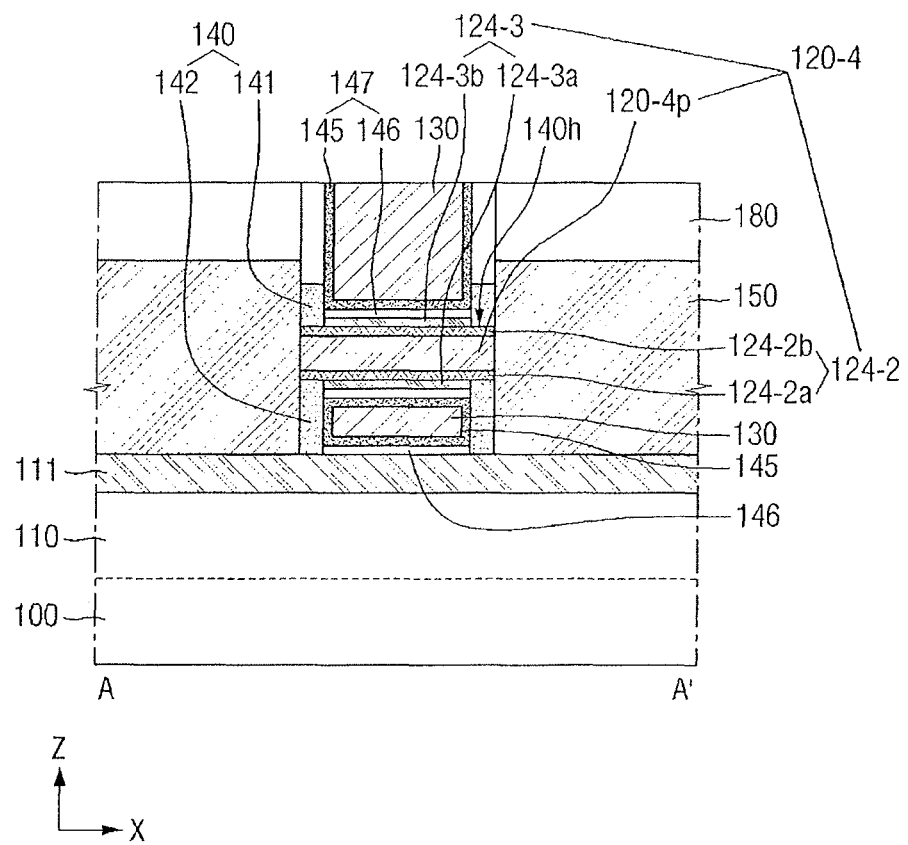
FIG. 22 illustrates another embodiment of a semiconductor device.
Figure 23:
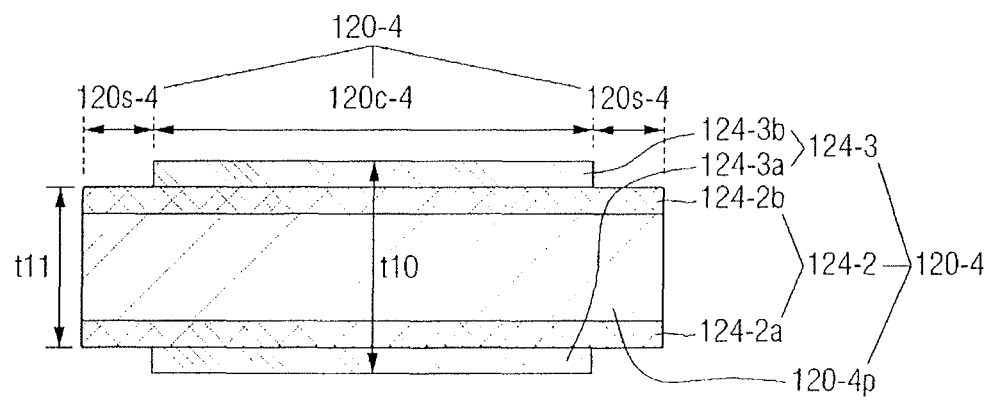
FIG. 23 illustrates an embodiment of a first nanowire in FIG. 22.

FIGS. 1, 22, and 23 illustrate another embodiment of a semiconductor device. In particular, FIG. 23 illustrates a cross sectional view, taken along line A-A' in FIG. 1, of an embodiment of a first nanowire in FIG. 22.

Referring to FIGS. 1, 22, and 23, the first nanowire 120-4 of the semiconductor device may include a channel film 120-4p, a diffusion film 124-2, and a thermal treatment diffusion film 124-3. The channel film 120-4p may include SiGe. The channel film 120-4p may directly contact the source/drain 150. The channel film 120-4p may be formed through the gate spacer 140 and the gate electrode 130.

The diffusion film 124-2 may be formed on the upper surface and the lower surface of the channel film 120-4p.

The diffusion film 124-2 may include an upper surface diffusion film 124-2b on the upper surface of the channel film 120-4p, and a lower surface diffusion film 124-2a on the lower surface of the channel film 120-4p. The upper surface diffusion film 124-2b may be on the upper surface of the channel film 120-4p. The lower surface diffusion film 124-2a may be on the lower surface of the channel film 120-4p. The diffusion film 124-2 may directly contact the source/drain 150. The thickness of a structure including both the channel film 120-4p and the diffusion film 124-2 may be eleventh thickness t11.

The thermal treatment diffusion film 124-3 may be formed by thermal treatment. The thermal treatment diffusion film 124-3 may include an upper surface thermal treatment diffusion film 124-3b on the upper surface of the upper surface diffusion film 124-2b, and a lower surface thermal treatment diffusion film 124-3a on the lower surface of the lower surface diffusion film 124-2a. The thermal treatment diffusion film 124-3 may not be in contact with the source/drain 150, but may be in contact with the first inner spacer 142 and the second inner spacer 142-1. The length of the thermal treatment diffusion film 124-3 may be shorter than the length of the channel film 120-4p and the diffusion film 124-2.

The first nanowire 120-4 may include a first center region 120c-4 and a first side region 120s-4. The first center region 120c-4 may have a tenth thickness t10. The first side region 120s-4 may have an eleventh thickness t11 greater than the tenth thickness t10.

The first side region 120s-4 may be formed on opposite sides of the first center region 120c-4. In this case, the first side region 120s-4 may be formed on opposite sides in the first direction X of the first center region 120c-4. The first side region 120s-4 and the first center region 120c-4 may be connected to each other, to thereby form a structure in which the first side region 120s-4 and the first center region 120c-4 are integrated.

The upper surfaces of the first center region 120c-4 and the first side region 120s-4 may be in different planes. For example, the upper surface of the first center region 120c-4 may be higher than the upper surface of the first side region 120s-4. The lower surfaces of the first center region 120c-4 and the first side region 120s-4 may be in different planes. For example, the lower surface of the first center region 120c-4 may be lower than the lower surface of the first side region 120s-4. This is attributable, for example, to the thickness of the thermal treatment diffusion film 124-3.

The first center region 120c-4 may overlap the gate electrode 130. For example, the first center region 120c-4 may be in contact with the gate insulating film 147 and surrounded by the gate electrode 130.

The first side region 120s-4 may be surrounded by the gate spacer 140. The upper surface of the first side region 120s-4 may be in contact with the first outer spacer 141. The lower surface of the first side region 120s-4 may be in contact with first inner spacer 142.

Figure 24:
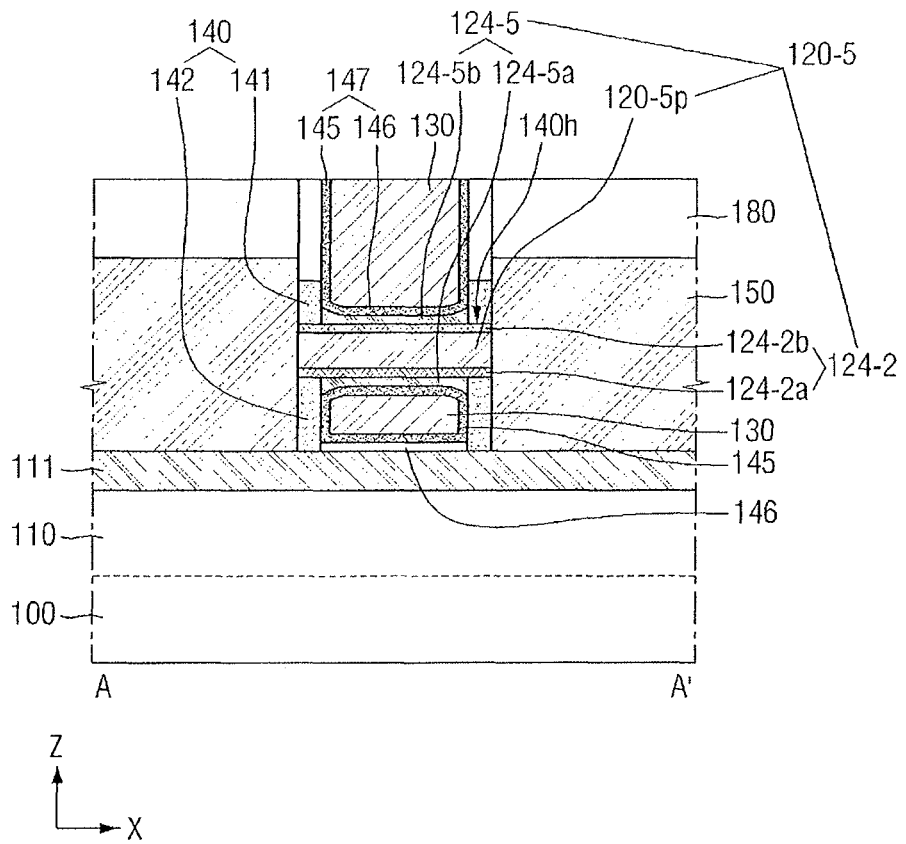
FIG. 24 illustrates another embodiment of a semiconductor device.
Figure 25:
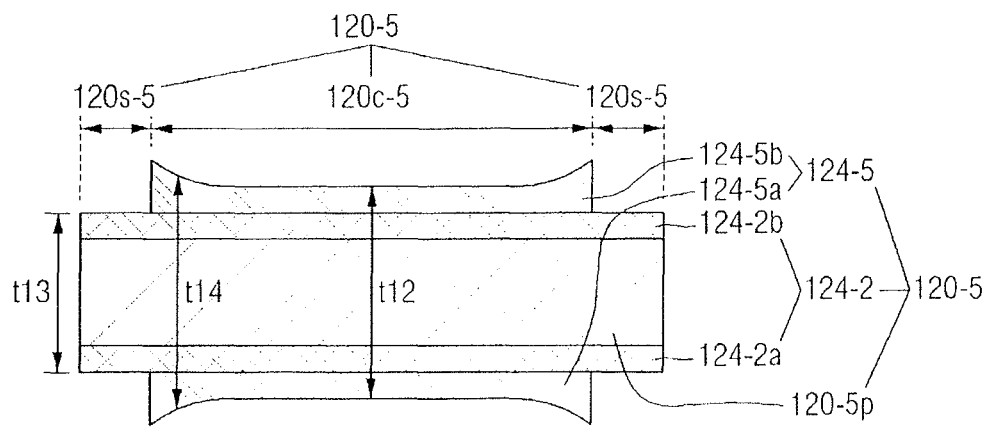
FIG. 25 illustrates an embodiment of a first nanowire in FIG. 24.

FIGS. 1, 24 and 25 illustrate another embodiment of a semiconductor device. In particular, FIG. 24 illustrates a cross sectional view of the semiconductor device taken along line A-A' in FIG. 1. FIG. 25 illustrates a cross sectional view of an embodiment of a first nanowire in FIG. 24.

Referring to FIGS. 1, 24, and 25, the semiconductor device includes a first nanowire 120-5 with a channel film 120-5p, a diffusion film 124-2, and a thermal treatment diffusion film 124-5. The channel film 120-5p may include, for example, SiGe. The channel film 120-5p may directly contact the source/drain 150 and may be formed through the gate spacer 140 and the gate electrode 130.

The diffusion film 124-2 may be formed on the upper surface and the lower surface of the channel film 120-5p. The diffusion film 124-2 may include an upper surface diffusion film 124-2b on the upper surface of the channel film 120-5p, and a lower surface diffusion film 124-2a on the lower surface of the channel film 120-5p. The upper surface diffusion film 124-2b may be formed on the upper surface of the channel film 120-5p. The lower surface diffusion film 124-2a may be formed on the lower surface of the channel film 120-5p. The diffusion film 124-2 may directly contact the source/drain 150.

The thickness of a structure including both the channel film 120-5p and the diffusion film 124-2 may be a thirteenth thickness t13. The diffusion film 124-2 may be a film formed as the channel film 120-5p diffuses Ge at the interface with the sacrificial film. At this time, the sacrificial film may include Si, in which case the diffusion film 124-2 may include SiGe as a result.

The thermal treatment diffusion film 124-5 may be formed by thermal treatment. The thermal treatment diffusion film 124-5 may include an upper surface thermal treatment diffusion film 124-5b on the upper surface of the upper surface diffusion film 124-2b, and a lower surface thermal treatment diffusion film 124-5a on the lower surface of the lower surface diffusion film 124-2a. The thermal treatment diffusion film 124-5 may not be in contact with the source/drain 150, but may be in contact with the first inner spacer 142 and the second inner spacer 142-1.

The length of the thermal treatment diffusion film 124-5 may be shorter than the length of the channel film 120-4p and the diffusion film 124-2. The thermal treatment diffusion film 124-2 may be a film formed as the channel film 120-5p and the diffusion film 124-2 diffuse Ge at the interface with the sacrificial film by thermal treatment. The thermal treatment diffusion film 124-2 may include, for example, SiGe.

The thermal treatment diffusion film 124-5 may have a width that decreases as a distance from the gate spacer 140 increases. For example, the thickness of the thermal treatment diffusion film 124-5 may be formed to be thicker at a portion contacting the gate spacer 140. As illustrated, the thermal treatment diffusion film 124-5 may become thicker at an area close to the portion contacting the gate spacer 140. In this case, the width of the region may decrease as the distance from the gate spacer 140 increases. This is possible, for example, when a portion of the sacrificial film is incompletely etched in the etch process, or when an increased amount of diffusion occurs along the sidewall during diffusion process.

The first nanowire 120-5 may include a first center region 120c-5 and a first side region 120c-5. The first center region 120c-5 may have a twelfth thickness t12. The first side region 120c-5 may have a thirteenth thickness t13 greater than the twelfth thickness t12. In the first center region 120c, a portion contacting the gate spacer 140 may have a fourteenth thickness t14. The fourteenth thickness t14 may be greater than the twelfth thickness t12 and less than the thirteenth thickness t13.

The first side region 120c-5 may be formed on opposite sides of the first center region 120c-5. In this case, the first side region 120c-5 may be formed on opposite sides in the first direction X of the first center region 120c-5.

The upper surfaces of the first center region 120c-5 and the first side region 120c-5 may be in different planes. For example, the upper surface of the first center region 120c-5 may be higher than the upper surface of the first side region 120c-5. The lower surfaces of the first center region 120c-5 and the first side region 120c-5 may be in different planes. For example, the lower surface of the first center region 120c-5 may be lower than the lower surface of the first side region 120c-5. This is attributable, for example, to the thickness of the thermal treatment diffusion film 123-5.

Figure 26:
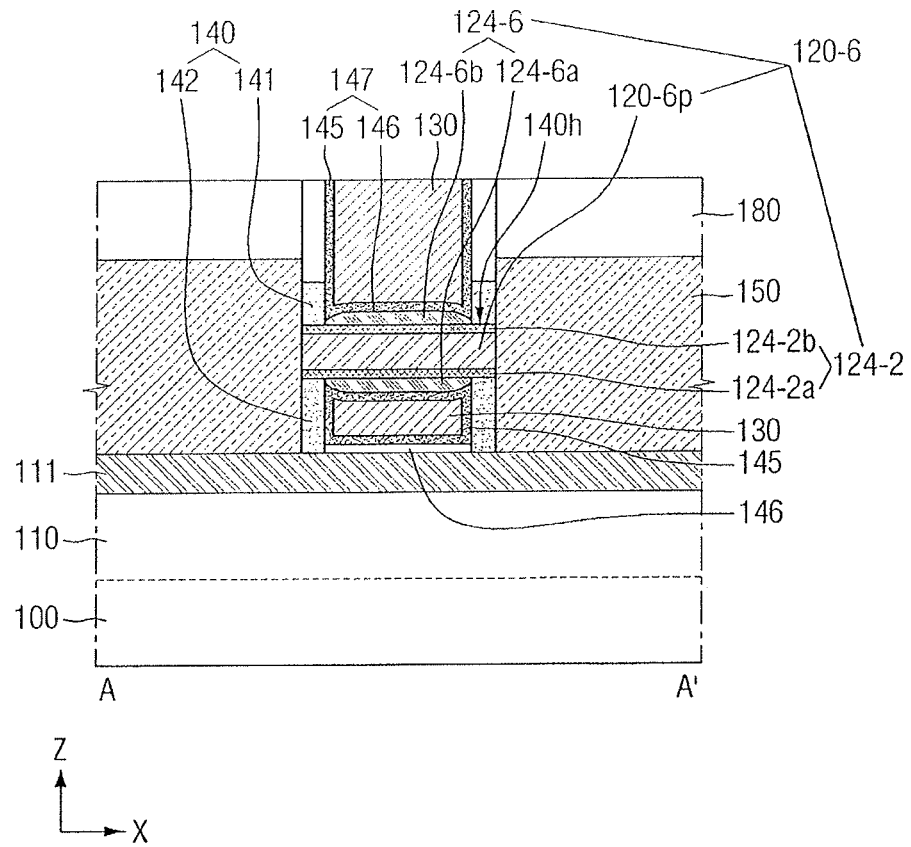
FIG. 26 illustrates another embodiment of a semiconductor device.
Figure 27:
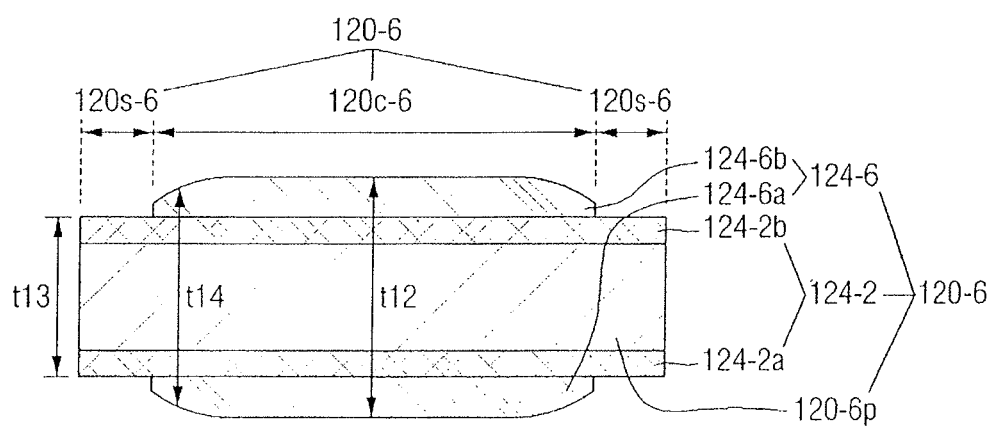
FIG. 27 illustrates an embodiment of a first nanowire in FIG. 26.

FIGS. 1, 26, and 27 illustrate another embodiment of a semiconductor device. In particular, FIG. 26 illustrates a cross sectional view of the semiconductor device taken along line A-A' of FIG. 1. FIG. 27 illustrates a cross sectional view of an embodiment of a first nanowire in FIG. 26.

Referring to FIGS. 1, 26, and 27, the semiconductor device includes a first nanowire 120-6 having a channel film 120-6p, a diffusion film 124-2, and a thermal treatment diffusion film 124-6. The channel film 120-6p may include, for example, SiGe and may directly contact the source/drain 150. The channel film 120-6p may be formed through the gate spacer 140 and the gate electrode 130.

The diffusion film 124-2 may be formed on the upper surface and the lower surface of the channel film 120-6p. The diffusion film 124-2 may include an upper surface diffusion film 124-2b on the upper surface of the channel film 120-6p, and a lower surface diffusion film 124-2a on the lower surface of the channel film 120-5p. The upper surface diffusion film 124-2b may be formed on the upper surface of the channel film 120-6p. The lower surface diffusion film 124-2a may be formed on the lower surface of the channel film 120-6p. The diffusion film 124-2 may directly contact the source/drain 150.

The thickness of a structure including the channel film 120-6p and the diffusion film 124-2 may be a thirteenth thickness t13. The diffusion film 124-2 may be a film formed, for example, as the channel film 120-5p diffuses Ge at the interface with the sacrificial film. At this time, the sacrificial film may include, for example, Si, in which case the diffusion film 124-2 may include SiGe as a result.

The thermal treatment diffusion film 124-6 may be formed, for example, by thermal treatment. The thermal treatment diffusion film 124-6 may include an upper surface thermal treatment diffusion film 124-6b on the upper surface of the upper surface diffusion film 124-2b, and a lower surface thermal treatment diffusion film 124-6a on the lower surface of the lower surface diffusion film 124-2a. The thermal treatment diffusion film 124-6 may not be in contact with the source/drain 150, but may contact the first inner spacer 142 and the second inner spacer 142-1.

The length of the thermal treatment diffusion film 124-6 may be shorter than the lengths of the channel film 120-4p and the diffusion film 124-2. The thermal treatment diffusion film 124-2 may be a film formed as the channel film 120-5p and the diffusion film 124-2 diffuse Ge at the interface with the sacrificial film by thermal treatment. Thus, the thermal treatment diffusion film 124-2 may include SiGe.

The width of the thermal treatment diffusion film 124-6 may increase as the distance from the gate spacer 140 increases. For example, the thickness of the thermal treatment diffusion film 124-6 may be thinner at a portion contacting the gate spacer 140. The thermal treatment diffusion film 124-6 may be formed with a region that becomes thinner at an area close to the portion contacting the gate spacer 140. In this case, the width of the region may increase as the distance from the gate spacer 140 increases. This is possible, for example, when a portion of the sacrificial film is incompletely etched in the etch process or when substantial diffusion occurs along the sidewall during diffusion process.

The first nanowire 120-6 may include a first center region 120c-6 and a first side region 120s-6. The first center region 120c-6 may have a twelfth thickness t12. The first side region 120s-6 may have a thirteenth thickness t13 greater than the twelfth thickness t12. A portion contacting the gate spacer 140 may have a fourteenth thickness t14 in the first center region 120c. The fourteenth thickness t14 may be less than the twelfth thickness t12 and greater than the thirteenth thickness t13.

The first side region 120s-6 may be formed on opposite sides of the first center region 120c-6. In this case, the first side region 120s-6 may be formed on opposite sides in the first direction X of the first center region 120c-6. The upper surfaces of the first center region 120c-6 and the first side region 120s-6 may be in different planes. For example, the upper surface of the first center region 120c-6 may be higher than the upper surface of the first side region 120s-6. The lower surfaces of the first center region 120c-6 and the first side region 120s-6 may be in different planes. For example, the lower surface of the first center region 120c-6 may be lower than the lower surface of the first side region 120s-6. This is attributable, for example, to the thickness of thermal treatment diffusion film 124-6.

Figure 28:
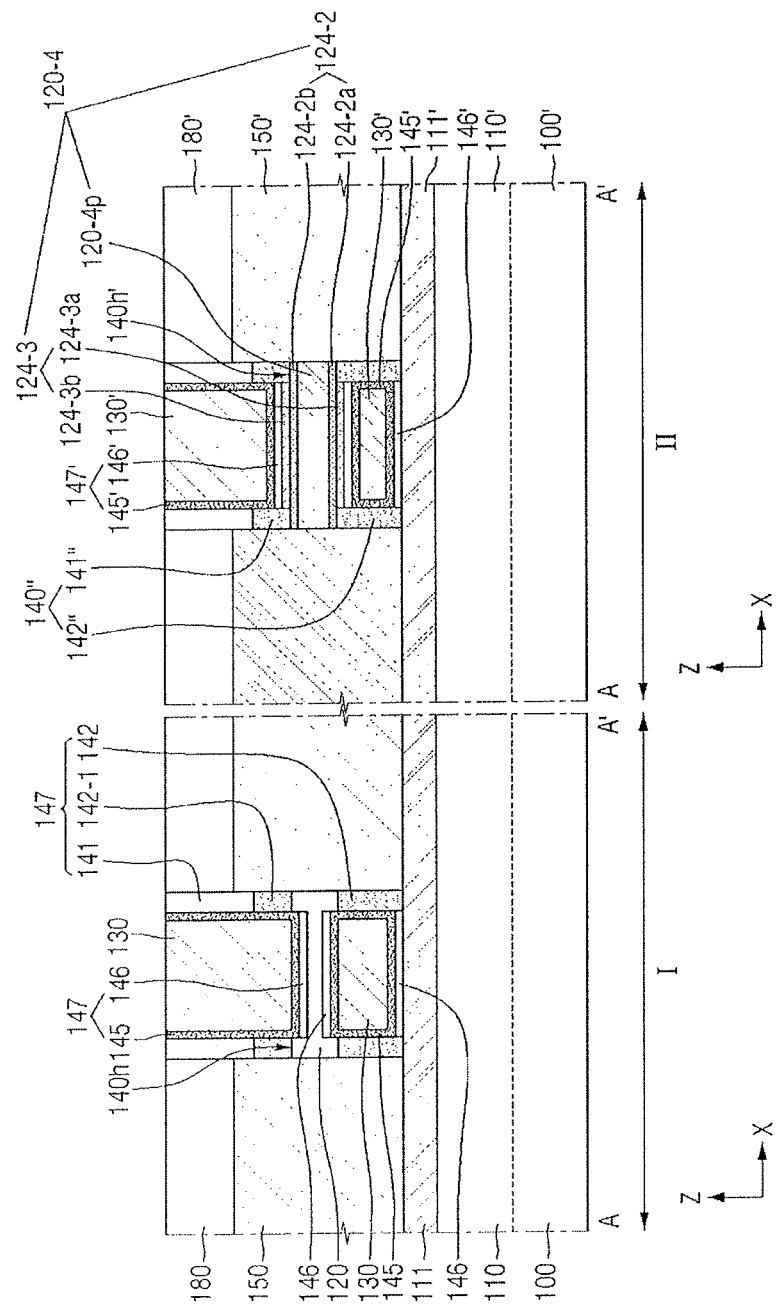
FIG. 28 illustrates another embodiment of a semiconductor device.

FIGS. 1 and 28 illustrates another embodiment of a semiconductor device. In FIG. 28, a cross sectional view of two regions I and II of substrate 100 is illustrated taken along line A-A' of FIG. 1.

Referring to FIGS. 1 and 28, the semiconductor device according to some exemplary embodiments, the substrate 100 may include a first region I and a second region II. First region I includes a device that is substantially the same as the semiconductor device of FIG. 7. Second region II includes a device that is substantially the same as the semiconductor device of FIG. 22. In another embodiment, the first and/or second regions may include difference devices.

The gate spacer 140, the gate electrode 130, the gate insulating film 147, the through hole 140h, the source/drain 150, the fin-type pattern 110, the passivation film 111, and the interlayer insulating film 180 of FIG. 22 may be substantially same as the gate spacer 140' the gate electrode 130', the gate insulating film 147', the through hole 140h', the source/drain 150', the fin-type pattern 110', the passivation film 111', and the interlayer insulating film 180' of FIG. 28, respectively.

The first region I may be an NMOS region and the second region II may be a PMOS region. The first NMOS region I may have a Si channel. The second PMOS region II may have a SiGe channel. As a result, the semiconductor device may have enhanced carrier mobility and operating characteristic in the PMOS region.

Figure 44:
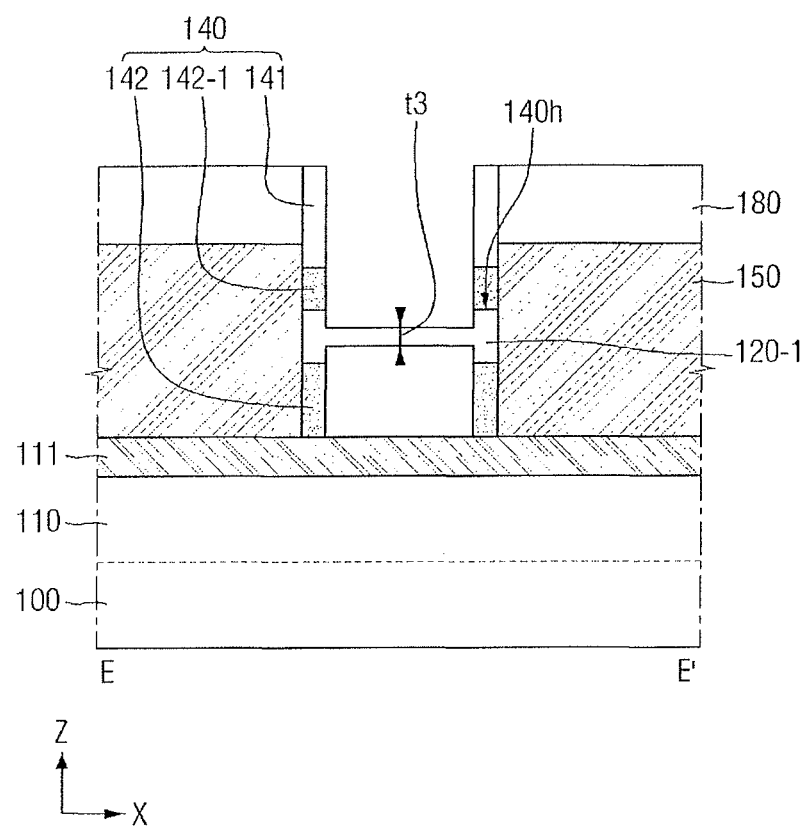
Figure 45:
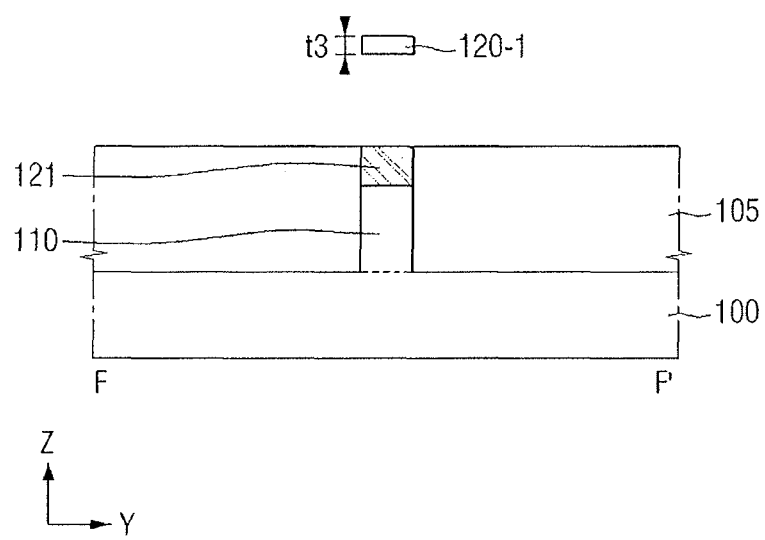

FIGS. 29 to 45 illustrate various stages of fabrication of an embodiment of a method for fabricating a semiconductor device, which, for example, may correspond to the device in FIGS. 1 and 7 to 10. In particular, FIGS. 37 and 38 are cross sectional views taken along line D-D in FIG. 36. FIGS. 42 and 44 are cross sectional views taken along line E-E' in FIG. 41. FIGS. 43 and 45 are cross sectional views taken along line F-F' of FIG. 41.

Figure 29:
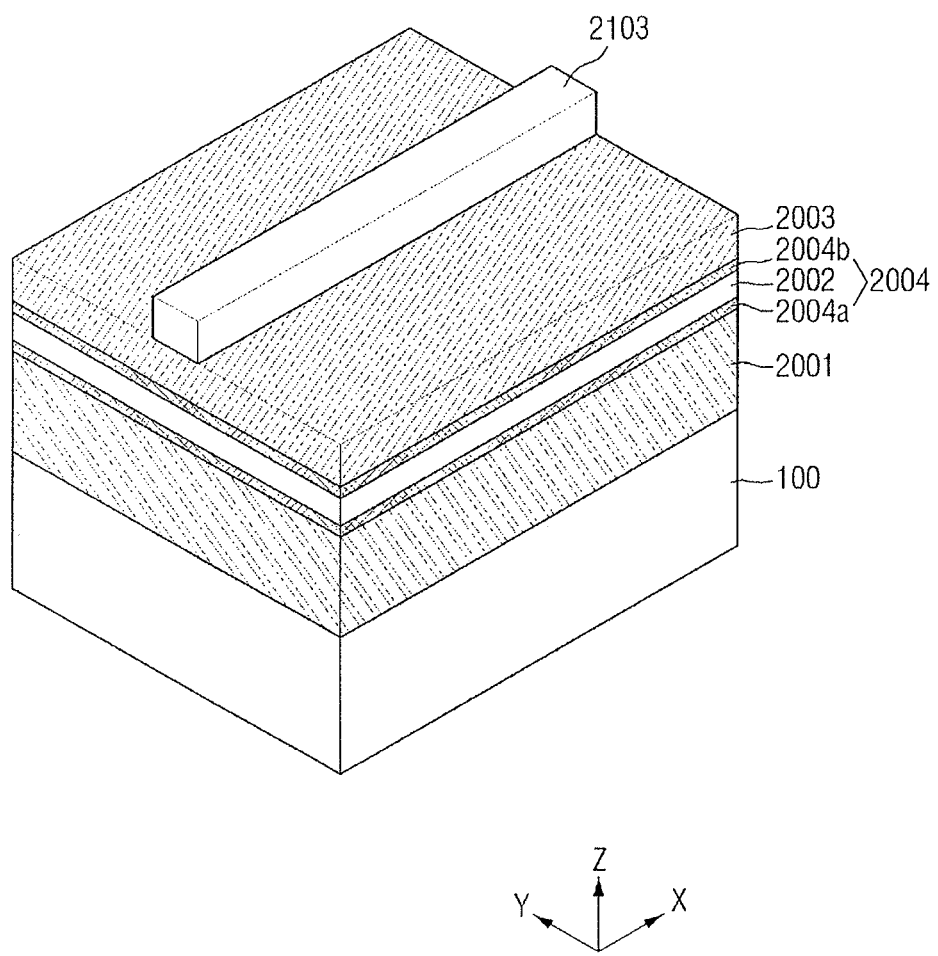
FIGS. 29 to 45 illustrate various stages of fabrication in one embodiment of a method for fabricating a semiconductor device.

Referring to FIG. 29, a first sacrificial film 2001, a lower surface pre-diffusion film 2004a, an active film 2002, an upper surface pre-diffusion film 2004b, and a second sacrificial film 2003 may be formed sequentially on the substrate 100.

The first sacrificial film 2001 and the second sacrificial film 2003 may include the same or different material. In explaining this embodiment, it is assumed that the first sacrificial film 2001 and the second sacrificial film 2003 include the same material. The first sacrificial film 2001 and the active film 2002 may include different materials. The active film 2002 may include a material with an etch selectivity with respect to the first sacrificial film 2001.

For example, the substrate 100 and the active film 2002 may include a material to be used as a channel region for the transistor. In the case of PMOS, the active film 2002 may include, for example, a material of high hole mobility. In the case of NMOS, the active film 2002 may include, for example, a material with high electron mobility.

The first sacrificial film 2001 and the second sacrificial film 2003 may include a material having a similar lattice constant and lattice structure as the active film 2002. The first sacrificial film 2001 and the second sacrificial film 2003 may include a semiconductor material or a crystallized metal material.

Also, in the present non-limiting illustrative embodiment, it is assumed that the active film 2002 includes silicon and each of the first sacrificial film 2001 and the second sacrificial film 2003 includes silicon germanium. The concentration of germanium in the first sacrificial film 2001 may be different from (e.g., less than) the concentration of germanium in the second sacrificial film 2003. As a result, it is possible to form the passivation film ('111' in FIG. 44) by decreasing the etch rate of the first sacrificial film 2001 to below that of the second sacrificial film 2003.

FIG. 29 illustrates only one active film 2002. In another embodiment, a plurality of pairs of first sacrificial film 2001 and active film 2002 may be alternately formed, with the second sacrificial film 2003 formed on uppermost active film 2002. Further, FIG. 29 illustrates the second sacrificial film 2003 on the uppermost portion of the stack film structure. In another embodiment, the active film 2002 may be on the uppermost portion of the stack film structure.

The pre-diffusion film 2004 includes an upper surface pre-diffusion film 2004b and a lower surface pre-diffusion film 2004a. The pre-diffusion film 2004 may be natively formed at an interface between the first and second sacrificial films 2001 and 2003 and the active film 2002. For example, the pre-diffusion film 2004 with Ge in the first and second sacrificial films 2001, 2003 may be diffused to the active film 2002.

Next, a first mask pattern 2103 is formed on the second sacrificial film 2003. The first mask pattern 2103 may be elongated in a first direction X. For example, the first mask pattern 2103 may have a material including at least one of silicon oxide film, silicon nitride film, or silicon oxynitride film.

Figure 30:
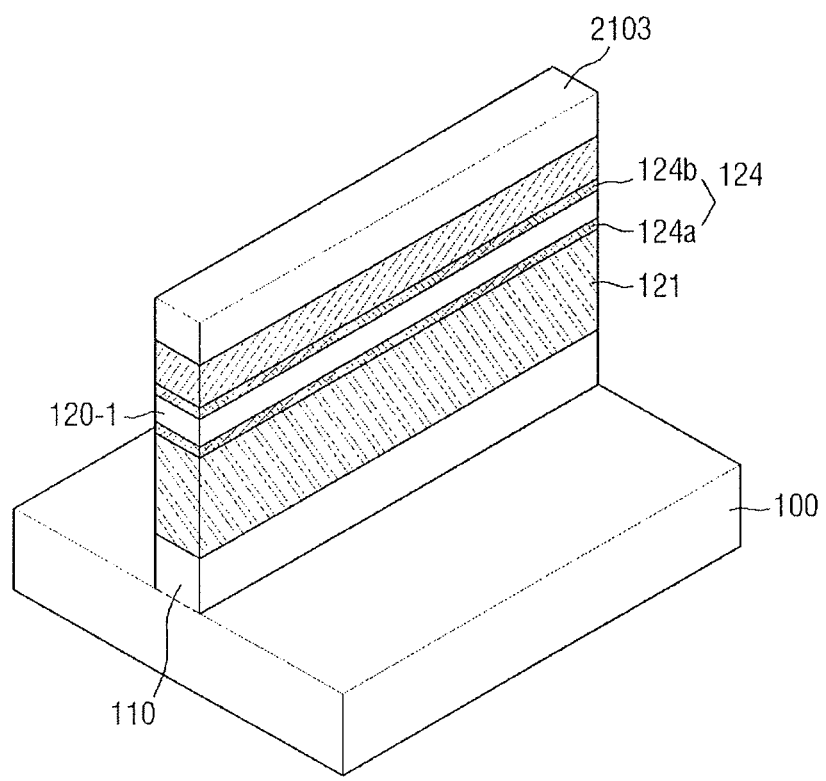
Figure 31:
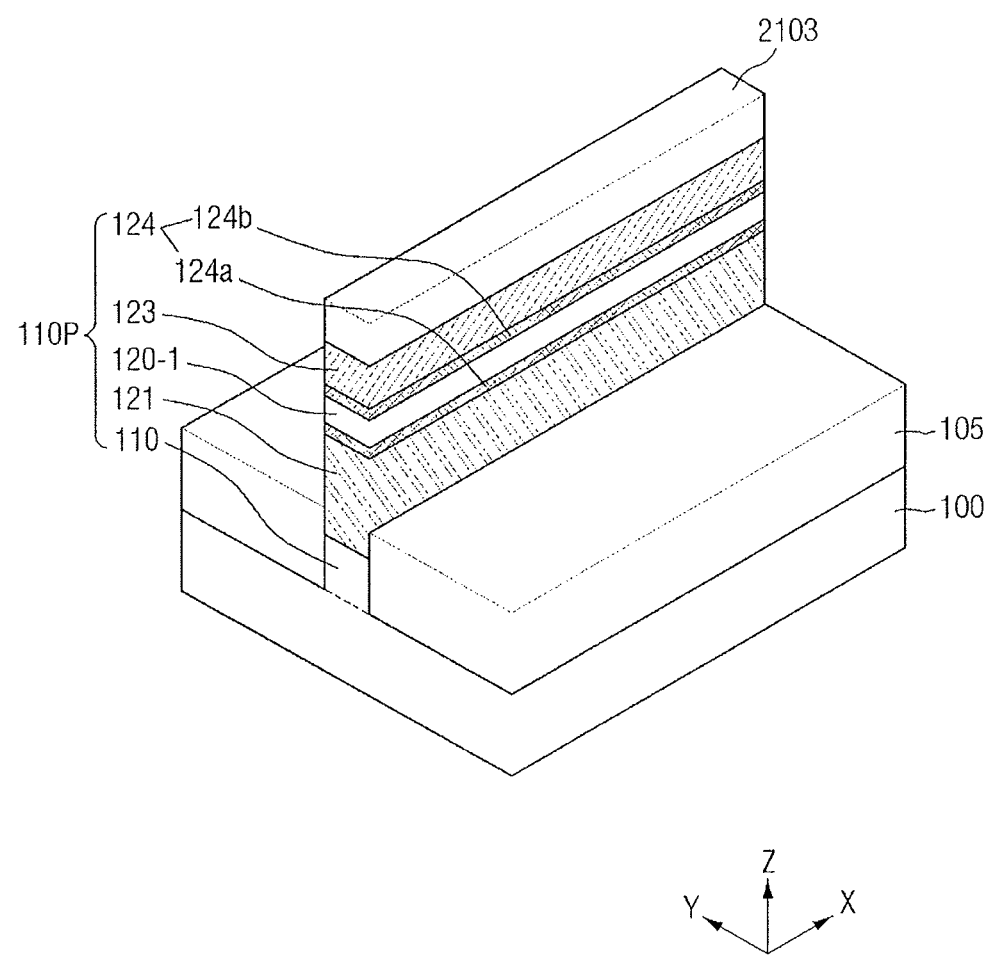

Referring to FIG. 30, an etch process is conducted with the first mask pattern 2103 as a mask, to thereby form a fin-type structure ("110P" in FIG. 31). The fin-type structure ("110P" in FIG. 31) may be formed, for example, by patterning a portion of the second sacrificial film 2003, the active film 2002, the first sacrificial film 2001, the pre-diffusion film 2004, and the substrate 100.

The fin-type structure ("110P" in FIG. 31) may be formed on the substrate 100 and may protrude from the substrate 100. Like the first mask pattern 2103, the fin-type structure ("110P" in FIG. 31) may extend in the first direction X.

In the fin-type structure ("110P" in FIG. 31), a fin-type pattern 110, a first sacrificial pattern 121, a lower surface diffusion film 124, a first nanowire 120-1, an upper surface diffusion film 124-2b, and a second sacrificial pattern 123 are stacked sequentially on the substrate 100. The diffusion film 124 may include an upper surface diffusion film 124-2b and a lower surface diffusion film 124-2a.

Referring to FIG. 31, a field insulating film 105 covering at least a portion of the sidewall of the fin-type structure 110P may be formed on the substrate 100. For example, the field insulating film 105 covering the fin-type structure 110P is formed on the substrate 100. With the planarization process of the field insulating film 105, the upper surface of the fin-type structure 110P and the upper surface of the field insulating film 105 may be in the same plane.

The first mask pattern 2103 may be removed, for example, in the process of the planarization or in another process.

The upper portion of the field insulating film 105 is then recessed to expose a portion of the fin-type structure 110P. The recessing process may include, for example, etching process. For example, the fin-type structure 110P may be formed protruding on the field insulating film 105.

As illustrated in FIG. 31, an entirety of the fin-type pattern 110, the first sacrificial pattern 121, the lower surface diffusion film 124-2a, the first nanowire 120-1, and the upper surface diffusion film 124-2b, and a portion of the second sacrificial pattern 123 may protrude above the upper surface of the field insulating film 105. The sidewall of the fin-type pattern 110 may be entirely or partially surrounded by the field insulating film 105. For example, a portion of the sidewall of the fin-type pattern 110 may protrude above the upper surface of the field insulating film 105 through the upper portion recessing process of the field insulating film 105.

Doping for the purpose of threshold voltage adjustment may be performed on the first nanowire 120-1 before and/or after the recessing process that causes a portion of the fin-type structure 110P to protrude above the upper surface of the field insulating film 105. When the semiconductor device is an NMOS transistor, the impurity used may be, for example, boron (B). When the semiconductor device is a PMOS transistor, the impurity used may be, for example, phosphorus (P) or arsenic (As).

Figure 32:
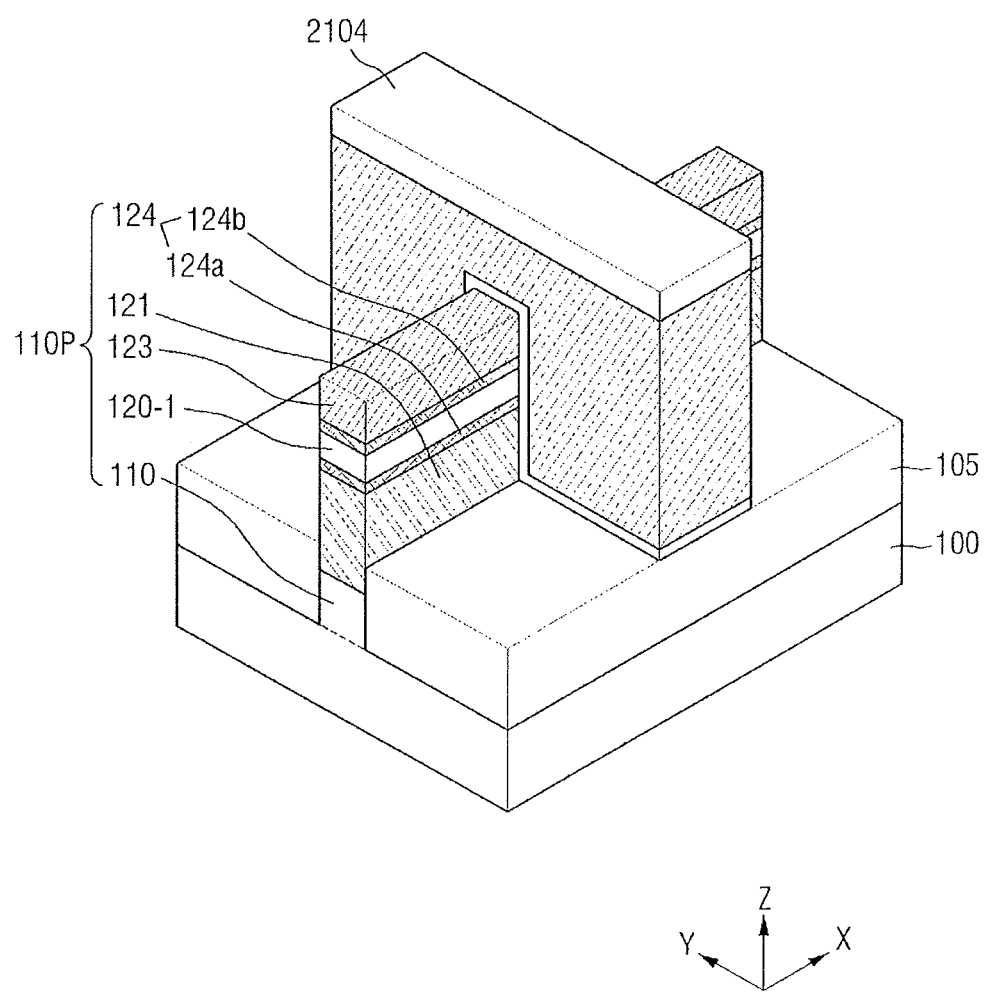

Referring to FIG. 32, a dummy gate pattern 135, that intersects the fin-type structure 110P and extends in the second direction Y, may be formed by performing the etch process with the second mask pattern 2104. The dummy gate pattern 135 may be formed on the fin-type structure 110P. The dummy gate pattern 135 may include a dummy gate insulating film 136 and a dummy gate electrode 137. For example, the dummy gate insulating film 136 may include a silicon oxide film and the dummy gate electrode 137 may include polysilicon or amorphous silicon.

Figure 33:
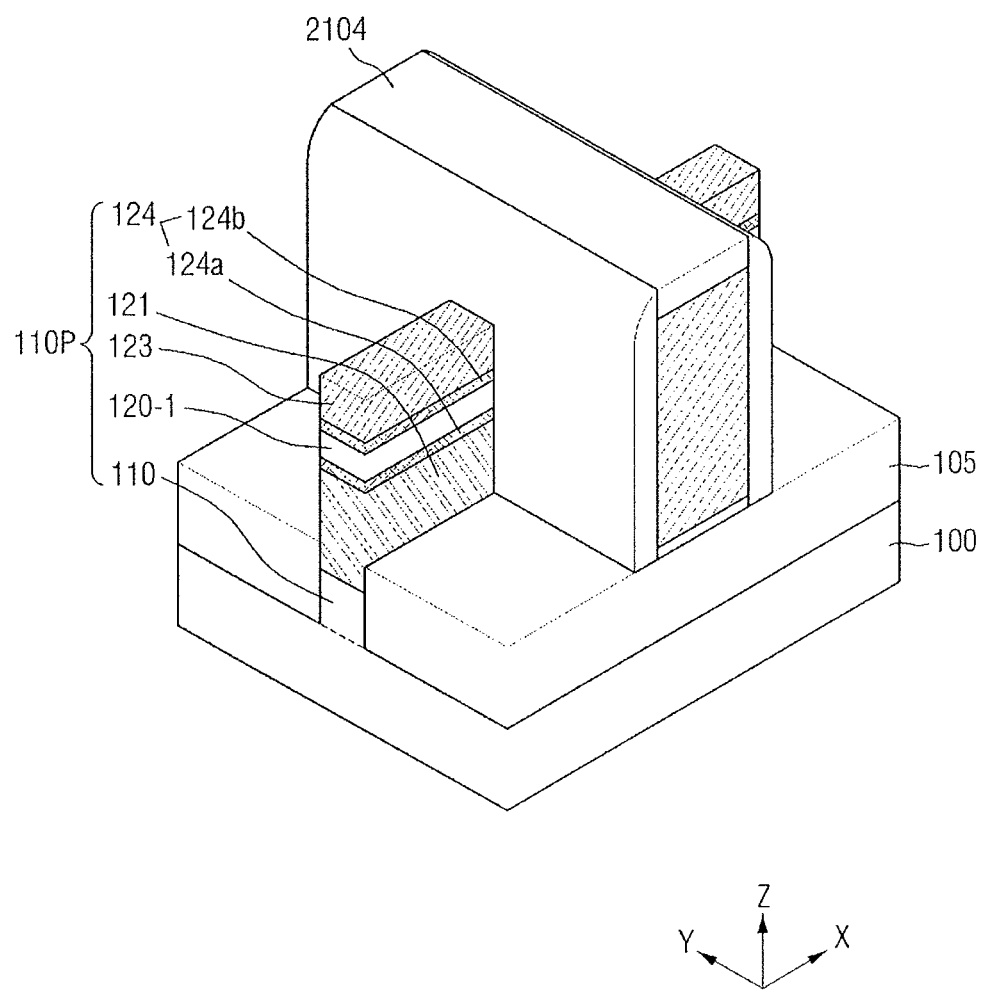

Referring to FIG. 33, the first outer spacer 141 may be formed on the sidewall of the dummy gate pattern 135. For example, the first outer spacer 141 may be formed on the sidewalls of the dummy gate insulating film 136 and the dummy gate electrode 137. For example, a first spacer film covering the dummy gate pattern 135 and the fin-type structure 110P may be formed on the field insulating film 105. The first spacer film may then be etched-back, to leave the first outer spacer 141 on the sidewall of the dummy gate pattern 135.

Figure 34:
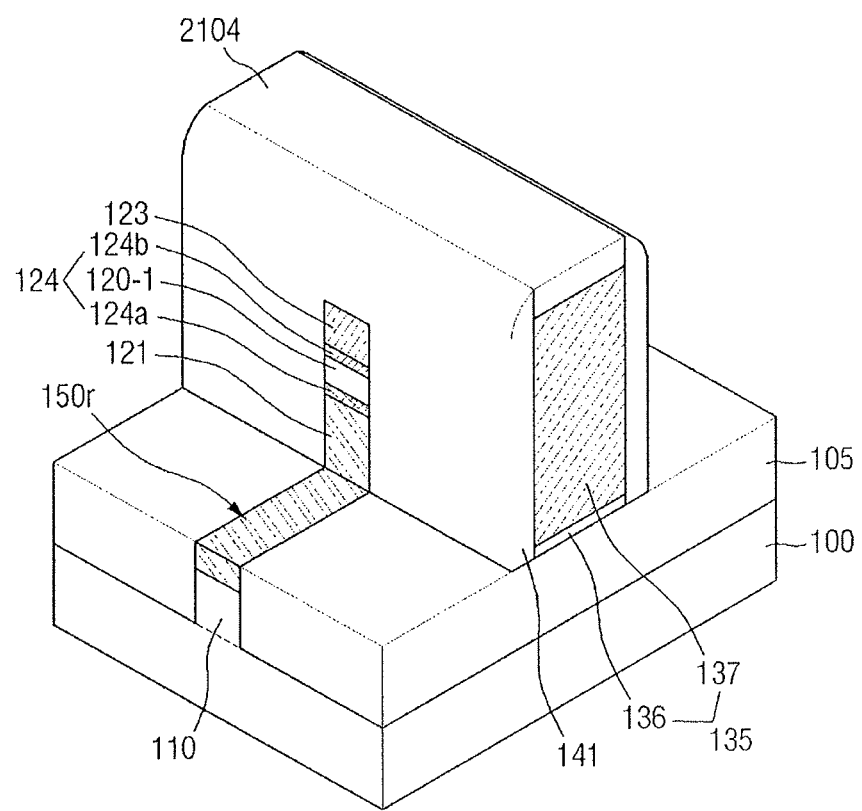

Referring to FIG. 34, the fin-type structure 110P, which does not overlap the dummy gate electrode 137 and the outer spacer 141, is removed using the dummy gate pattern 135 including the dummy gate electrode 137 as a mask. By doing so, a recess 150r may be formed within the fin-type structure 110P. A bottom surface of the recess 150r may be the first sacrificial pattern 121. For example, the first sacrificial pattern 121 positioned on the field insulating film 105 may be removed, while the first sacrificial pattern 121, which protrudes to a lesser extent than the field insulating film 105, may remain.

Forming the first outer spacer 141 and forming the recess 150r may be concurrently performed, but this is not necessary. For example, the recess 150r may be formed after the outer spacer 141 is formed by removing a portion of the fin-type structure 110P.

While the recess 150r is being formed in the fin-type structure 110P, a portion of the first sacrificial pattern 121, the diffusion film 124, and the second sacrificial pattern 123, which does not overlap the dummy gate electrode 137 and the first outer spacer 141, may be removed. Further, while the recess 150r is being formed in the fin-type structure 110P, the first nanowire 120-1 may be formed with the removal of the first nanowire 120-1 that does not overlap the dummy gate electrode 137 and the first outer spacer 141.

The cross section of the first sacrificial pattern 121, the cross section of the second sacrificial pattern 123, the cross section of the diffusion film 124, and the cross section of the first nanowire 120-1 may be exposed by the recess 150r.

Figure 35:
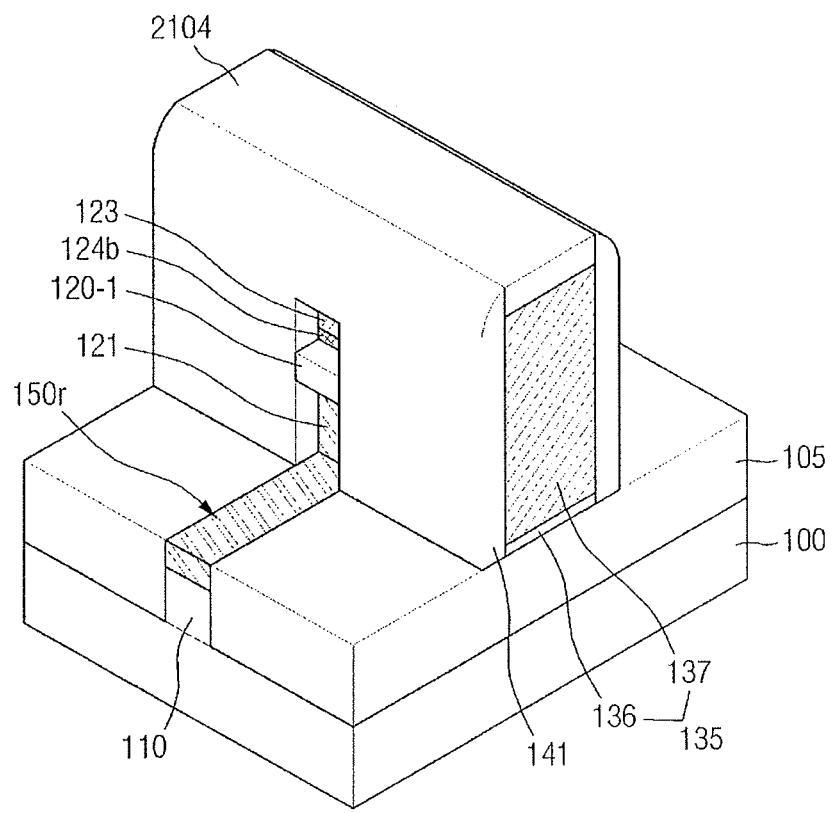

Referring to FIG. 35, at least a portion of the first sacrificial pattern 121 and at least a portion of the second sacrificial pattern 123, which are exposed by the recess 150r and overlap the first outer spacer 141, may be removed. As a result, a dimple may be formed between the first outer spacers 141. The dimple may also be formed between the first outer spacer 141 and the first nanowire 120-1, e.g., in a portion horizontally overlapping the second sacrificial pattern 123.

The dimple may have a shape in the first direction X that is depressed to a greater extent than the cross section of the first nanowire 120-1 exposed by the recess 150r. The dimple may be formed, for example, with selective etch process. In one embodiment, the dimple may be formed by an etch process that uses an etchant with a higher etch rate for the first sacrificial pattern 121 and the second sacrificial pattern 123, compared to the etch rate for the first nanowire 120.

The etch rate for the first sacrificial pattern 121 is lower than the etch rate for the second sacrificial pattern 123, such that an underneath dimple may have a smaller volume than a dimple thereabove. Further, by the etch process described above, a portion of the first sacrificial pattern 121 that does not overlap the dummy gate pattern 135 and the first outer spacer 141 (e.g., a portion that forms the same plane as the field insulating film 105) may be partially etched.

The diffusion film 124 having a relatively lower Ge concentration than the first sacrificial pattern 121 and the second sacrificial pattern 123 may have relatively retarded progress of the etch process. Thus, the dimple may be formed in a curved shape in which the diffusion film 124 area is less progressed. As a result, the gate spacer 140' of FIG. 15 may be formed.

Figure 36:
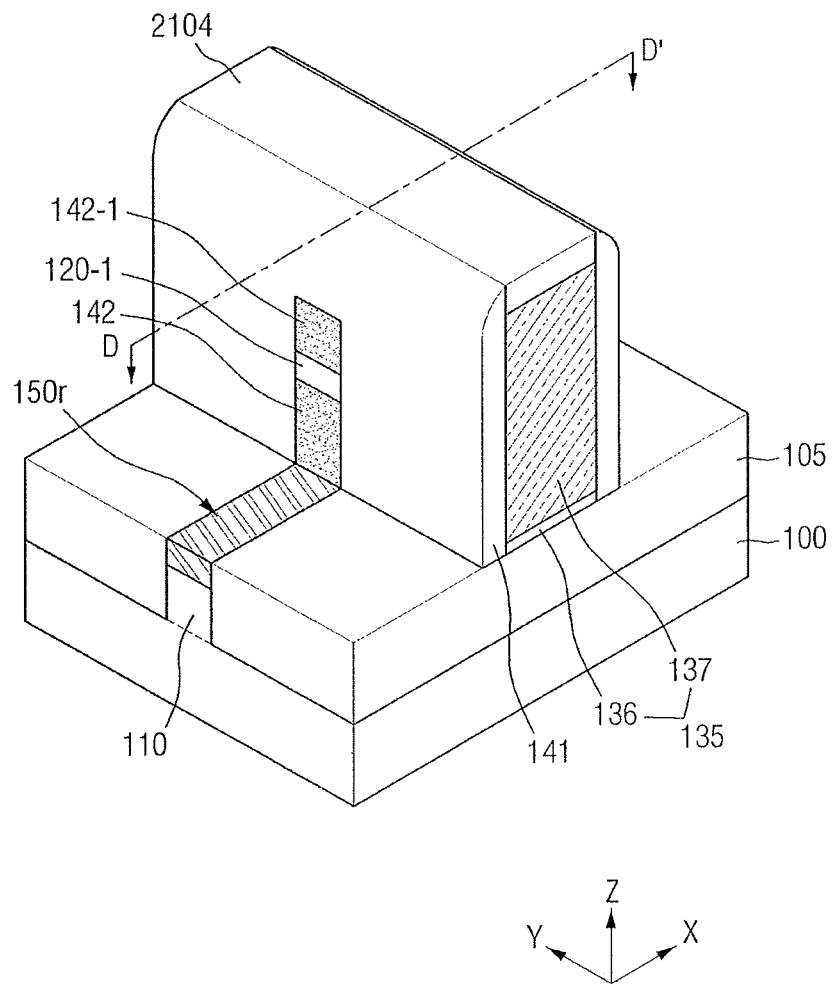
Figure 37:
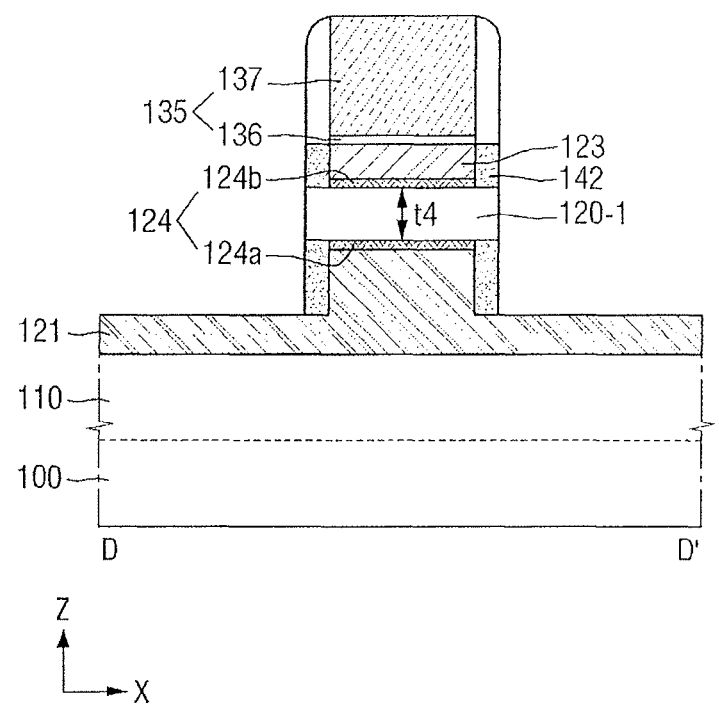
Figure 38:
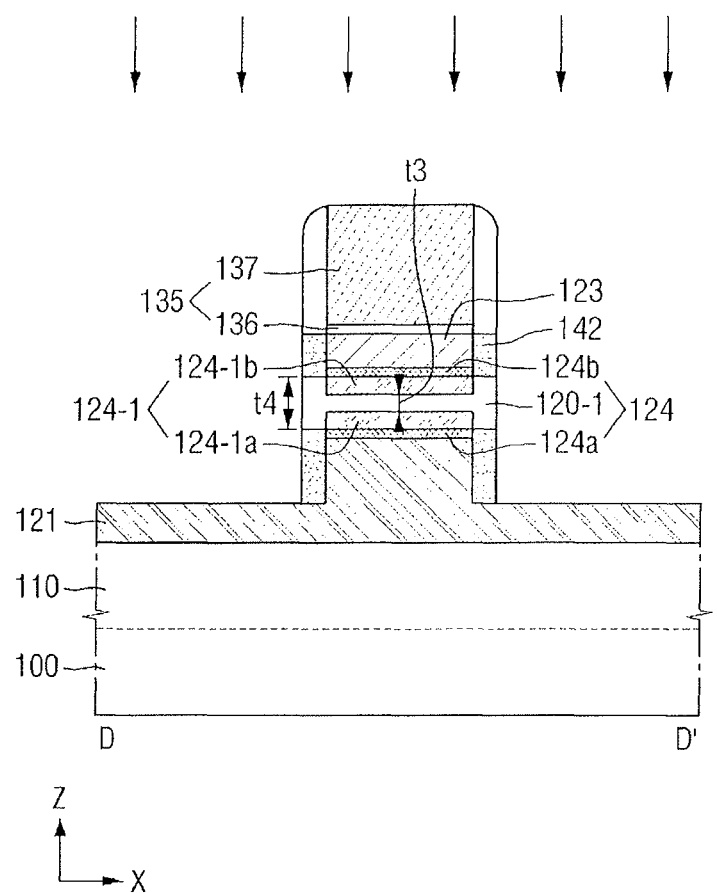

Referring to FIGS. 36 and 37, the dimple may be filled with an insulating material in order to form the first inner spacer 142 and the second inner spacer 142-1. For example, a second spacer film for filling the dimple may be formed. The second spacer film may be, for example, a material with a good gap-filling ability. The second spacer film may also be formed on the field insulating film 105, the sidewall of the first outer spacer 141, and on the dummy gate pattern 135.

An etch process may then be performed by etching the second spacer film until the upper surface of the fin-type pattern 110, which does not overlap the dummy gate pattern 135 and the outer spacer 141, is exposed. As a result, the first inner spacer 142 and the second inner spacer 142-1, and thus the gate spacer 140, may be formed.

Further, a through hole, defined by the first outer spacer 141, the first inner spacer 142 and the second inner spacer 142-1, may be formed in the gate spacer 140. The first nanowire 120-1 may be exposed through the through hole, e.g., the first nanowire 120-1 may pass through the through hole. In this case, the thickness of the first nanowire 120-1 may be, for example, the fourth thickness t4 previously discussed.

Referring to FIG. 38, a thermal treatment diffusion film 124-1 may be formed by thermal treatment. The thermal treatment diffusion film 124-1 may be formed, for example, as Ge is diffused into the first nanowire 120-1. Thus, the film 124-1 may be formed as Ge in the first sacrificial pattern 121, the second sacrificial pattern 123, and the diffusion film 124 is diffused to the first nanowire 120-1.

According to the formation of the thermal treatment diffusion film 124-1, the thickness of the first nanowire 120-1 at the center portion is decreased to the third thickness t3, and the fourth thickness t4 may be maintained at a region overlapping the gate spacer 140.

The shape of the first nanowire 120-1 may be determined later according to the shape into which the thermal treatment diffusion film 124-1 is formed by the thermal treatment. For example, the shape of the first nanowire 120-1 after removal of the thermal treatment diffusion film 124-1 may become the final shape of the first nanowire 120-1. Accordingly, the shape of the thermal treatment diffusion film 124-1 may determine not only the shape of the first nanowire 120-1 of FIG. 8, but also the shape of the first nanowire 120-2 of FIG. 12 and the first nanowire 120-3 of FIG. 13.

Figure 39:
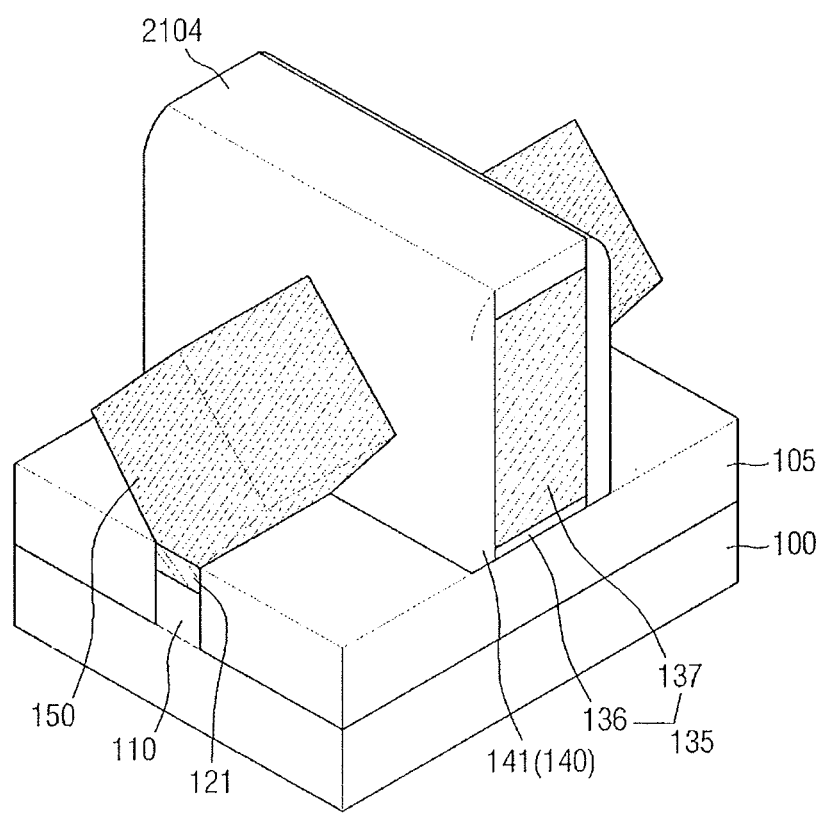

Referring to FIG. 39, a source/drain 150 for filling the recess 150r may be formed. The source/drain 150 may be formed on opposite sides of the dummy gate pattern 135. The source/drain 150 may be formed, for example, with the exposed first nanowire 120-1 as the seed layer. It is possible that the seed film is additionally formed on the protruding cross section of the first nanowire 120-1 and the fin-type pattern 110, that are exposed by the recess 150r.

The source/drain 150 may be formed so as to cover the first inner spacer 142. The source/drain 150 may contact the first inner spacer 142. The source/drain 150 may be formed, for example, by epitaxial process. The materials for the epitaxial layer in the source/drain 150 may vary, for example, depending on whether the semiconductor device is an n-type transistor or p-type transistor. Further, the impurity may be doped in situ during epitaxial process.

Figure 40:
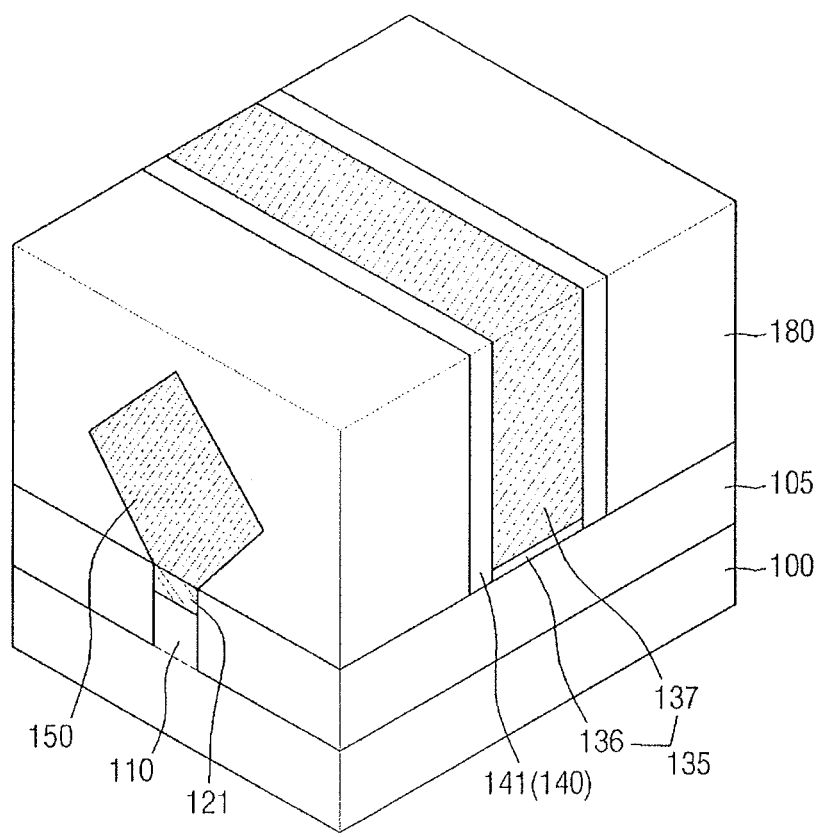

Referring to FIG. 40, the interlayer insulating film 180 covering the source/drain 150, the gate spacer 140, the dummy gate pattern 135, and so on, may be formed on the field insulating film 105. The interlayer insulating film 180 may include, for example, at least one of low-k material, oxide film, nitride film, or oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), high density plasma (HDP) oxide, plasma enhanced oxide (PEOX), flowable CVD (FCVD) oxide, or a combination thereof.

The interlayer insulating film 180 is then planarized until the upper surface of the dummy gate electrode 137 is exposed. As a result, the second mask pattern 2104 is removed, thereby exposing the upper surface of the dummy gate electrode 137.

Figure 41:
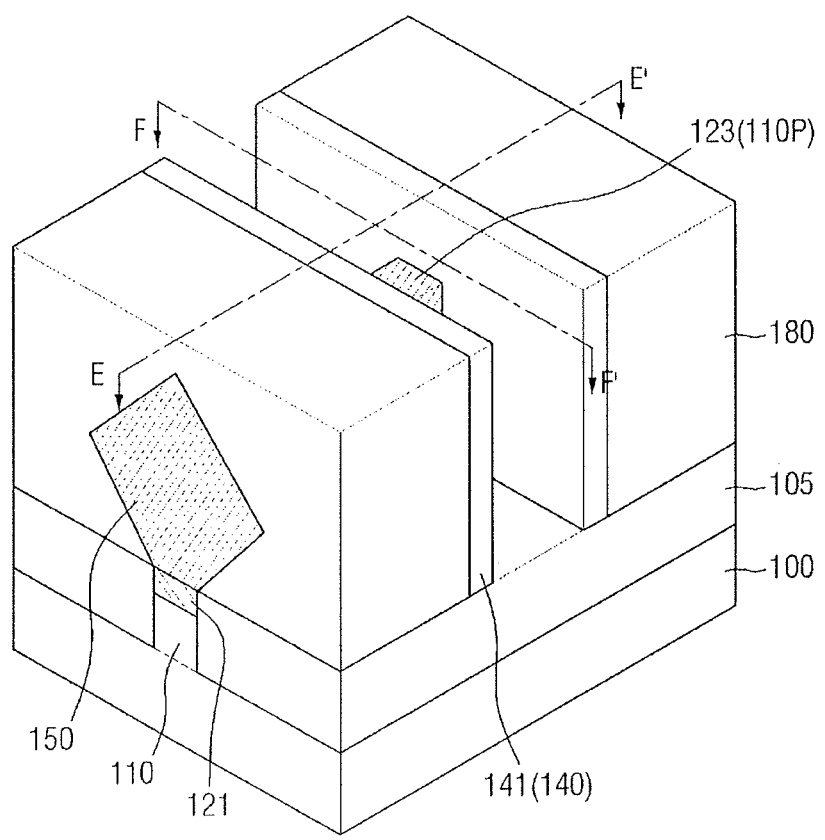
Figure 42:
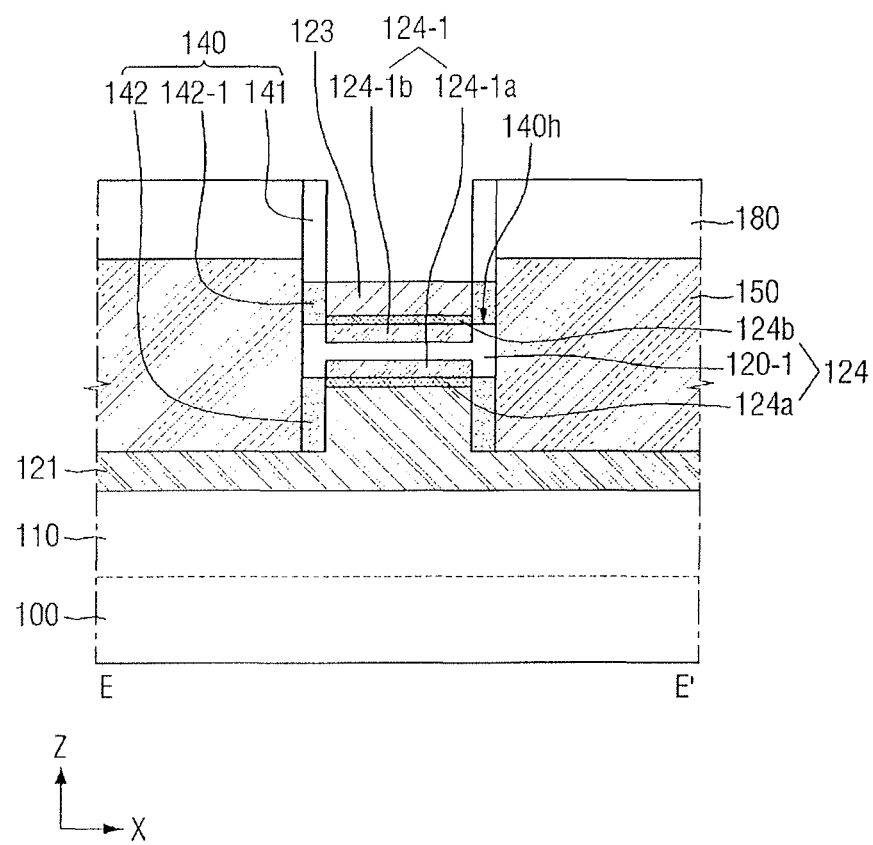
Figure 43:
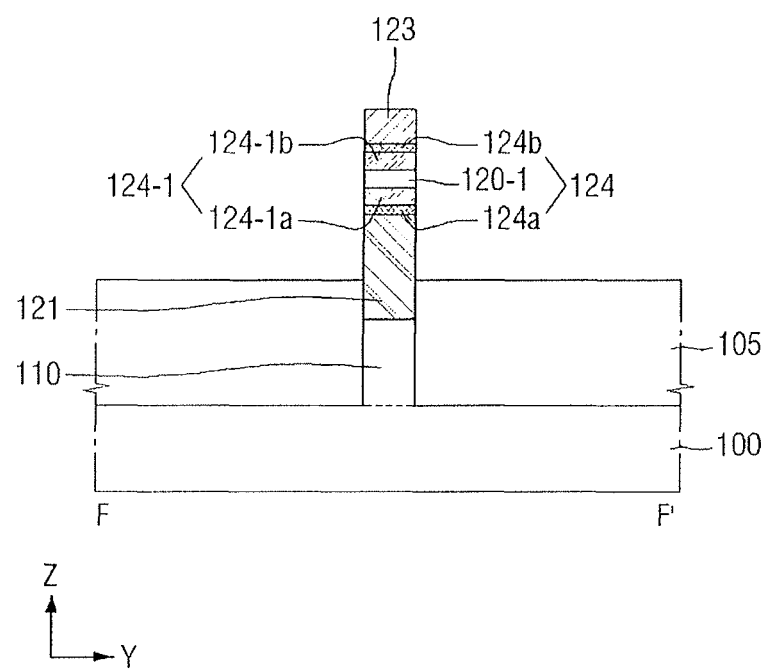

Referring to FIGS. 41 to 43, it is possible to remove the dummy gate pattern 135, e.g., the dummy gate insulating film 136 and the dummy gate electrode 137. By removing the dummy gate insulating film 136 and the dummy gate electrode 137, the field insulating film 105 and the fin-type structure 110P overlapping the dummy gate pattern 135 may be exposed. For example, the first sacrificial pattern 121, the second sacrificial pattern 123, the diffusion film 124, the thermal treatment diffusion film 124-1, and first nanowire 120-1 overlapping the dummy gate pattern 135 may be exposed.

Referring to FIGS. 44 and 45, a portion of the first sacrificial pattern 121, the diffusion film 124, the thermal treatment diffusion film 124-1, and the second sacrificial pattern 123 may be removed from the fin-type structure 110P. As a result, the passivation film 111 may be formed. Further, space may be formed between the passivation film 111 and the first nanowire 120-1. Further, the first nanowire 120-1 may be exposed on the fin-type pattern 110.

Removing the first sacrificial pattern 121, the second sacrificial pattern 123, the diffusion film 124, and the thermal treatment diffusion film 124-1 over and under the first nanowire 120-1 may involve, for example, the performance of etch process. In one embodiment, the etch selectivity among the first sacrificial pattern 121, the second sacrificial pattern 123, the diffusion film 124 and the thermal treatment diffusion film 124-1, and the first nanowire 120-1 may be used.

The Ge concentration in the first sacrificial pattern 121 may be relatively lower than the Ge concentration in the second sacrificial pattern 123. Accordingly, one portion of the first sacrificial pattern 121 may be removed and another portion may remain. The remaining portion of the first sacrificial pattern 121 may become the passivation film 111.

Referring to FIGS. 1 and 7 to 10, an interfacial film 146 may be formed on a periphery of the first nanowire 120-1 and the upper surface of the fin-type pattern 110. When the interfacial film 146 is a native oxide film that is formed naturally on the surface of silicon, the interfacial film 146 may not be formed between the passivation film 111 and the gate electrode 130. This is because the passivation film 111 may prevent formation of the native oxide film by preventing exposure of the fin-type pattern 110. When the interfacial film 146 is a deposited oxide film rather than a native oxide film, as illustrated, the interfacial film 146 may be formed between the passivation film 111 and the gate electrode 130.

The high-k insulating film 145 may then be formed on the sidewall of the gate spacer 140, e.g., on sidewalls of the first outer spacer 141 and the first inner spacer 142, and along the periphery of the first nanowire 120-1. The high-k insulating film 145 may be in contact with the first inner spacer 142. Accordingly, the gate insulating film 147 may be formed.

Next, the gate electrode 130 may be formed to surround the first nanowire 120-1 and to extend in the second direction Y. The gate electrode 130 may be, for example, a replacement metal gate electrode.

A method for fabricating a semiconductor device according to some exemplary embodiments may form a dumbbell-shaped first nanowire by the methods described above. Such first nanowire may reduce or minimize the bottle neck phenomenon, and thus provide a semiconductor device with an enhanced operating characteristic.

Figure 53:
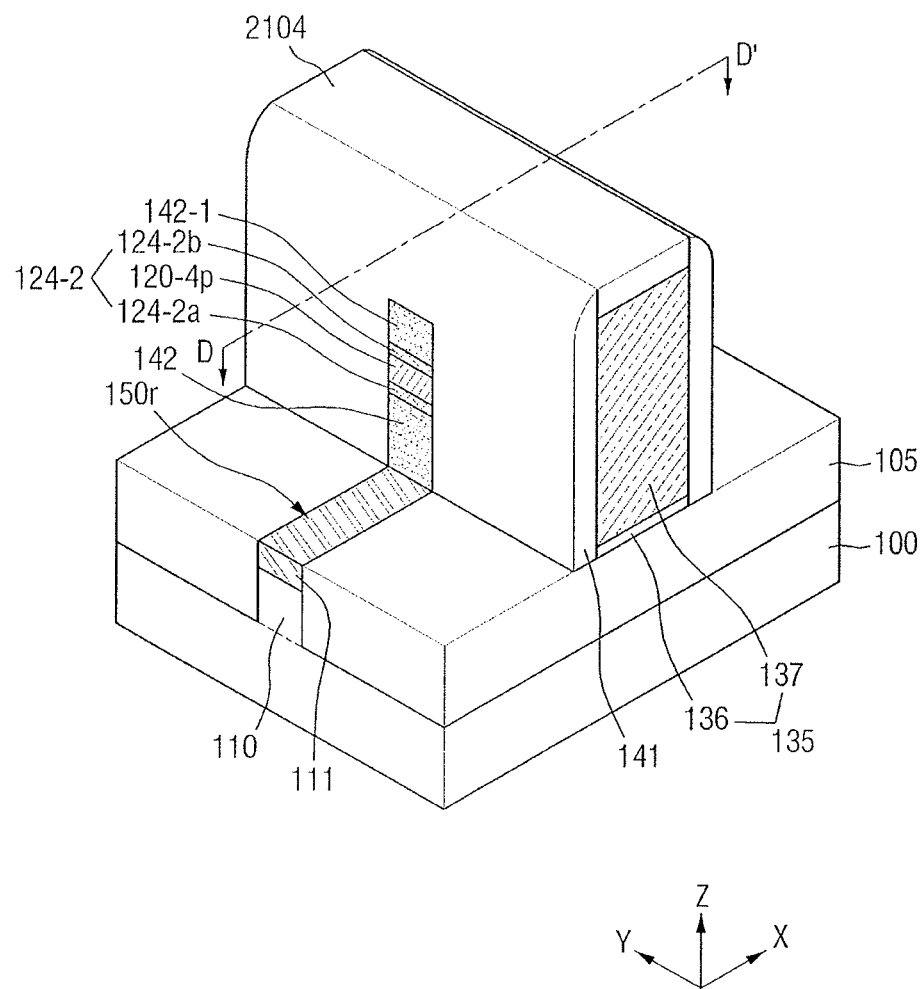
Figure 54:
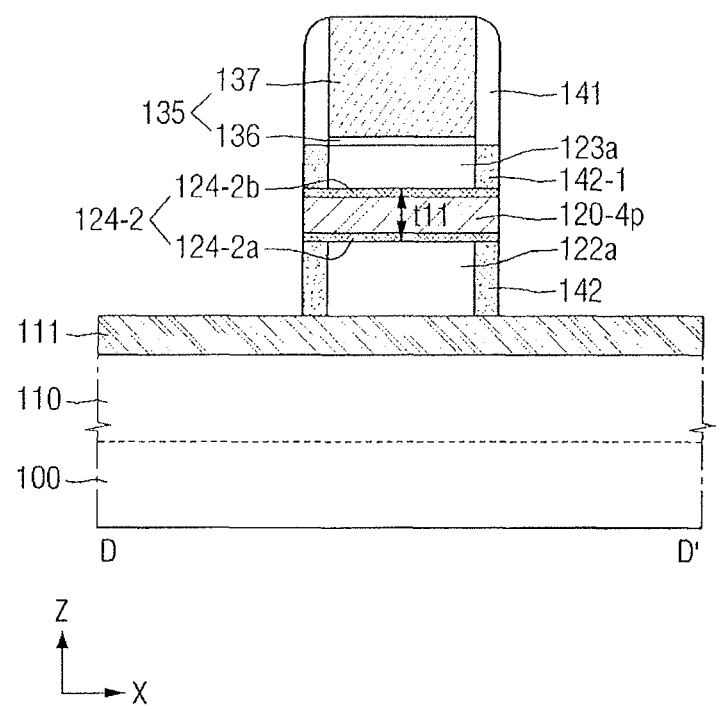
Figure 55:
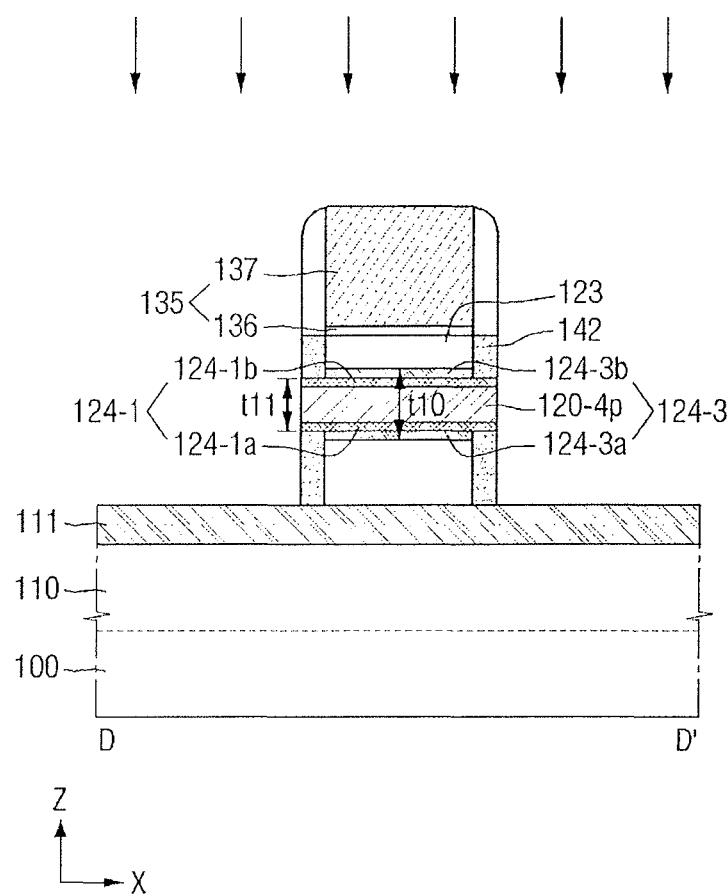
Figure 58:
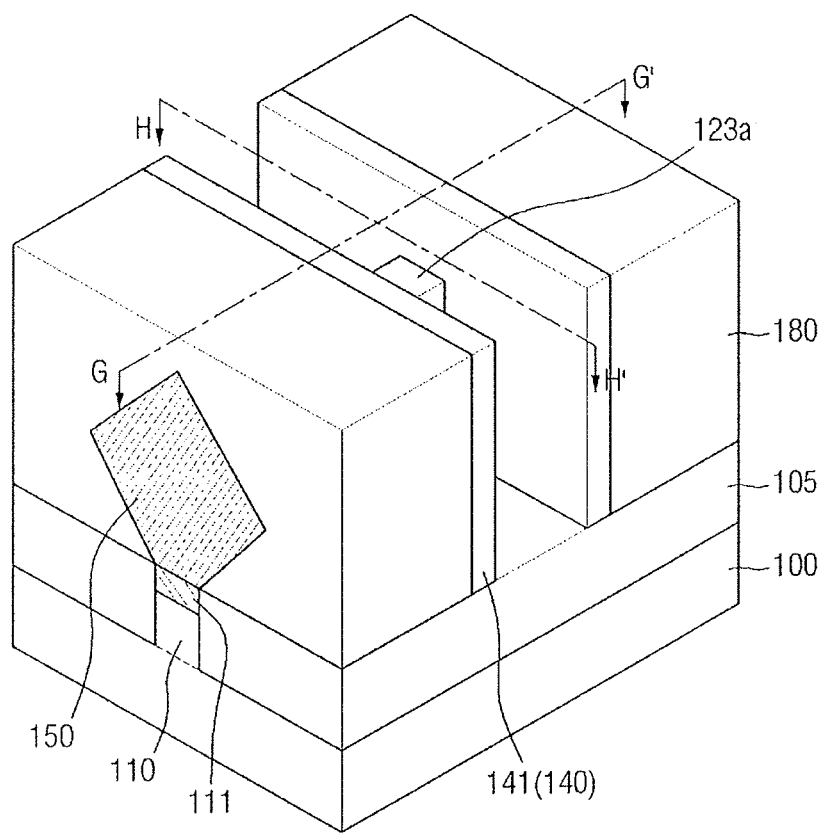
Figure 59:
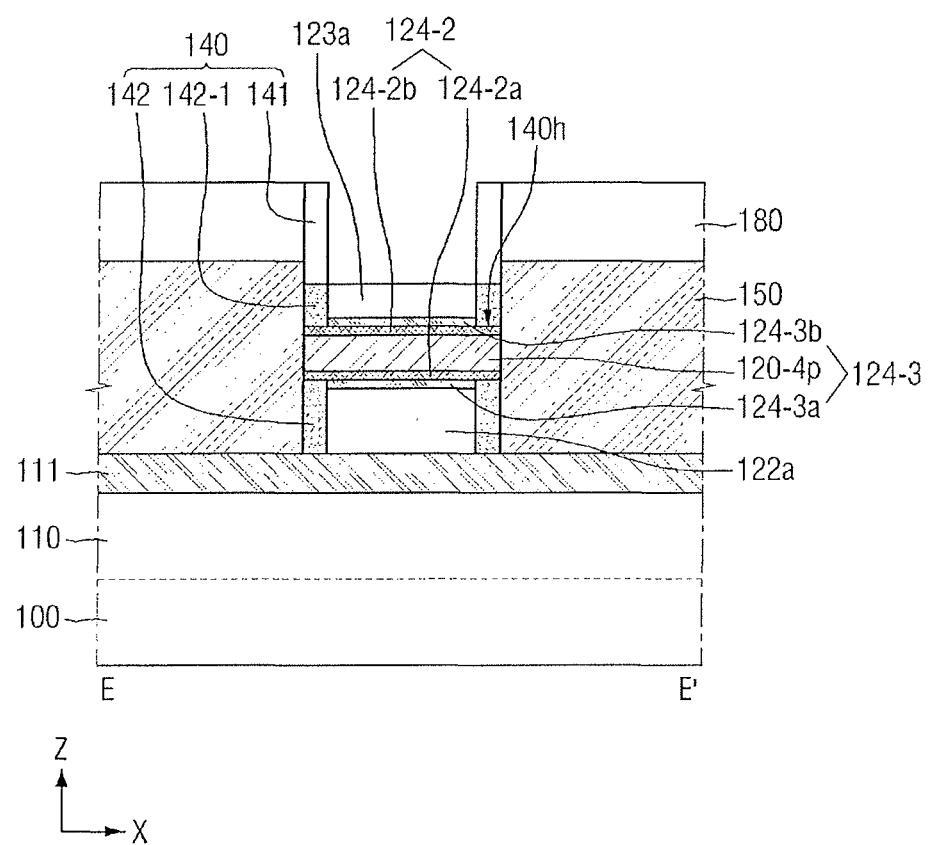
Figure 60:
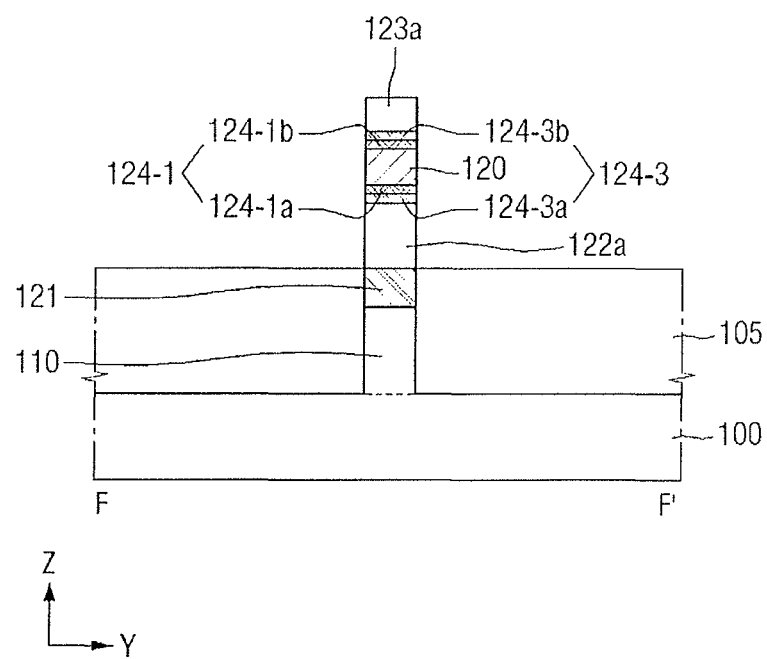
Figure 61:
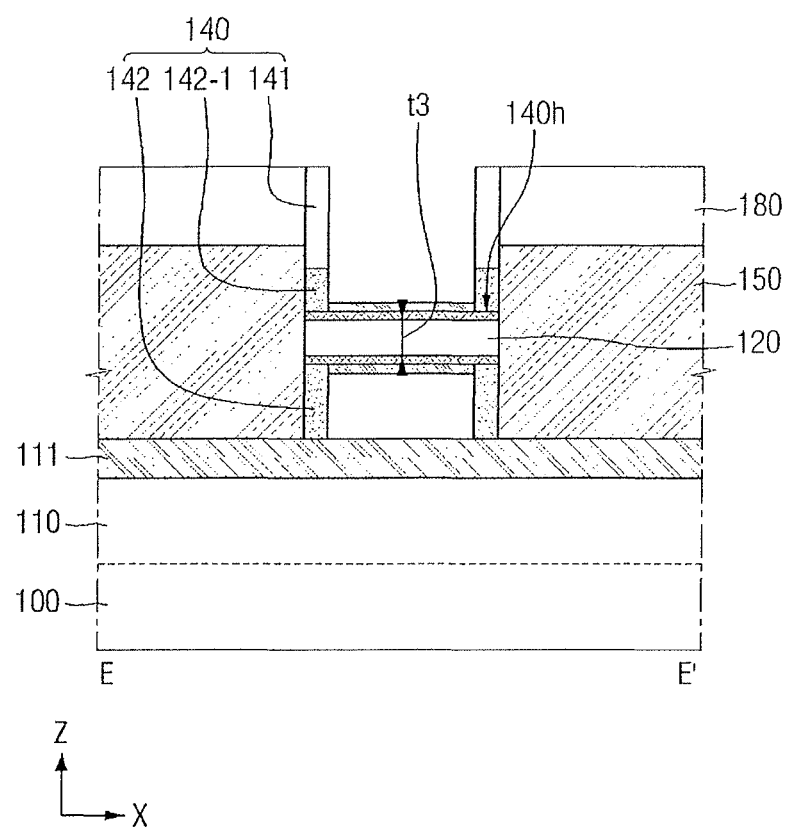
Figure 62:
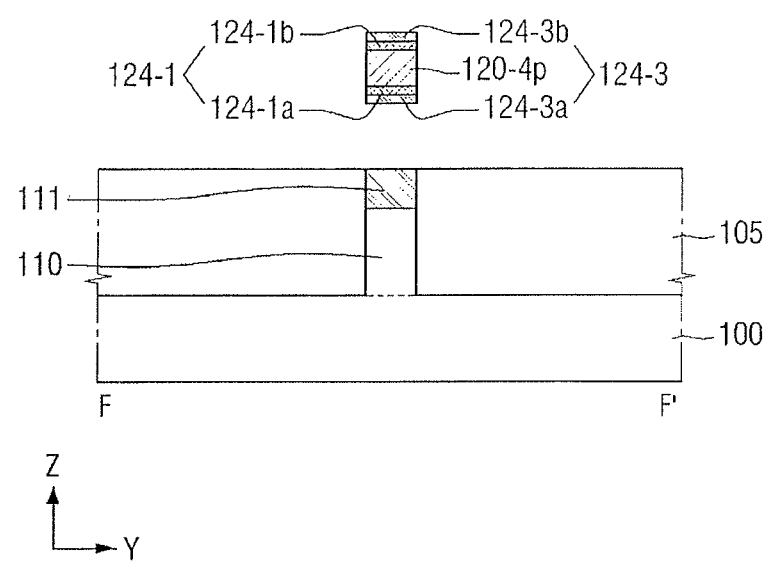

FIGS. 46 to 62 illustrate various stages in another embodiment of a method for fabricating a semiconductor device, which, for example, may correspond to the semiconductor device in FIGS. 1, 22, 23. FIGS. 54 and 55 are cross sectional views taken along line D-D in FIG. 53, FIGS. 59 and 61 are cross sectional views taken along line G-G' in FIG. 58, and FIGS. 60 and 62 are cross sectional views taken along line H-H' in FIG. 41.

Figure 46:
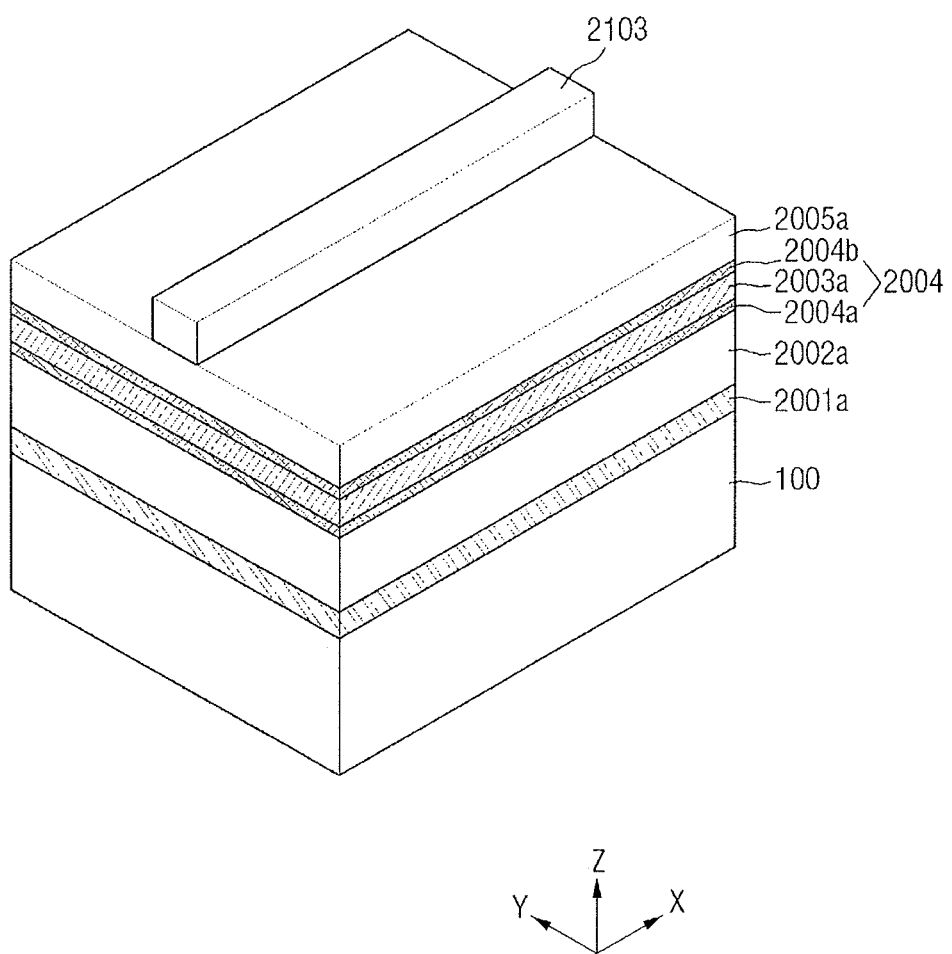
FIGS. 46 to 62 illustrate various stages of fabrication in another embodiment of a method for fabricating a semiconductor device.

Referring to FIG. 46, a pre-passivation film 2001a, a first sacrificial film 2002a, a lower surface pre-diffusion film 2004a, an active film 2003a, an upper surface pre-diffusion film 2004b, and a second sacrificial film 2005a are formed sequentially on the substrate 100.

The first sacrificial film 2002a and the second sacrificial film 2005a may include the same material or different materials. The first sacrificial film 2002a and the active film 2003a may include different materials. In explaining the method of the present embodiment, it may be assumed that the first sacrificial film 2002a and the second sacrificial film 2005a include the same material. Further, the active film 2003a may include a material with an etch selectivity to the first sacrificial film 2002a.

The substrate 100 and the active film 2003a may include, for example, a material to be used as a channel region for the transistor. The active film 2003a may include a material of high hole mobility when the transistor is a PMOS transistor. The active film 2003a may include a material with high electron mobility when the transistor is an NMOS transistor.

The first sacrificial film 2002a and the second sacrificial film 2005a may include a material having a similar lattice constant and lattice structure as the active film 2003a. For example, the first sacrificial film 2002a and the second sacrificial film 2005a may be a semiconductor material or a crystallized metal material.

In explaining the method of the present embodiment, it may also be assumed that the active film 2003a includes silicon germanium and that each of the first sacrificial film 2002a and the second sacrificial film 2005a includes silicon.

FIG. 46 illustrates only one active film 2003a. In another embodiment, a plurality of pairs of first sacrificial film 2002a and active film 2005a may be formed in alternation, with the second sacrificial film 2005a formed on the uppermost active film 2003a. Although FIG. 46 illustrates the second sacrificial film 2005a on the uppermost portion of the stack film structure, in one embodiment the active film 2003a may be positioned on the uppermost portion of the stack film structure.

The pre-diffusion film 2004 includes an upper surface pre-diffusion film 2004b and a lower surface pre-diffusion film 2004a. The pre-diffusion film 2004 may be natively formed at an interface between the first and second sacrificial films 2002a and 2005a and the active film 2003a. For example, the pre-diffusion film 2004 may be formed as Ge in the active film 2003a is diffused to the first sacrificial film 2002a and the second sacrificial film 2005a.

Next, a first mask pattern 2103 is formed on the second sacrificial film 2005a. The first mask pattern 2103 may be elongated in a first direction X. For example, the first mask pattern 2103 may be formed of a material including at least one of silicon oxide film, silicon nitride film, or silicon oxynitride film.

Figure 47:
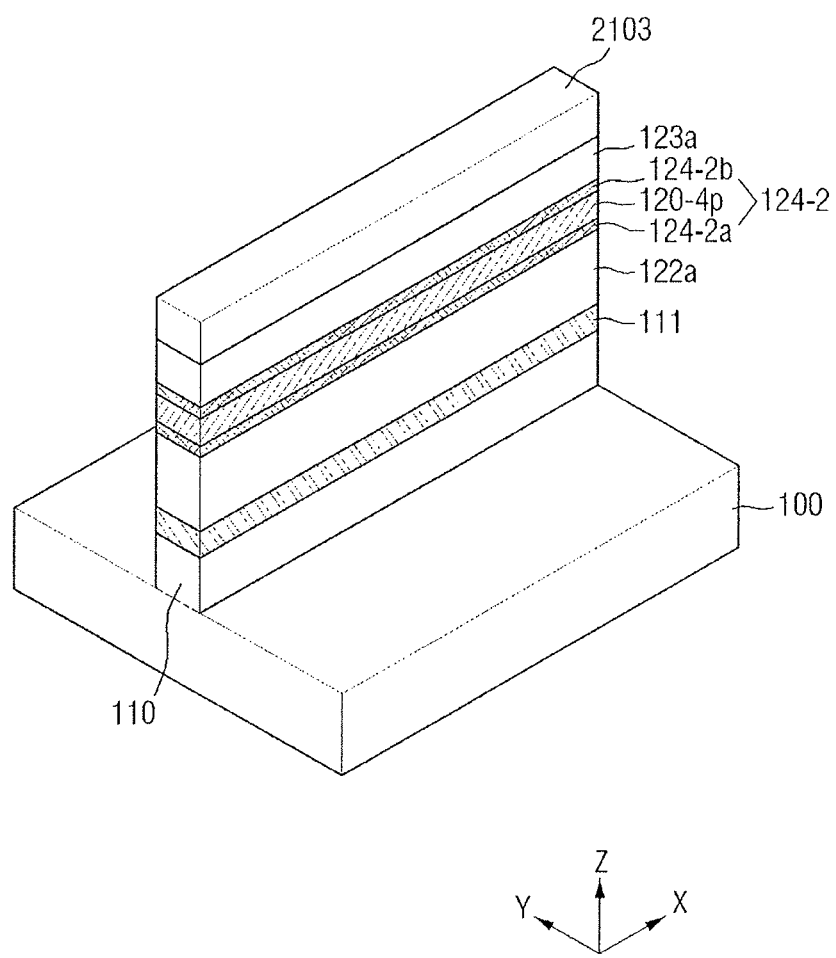
Figure 48:
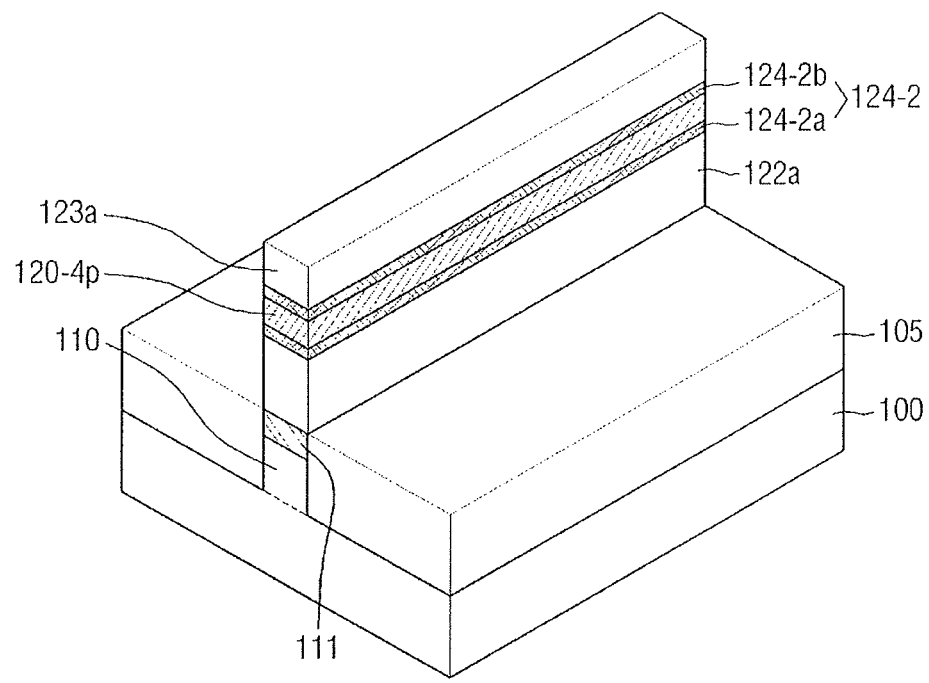

Referring to FIG. 47, etch process is conducted with the first mask pattern 2103 as a mask, to thereby form a fin-type structure ("110P" in FIG. 48). The fin-type structure ("110P" in FIG. 48) may be formed, for example, by patterning a portion of the second sacrificial film 2005a, the active film 2003a, the first sacrificial film 2002a, the pre-diffusion film 2004, and the substrate 100.

The fin-type structure ("110P" in FIG. 48) may be formed on the substrate 100 to protrude from the substrate 100. Like the first mask pattern 2103, the fin-type structure ("110P" in FIG. 48) may extend in the first direction X.

In the fin-type structure ("110P" in FIG. 48), a fin-type pattern 110, a passivation film 111, a first sacrificial pattern 122a, a lower surface diffusion film 124-2a, a channel film 120-4p, an upper surface diffusion film 124-2b, and a second sacrificial pattern 123a are stacked sequentially on the substrate 100. The diffusion film 124-2 may include the upper surface diffusion film 124-2b and the lower surface diffusion film 124-2a.

Referring to FIG. 48, the field insulating film 105 covering at least a portion of the sidewall of the fin-type structure 110P may be formed on the substrate 100. For example, the field insulating film 105 covering the fin-type structure 110P is formed on the substrate 100. With the planarization process of the field insulating film 105, the upper surface of the fin-type structure 110P and the upper surface of the field insulating film 105 may be in the same plane.

The first mask pattern 2103 may be removed in the process of the planarization or in another process.

The upper portion of the field insulating film 105 is then recessed to expose a portion of the fin-type structure 110P. The recessing process may include etching process. Thus, the fin-type structure 110P may be formed to protrude on the field insulating film 105.

As illustrated in FIG. 48, an entirety of the fin-type pattern 110, the first sacrificial pattern 122a, the lower surface diffusion film 124-2a, the channel film 120-4p, the upper surface diffusion film 124-2b, and the second sacrificial pattern 123a may protrude above the upper surface of the field insulating film 105. The sidewalls of the passivation film 111 and the fin-type pattern 110 may be entirely surrounded by the field insulating film 105. In one embodiment, a portion of the sidewall of the fin-type pattern 110 may protrude above the upper surface of the field insulating film 105 through the upper portion recessing process of the field insulating film 105.

Doping for the purpose of threshold voltage adjustment may be performed on the first nanowire 120 before and/or after the recessing process that causes a portion of the fin-type structure 110P to protrude above the upper surface of the field insulating film 105. The impurity used may be, for example, boron (B) when the semiconductor device is an NMOS transistor. The impurity may be, for example, phosphorus (P) or arsenic (As) when the semiconductor device is a PMOS transistor.

Figure 49:
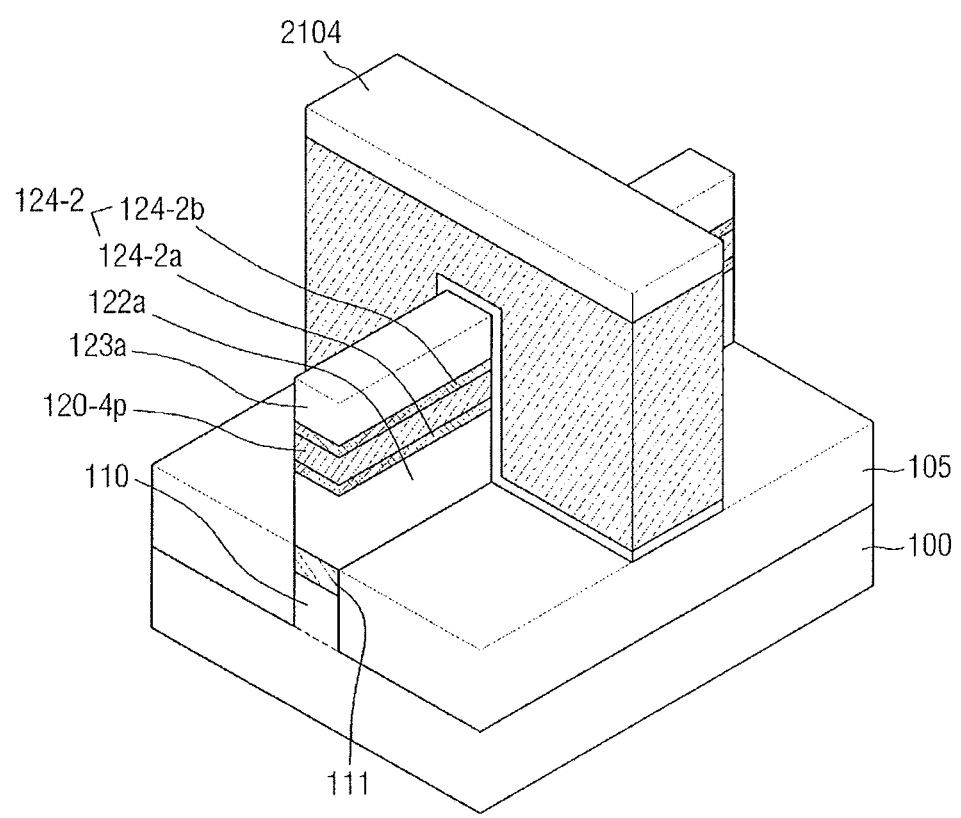

Referring to FIG. 49, a dummy gate pattern 135 may be formed to intersect the fin-type structure 110P and extend in the second direction Y. The dummy gate pattern 135 may be formed by performing an etch process with the second mask pattern 2104. The dummy gate pattern 135 may be formed on the fin-type structure 110P. The dummy gate pattern 135 may include a dummy gate insulating film 136 and a dummy gate electrode 137. For example, the dummy gate insulating film 136 may include a silicon oxide film and the dummy gate electrode 137 may include polysilicon or amorphous silicon.

Figure 50:
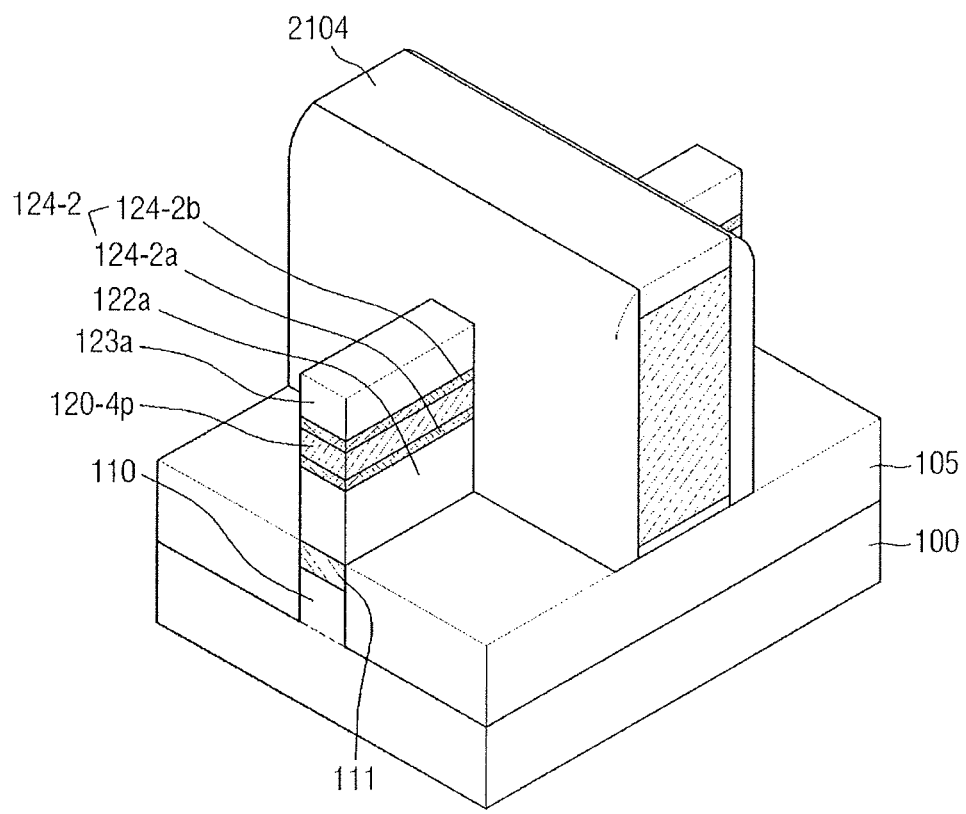

Referring to FIG. 50, the first outer spacer 141 may be formed on the sidewall of the dummy gate pattern 135. For example, the first outer spacer 141 may be formed on the sidewalls of the dummy gate insulating film 136 and the dummy gate electrode 137. In one embodiment, a first spacer film covering the dummy gate pattern 135 and the fin-type structure 110P is formed on the field insulating film 105. The first spacer film may then be etched-back, leaving the first outer spacer 141 on the sidewall of the dummy gate pattern 135.

Figure 51:
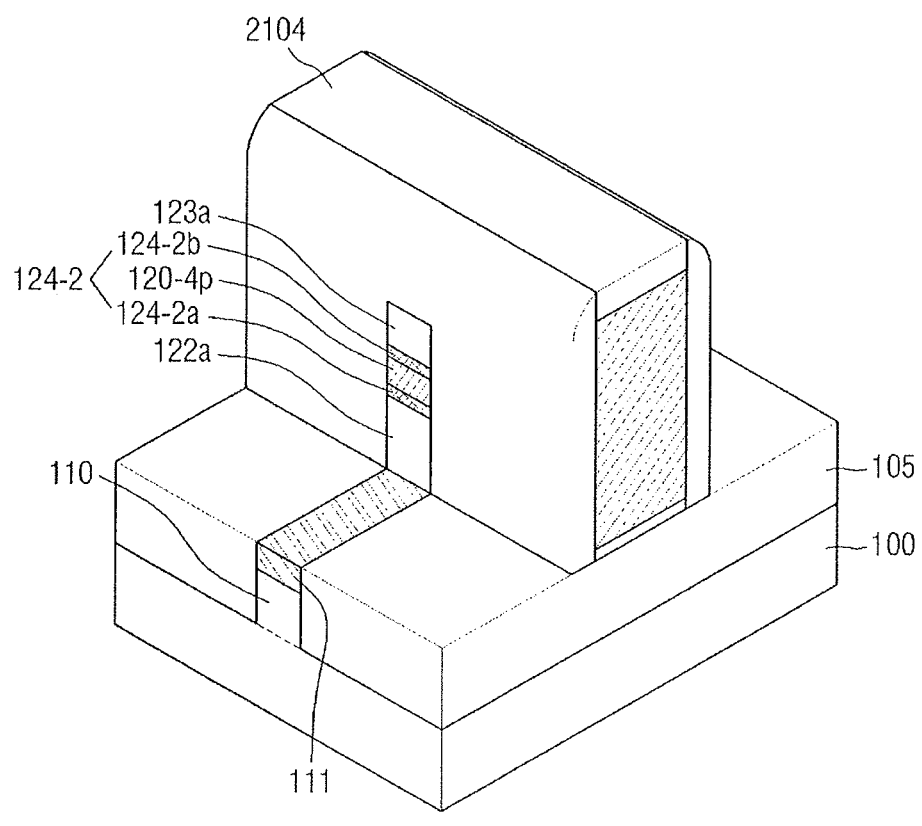

Referring to FIG. 51, a portion of the fin-type structure 110P, which does not overlap the dummy gate electrode 137 and the outer spacer 141, is removed using the dummy gate pattern 135 including the dummy gate electrode 137 as a mask. By doing so, a recess 150r may be formed within the fin-type structure 110P. A bottom surface of the recess 150r may be the passivation film 111.

Forming the first outer spacer 141 and forming the recess 150r may be concurrently performed, or the recess 150r may be formed after the outer spacer 141 is formed, by removing a portion of the fin-type structure 110P.

While the recess 150r is being formed in the fin-type structure 110P, portions of the first sacrificial pattern 122a, the diffusion film 124-2, and the second sacrificial pattern 123a which do not overlap the dummy gate electrode 137 and the first outer spacer 141 may be removed. While the recess 150r is being formed in the fin-type structure 110P, a portion of the channel film 120-4p which does not overlap the dummy gate electrode 137 and the first outer spacer 141 may be removed. The cross section of the first sacrificial pattern 122a, the cross section of the second sacrificial pattern 123a, the cross section of the diffusion film 124-2, and the cross section of the channel film 120-4p may be exposed by the recess 150r.

Figure 52:
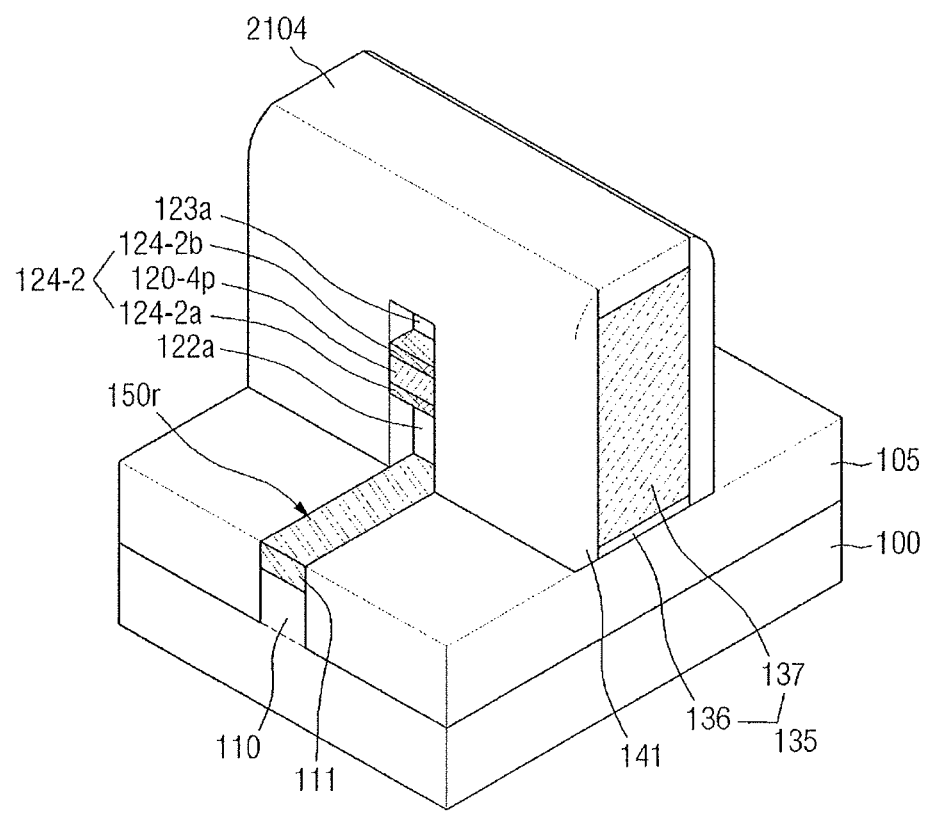

Referring to FIG. 52, at least a portion of the first sacrificial pattern 122a and at least a portion of the second sacrificial pattern 123a, which are exposed by the recess 150r and which overlap the first outer spacer 141, may be removed. As a result, a dimple may be formed between the first outer spacers 141. The dimple may also be formed between the first outer spacer 141 and the diffusion film 124-2, e.g., in a portion horizontally overlapping the second sacrificial pattern 123a.

The dimple may be in a shape that is depressed in the first direction X further than the cross section of the channel film 120-4p and the diffusion film 124-2 exposed by the recess 150r. For example, the dimple may be formed by a selective etch process. In one embodiment, the dimple may be formed by an etch process that uses an etchant with a higher etch rate for the first sacrificial pattern 122a and the second sacrificial pattern 123a, compared to the etch rate for the channel film 120-4p and the diffusion film 124-2.

The diffusion film 124-2, which has a relatively higher Ge concentration than the first sacrificial pattern 122a and the second sacrificial pattern 123a, may experience less progress during the etch process. Thus, the dimple may be formed in a curved shape in which the diffusion film 124-2 area is progressed to a lesser extent.

Referring to FIGS. 53 and 54, the dimple may be filled with an insulating material to form the first inner spacer 142 and the second inner spacer 142-1. For example, a second spacer film for filling the dimple may be formed. The second spacer film may be a material with a good gap-filling ability. The second spacer film may also be formed on the field insulating film 105, the sidewall of the first outer spacer 141, and on the dummy gate pattern 135.

Etch process may then be performed by etching the second spacer film until a portion of the upper surface of the fin-type pattern 110, which does not overlap the dummy gate pattern 135 and the outer spacer 141, is exposed. As a result, the first inner spacer 142 and the second inner spacer 142-1 may be formed, and thus the gate spacer 140 may be formed.

Further, a through hole, defined by the first outer spacer 141, the first inner spacer 142 and the second inner spacer 142-1, may be formed in the gate spacer 140. The channel film 120-4p and the diffusion film 124-2 may be exposed through the through hole. In one embodiment, the channel film 120-4p and the diffusion film 124-2 may pass through the through hole. In this case, the thickness of the channel film 120-4p and the diffusion film 124-2 may be an eleventh thickness t11.

Referring to FIG. 55, a thermal treatment diffusion film 124-3 may be formed by thermal treatment. The thermal treatment diffusion film 124-3 may be formed as Ge is diffused into the first sacrificial pattern 122a and the second sacrificial pattern 123a. For example, the thermal treatment diffusion film 124-3 may be formed as Ge in the channel film 120-4p and the diffusion film 124-2 is diffused to the first sacrificial pattern 122a and the second sacrificial pattern 123a.

The first nanowire 120-4 may include the channel film 120-4p, the diffusion film 124-2, and the thermal treatment diffusion film 124-2. According to the formation of the thermal treatment diffusion film 124-3, the thickness of the first nanowire 120-4 at the center portion is increased to the tenth thickness t10, and the eleventh thickness t11 may be maintained at a region overlapping the gate spacer 140.

The shape of the first nanowire 120-4 may be determined later according to the shape into which the thermal treatment diffusion film 124-2 is formed by the thermal treatment. For example, the shape of the first nanowire 120-4 after the removal of the thermal treatment diffusion film 124-2 may become the final shape of the first nanowire 120-4. Accordingly, the shape of the thermal treatment diffusion film 124-2 may determine not only the shape of the first nanowire 120-4 of FIG. 23, but also the shape of the first nanowire 120-5 of FIG. 25 and the first nanowire 120-6 of FIG. 27. It may be formed in various ways by the diffusion process or the subsequent etch process.

Figure 56:
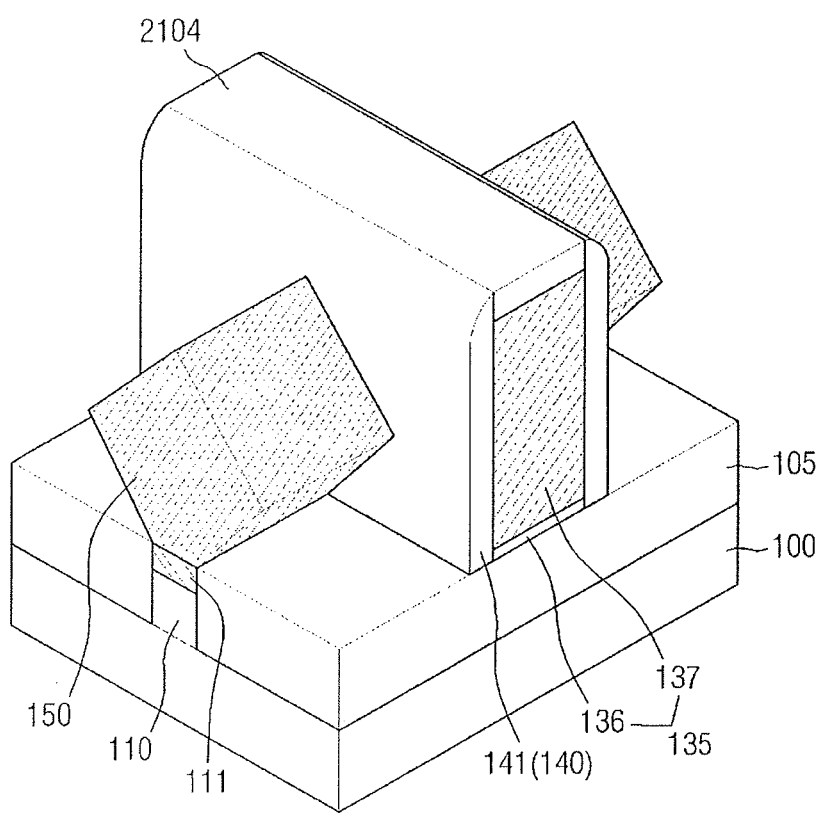

Referring to FIG. 56, a source/drain 150 for filling the recess 150r may be formed on opposite sides of the dummy gate pattern 135. The source/drain 150 may be formed, for example, with the exposed first nanowire 120-4 as the seed layer. In one embodiment, the seed film may be additionally formed on the protruding cross section of the first nanowire 120-4 and the fin-type pattern 110 exposed by the recess 150r.

The source/drain 150 may be formed to cover the first inner spacer 142. The source/drain 150 may contact the first inner spacer 142. The source/drain 150 may be formed, for example, by epitaxial process. Depending on whether the semiconductor device is an n-type or p-type transistor, the materials for the epitaxial layer in the source/drain 150 may vary. Further, an impurity may be doped in situ during an epitaxial process.

Figure 57:
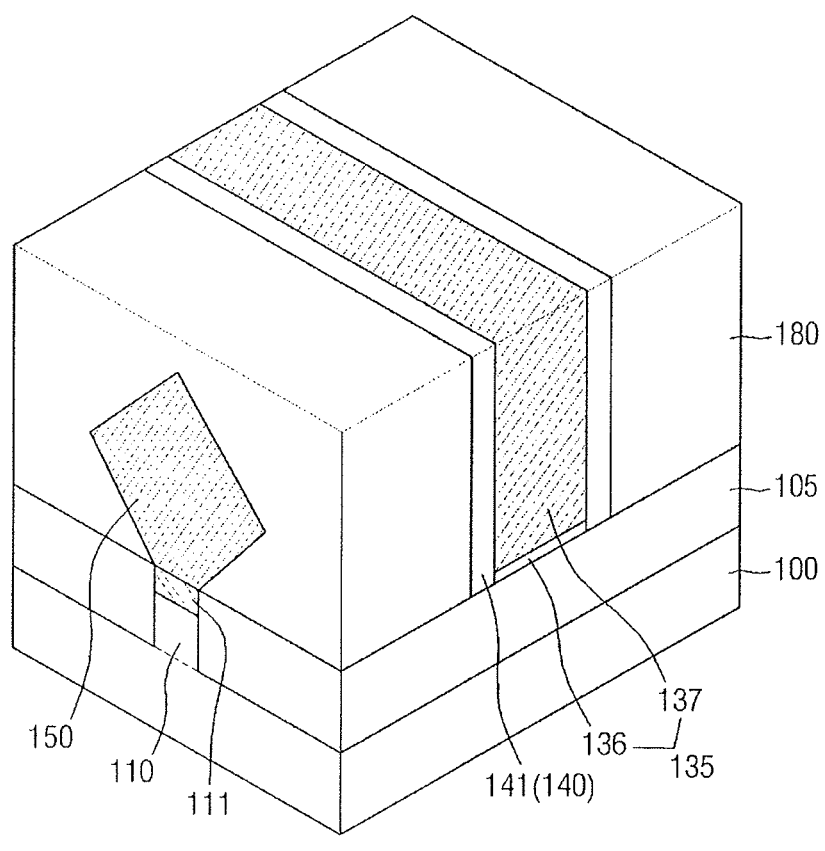

Referring to FIG. 57, the interlayer insulating film 180 covering the source/drain 150, the gate spacer 140, the dummy gate pattern 135, and so on, may be formed on the field insulating film 105. The interlayer insulating film 180 may include at least one of low-k material, oxide film, nitride film, or oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), high density plasma (HDP) oxide, plasma enhanced oxide (PEOX), flowable CVD (FCVD) oxide, or a combination thereof.

The interlayer insulating film 180 is then planarized until the upper surface of the dummy gate electrode 137 is exposed. As a result, the second mask pattern 2104 is removed to expose the upper surface of the dummy gate electrode 137.

Referring to FIGS. 58 to 60, it is possible to remove the dummy gate pattern 135, e.g., the dummy gate insulating film 136 and the dummy gate electrode 137. With the removal of the dummy gate insulating film 136 and the dummy gate electrode 137, portions of the field insulating film 105 and the fin-type structure 110P overlapping the dummy gate pattern 135 may be exposed. That is, the first sacrificial pattern 122a, the second sacrificial pattern 123a, and the first nanowire 120-4 overlapping the dummy gate pattern 135 may now be exposed.

Referring to FIGS. 61 and 62, the first sacrificial pattern 122a and the second sacrificial pattern 123a of the fin-type structure 110P may be removed. As a result, space may be formed between the passivation film 111 and the first nanowire 120-4. Further, the first nanowire 120-4 may be exposed on the fin-type pattern 110.

Removing the first sacrificial pattern 122a and the second sacrificial pattern 123a over and under the first nanowire 120-4 may involve, for example, use of etch process. Etch selectivities between the first and second sacrificial patterns 122a and 123a and the first nanowire 120-4 may be utilized, for example.

Referring to FIGS. 1, 22, and 23, an interfacial film 146 may be formed on a periphery of the first nanowire 120-4 and the upper surface of the fin-type pattern 110.

The high-k insulating film 145 may then be formed on the sidewall of the gate spacer 140 (e.g., on sidewalls of the first outer spacer 141 and the first inner spacer 142) and along the periphery of the first nanowire 120. The high-k insulating film 145 may be in contact with the first inner spacer 142. Accordingly, the gate insulating film 147 may be formed.

Next, the gate electrode 130 may be formed to surround the first nanowire 120-4 and extend in the second direction Y. The gate electrode 130 may be a replacement metal gate electrode.

A method for fabricating a semiconductor device according to some exemplary embodiments may form the first nanowire 120-4 by the methods described above.

Figure 63:
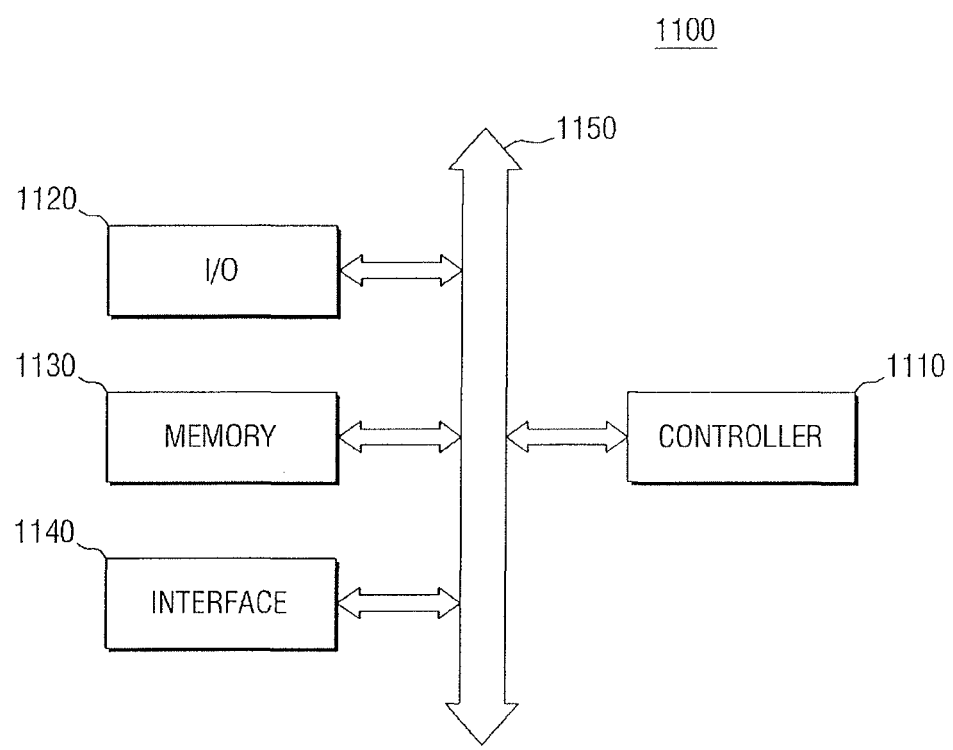
FIG. 63 illustrates an embodiment of an electronic system.

FIG. 63 illustrates an embodiment of an electronic system 1100 including a semiconductor device. Referring to FIG. 63, the electronic system 1100 may include a controller 1110, an input/output (I/O) device 1120, a memory device 1130, an interface 1140, and a bus 1150. The controller 1110, the I/O device 1120, the memory device 1130, and/or the interface 1140 may be connected with one another via the bus 1150. The bus 1150 corresponds to a path through which data travels.

The controller 1110 may include at least one of microprocessor, digital signal process, micro controller, or logic devices for performing functions similar to the functions of those mentioned above. The I/O device 1120 may include a keypad, a keyboard, a display device, and/or another type of I/O device. The memory device 1130 may store, for example, data and/or instructions. The interface 1140 may perform a function of transmitting or receiving data to or from communication networks. The interface 1140 may be in a wired or wireless form. For example, the interface 1140 may include an antenna or a wired/wireless transceiver.

The electronic system 1100 may additionally include an operation memory to enhance operation of the controller 1110. Examples of the operation memory include a high-speed dynamic random access memory (DRAM) and/or a static random access memory (SRAM). According to some exemplary embodiments, the semiconductor device may be within the memory device 1130 or provided as a part of the controller 1110, or the I/O device 1120.

The electronic system 1100 may correspond, for example, to a personal digital assistant (PDA) portable computer, a web tablet, a wireless phone, a mobile phone, a digital music player, a memory card, or almost all electronic products that are capable of transmitting and/or receiving data in wireless environment.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the embodiments set forth in the claims.

What is claimed is:

1. A semiconductor device, comprising:
a substrate;
a nanowire extending in a first direction on the substrate;
a gate electrode surrounding a periphery of the nanowire and extending in a second direction intersecting with the first direction; and
a gate spacer formed on a side surface of the gate electrode, wherein
the nanowire includes a first center region overlapping the gate electrode and a first side region overlapping the gate spacer,
a first thickness of the first center region is different from a second thickness of the first side region,
the gate spacer includes an outer spacer, which is in contact with a side surface of the first side region, and an inner spacer, which is in contact with a lower surface or an upper surface of the first side region,
a width of the inner spacer decreases as a distance from the gate electrode decreases, and
a width of the first side region along a direction normal to the substrate decreases as a distance from the gate electrode increases.

2. The semiconductor device as claimed in claim 1, wherein the first thickness is smaller than the second thickness.

3. The semiconductor device as claimed in claim 1, wherein the second thickness of the first side region increases as a distance from the gate electrode decreases.

4. The semiconductor device as claimed in claim 3, wherein:
the inner spacer includes a first inner spacer, which is in contact with a lower surface of the first side region, and a second inner spacer, which is in contact with an upper surface of the first side region, and
the second inner spacer is spaced apart from the first inner spacer.

5. The semiconductor device as claimed in claim 1, wherein the inner spacer includes a curved surface on a side surface facing the gate electrode.

6. The semiconductor device as claimed in claim 1, wherein the outer spacer is in contact with a side surface of the inner spacer.

7. The semiconductor device as claimed in claim 1, wherein:
the outer spacer has a first dielectric constant, and
the inner spacer has a second dielectric constant different from the first dielectric constant.

8. The semiconductor device as claimed in claim 1, further comprising:
a fin-type pattern protruding from the substrate and extending in the first direction;

a field insulating film surround at least a portion of a sidewall of the fin-type pattern; and a source/drain on the side surface of the gate electrode and on the fin-type pattern, wherein the nanowire is directly connected with the source/drain, and the gate spacer is between the gate electrode and the source/drain.

9. The semiconductor device as claimed in claim 8, further comprising a gate insulating film between the nanowire and the gate electrode, between the field insulating film and the gate electrode, between the inner spacer and the gate electrode, and between the outer spacer and the gate electrode.

10. The semiconductor device as claimed in claim 8, further comprising a passivation film formed on an upper surface of the fin-type pattern, wherein the field insulating film surround at least a portion of a sidewall of the passivation film, and the passivation film includes a different material from the fin-type pattern.

11. The semiconductor device as claimed in claim 1, wherein the width of the inner spacer along a direction normal to a side surface of the gate electrode is substantially the same as a distance from the substrate increases.

12. The semiconductor device as claimed in claim 1, wherein the width of the first side region along the direction normal to the substrate decreases gradually as a distance from the gate electrode increases.

13. A semiconductor device, comprising:

a substrate;

a nanowire extending in a first direction on the substrate;

a gate electrode surrounding a periphery of the nanowire and extending in a second direction intersecting with the first direction; and a gate spacer formed on a side surface of the gate electrode, wherein the nanowire includes a first center region overlapping the gate electrode and a first side region overlapping the gate spacer, a first thickness of the first center region is different from a second thickness of the first side region, the gate spacer includes a first inner spacer, which is in contact with a lower surface of the first side region, and a second inner spacer, which is in contact with an upper surface of the first side region, a distance between the first inner spacer and the second inner spacer increases as a distance from the gate electrode decreases, and a width of the first side region along a direction normal to the substrate decreases as a distance from the gate electrode increases.

14. The semiconductor device as claimed in claim 13, wherein the first thickness is smaller than the second thickness.

15. The semiconductor device as claimed in claim 13, wherein the gate spacer further includes an outer spacer in contact with side surfaces of the first side region, the first inner spacer and the second inner spacer.

16. The semiconductor device as claimed in claim 15, wherein the outer spacer is in contact with an upper surface of the second inner spacer.

17. The semiconductor device as claimed in claim 13, wherein each of the first inner spacer and the second inner spacer includes a curved surface on a side surface facing the gate electrode.

* * * * *